United States Patent
Taura

(10) Patent No.: US 7,952,630 B2
(45) Date of Patent: May 31, 2011

(54) DATA PROCESSOR, SOLID-STATE IMAGING DEVICE, IMAGING DEVICE, AND ELECTRONIC APPARATUS

(75) Inventor: Tadayuki Taura, Kanagawa (JP)

(73) Assignee: Sony Corporation, Tokyo (JP)

( * ) Notice: Subject to any disclaimer, the term of this patent is extended or adjusted under 35 U.S.C. 154(b) by 429 days.

(21) Appl. No.: 12/246,026

(22) Filed: Oct. 6, 2008

(65) Prior Publication Data

US 2009/0109315 A1    Apr. 30, 2009

(30) Foreign Application Priority Data

Oct. 12, 2007    (JP) .............................. P2007-266227

(51) Int. Cl.
 *H04N 3/14*    (2006.01)
 *H04N 5/335*   (2011.01)
(52) U.S. Cl. ...................................... 348/294
(58) Field of Classification Search .................... 348/294
 See application file for complete search history.

(56) References Cited

U.S. PATENT DOCUMENTS

| 5,877,715 A * | 3/1999 | Gowda et al. ................. 341/122 |
| 6,583,817 B1 * | 6/2003 | Lee ............................... 348/241 |
| 2008/0043128 A1 * | 2/2008 | Poonnen et al. ............. 348/294 |

FOREIGN PATENT DOCUMENTS

| EP | 1566959 | 8/2005 |
| JP | 2005-278135 | 10/2005 |

OTHER PUBLICATIONS

European Search Report corresponding to European Serial No. 08017815.5 dated Mar. 17, 2010.

* cited by examiner

*Primary Examiner* — James M Hannett
(74) *Attorney, Agent, or Firm* — SNR Denton US LLP

(57) ABSTRACT

A data processor includes: a reference signal generator generating a reference signal that gradually varies to enhance an amplitude of the processing signal; a comparator comparing the processing signal with the reference signal generated by the reference signal generator; a count period controller determining to perform a real number count operation or a complement number count operation; a counter performing the count operation during the count period determined by the count period controller and acquiring a predetermined level of digital data by storing the count value at the time of completion of the count operation; and a corrector acquiring the digital data as a value of a real number by correcting the complement number count operation. The count period controller independently controls the real number count operation and the complement number count operation of the counter on the basis of a predetermined criterion.

18 Claims, 19 Drawing Sheets

<FIRST CONFIGURATION EXAMPLE>

<SECOND CONFIGURATION EXAMPLE>

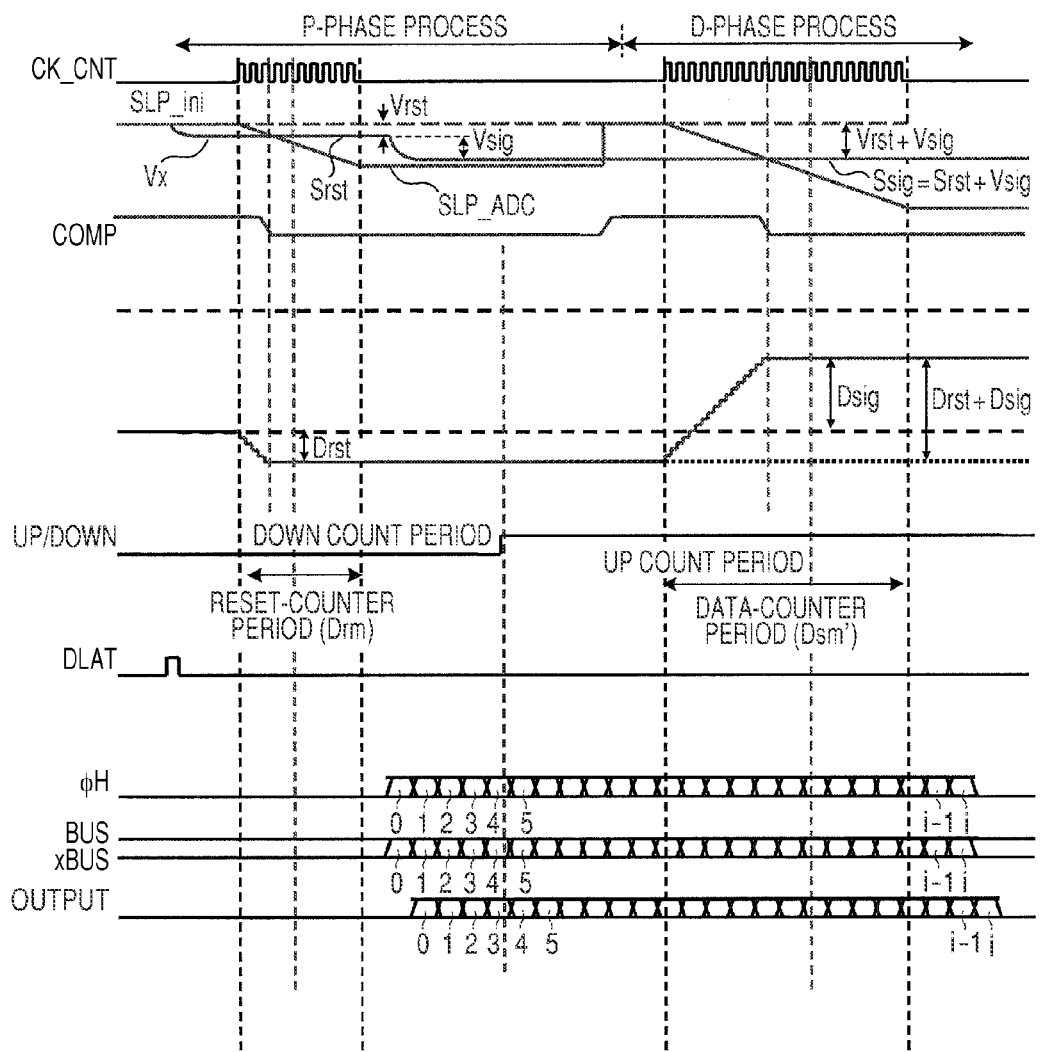

FIG. 3C

<THIRD PROCESS EXAMPLE>
<OPERATIONAL PRINCIPLE OF FIRST EXAMPLE:
DIFFERENCE PROCESS IN P-PHASE AND D-PHASE UP COUNT MODE>
  P-PHASE SECOND-HALF COUNTING OPERATION
  (COMPLEMENT NUMBER COUNTING OPERATION)
  D-PHASE FIRST-HALF COUNTING OPERATION
  (REAL NUMBER COUNTING OPERATION)

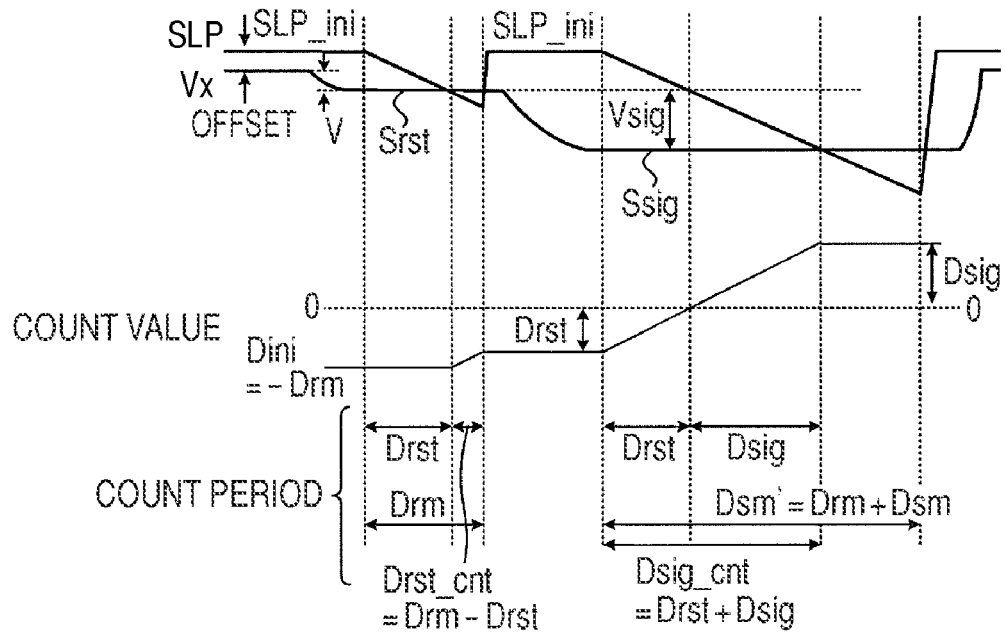

Drst: SUBTRACTION ELEMENT
Dsig: ADDITION ELEMENT $$\left.\begin{array}{l} D1 = Dini + (Drm - Drst) \cdots (1\text{-}1) \\ D1 = Dini + (Drm - Drst) = -Drst \cdots (1\text{-}2) \end{array}\right\} \cdots (1)$$

$$\left.\begin{array}{l} D2 = Dini + (Drm - Drst) + (Drst + Dsig) \\ \quad = -Drst + (Drst + Dsig) \\ \quad = Dsig \\ \qquad @Dini = Drm \end{array}\right\} \cdots (2)$$

$$\left.\begin{array}{l} D2 = Dini + (Drm - Drst) + (Drst + Dsig) \\ \quad = Drm + Dsig \\ \qquad @Dini = 0 \end{array}\right\} \cdots (3)$$

FIG. 3D

<THIRD PROCESS EXAMPLE>
<OPERATIONAL PRINCIPLE OF SECOND EXAMPLE:
DIFFERENCE PROCESS IN P-PHASE AND D-PHASE DOWN COUNT MODE>

P-PHASE FIRST-HALF COUNTING OPERATION
(REAL NUMBER COUNTING OPERATION)
D-PHASE SECOND-HALF COUNTING OPERATION
(COMPLEMENT NUMBER COUNTING OPERATION)

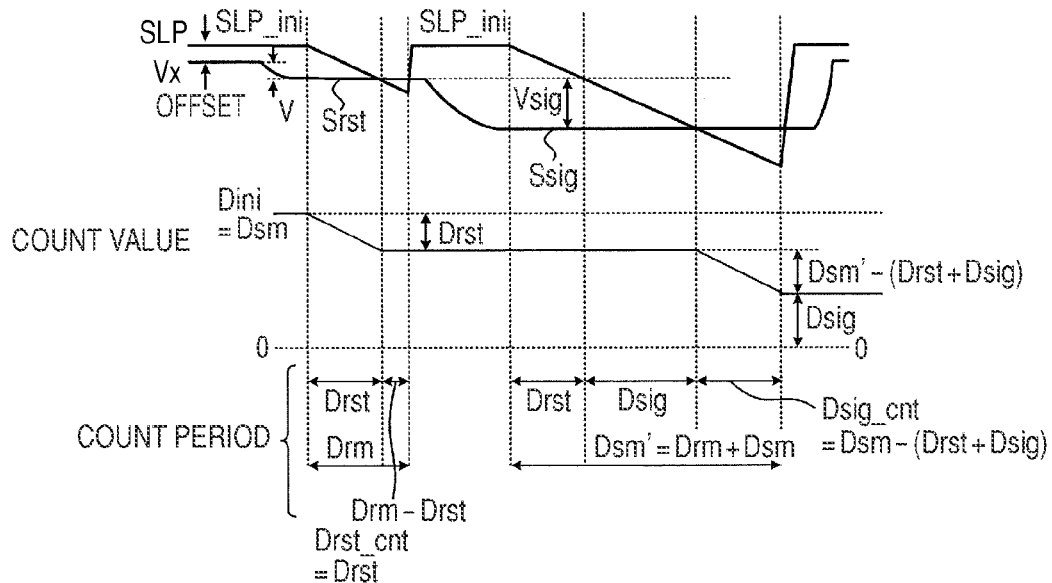

Drst: ADDITION ELEMENT
Dsig: SUBTRACTION ELEMENT $D1 = Dini - Drst \quad \cdots (4)$ $$\left.\begin{array}{l} \begin{aligned} D2 &= Dini - Drst - (Dsm' - (Drst + Dsig)) \\ &= (Dini - Dsm') - Drst + (Drst + Dsig) \\ &= Dini - Dsm' + Dsig \end{aligned} \right\} \cdots (5\text{-}1) \\ \\ \left. \begin{aligned} D2 &= Dini - Dsm' + Dsig = Dsig \\ &\quad\quad @Dini = Dsm' \end{aligned} \right\} \cdots (5\text{-}2) \end{array}\right\} \cdots (5)$$

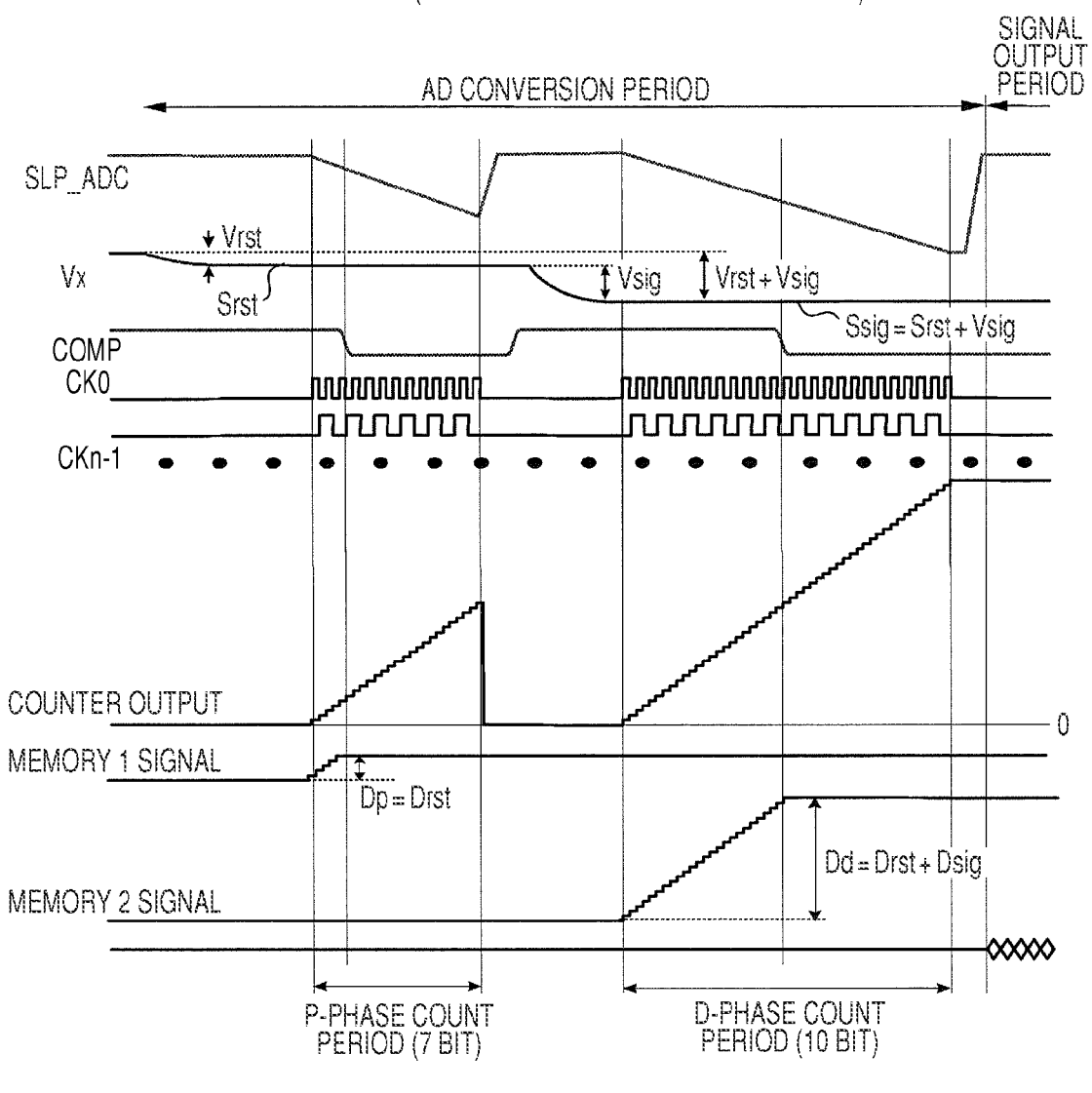

<FIRST EMBODIMENT (FIRST EXAMPLE)>

<FIRST EMBODIMENT (FIRST EXAMPLE): BASIC>

<FIRST EMBODIMENT (SECOND EXAMPLE)>

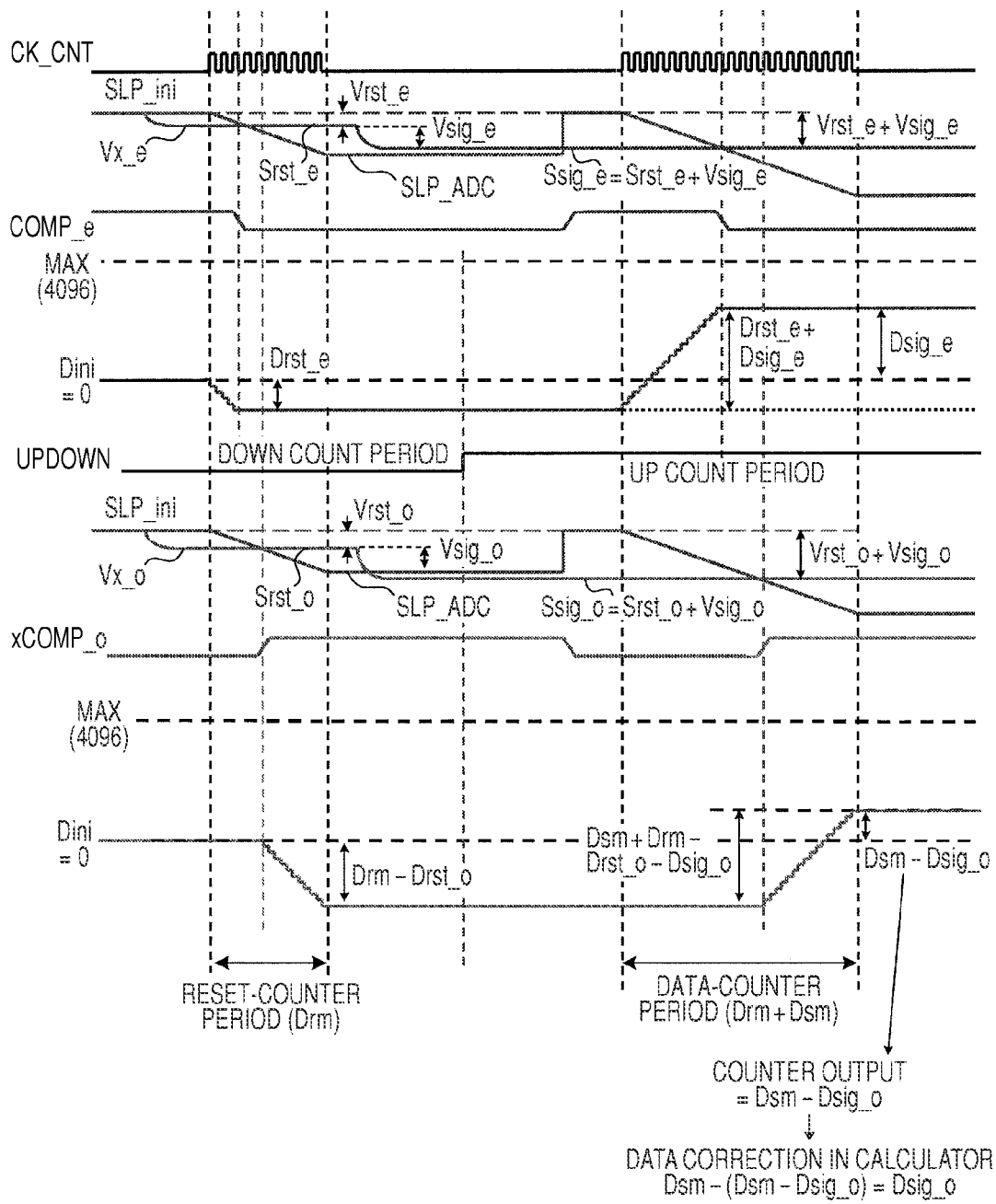

<SECOND EMBODIMENT (FIRST EXAMPLE)>

<SECOND EMBODIMENT: ARRANGEMENT EXAMPLE OF COLOR SEPARATION FILTER>

* BAYER ARRANGEMENT

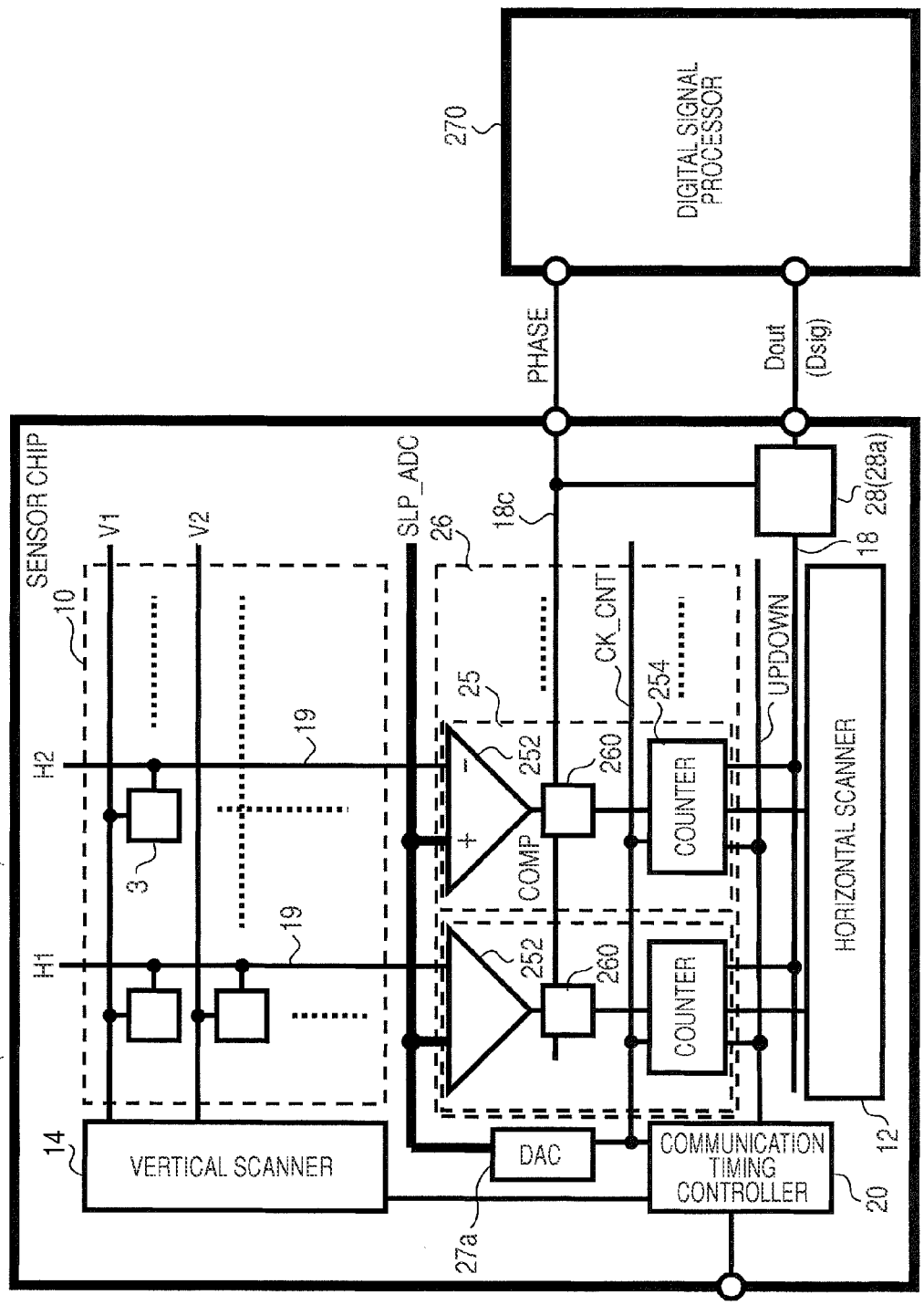

DATA PROCESSOR, SOLID-STATE IMAGING DEVICE, IMAGING DEVICE, AND ELECTRONIC APPARATUS

CROSS REFERENCES TO RELATED APPLICATIONS

The present invention contains subject matter related to Japanese Patent Application JP 2007-266227 filed in Japanese Patent Office on Oct. 12, 2007, the entire contents of which is incorporated herein by reference.

BACKGROUND OF THE INVENTION

1. Field of the Invention

The present invention relates to a data processor performing a data process accompanied with an analog-digital conversion (AD conversion) and a solid-state imaging device, an imaging device, and an electronic apparatus as an example of a physical quantity distribution detecting semiconductor device employing the structure of the AD conversion. More particularly, the invention relates to a digital signal processing technique suitable for a physical quantity distribution detecting semiconductor device or other electronic apparatuses, such as a solid-state imaging device in which plural unit elements responding to externally input electromagnetic waves such as light or radiation are arranged so as to voluntarily select a physical quantity distribution converted into electrical signals by the unit elements under an address control and to read out the selected physical quantity distribution as an electrical signal. Specifically, the invention relates to a digital data acquiring technique for treating a processing signal.

2. Description of the Related Art

In recent years, as an example of a solid-state imaging device, MOS (Metal Oxide Semiconductor) or CMOS (Complementary MOS) image sensors capable of overcoming various problems which CCD (Charge Coupled Device) image sensor has attracted attention.

For example, a scheme of a so-called column-parallel output type or column type in which an amplifier circuit employing a floating diffusion amplifier is disposed for each pixel, a signal processing circuit is disposed at a stage in the back of a pixel array unit 10 for each column, a row in the pixel array unit is selected, the row is concurrently accessed to read a pixel signal from the pixel array unit in the unit of row, that is, concurrently in parallel from all the pixels in the row is widely used for the CMOS image sensors.

A scheme of converting an analog pixel signal read from the pixel array unit into digital data by the use of an analog-digital converter and then outputting the digital data to the outside may be employed for the solid-state imaging devices.

This is true in the column-parallel output type image sensors. Various signal output circuits have been invented and the most advanced example thereof is a scheme having an AD converter every column and taking out a pixel signal as digital data therefrom.

Various AD conversion schemes have been considered in view of circuit scale, processing speed (increase in speed) resolution, or the like. An example thereof is an AD conversion scheme comparing an analog unit signal with a so-called ramp type reference signal (ramp wave) of which the value gradually varies for conversion into digital data, performing a count process along with the comparison process, and acquiring digital data of the unit signal on the basis of a count value at the time of completion of the comparison process, which is called a slope integrating type or a ramp signal comparing type (hereinafter, referred to as a reference signal comparing type). By combining the reference signal comparing AD conversion scheme and the column-parallel output type scheme, the analog output from the pixels can be converted to a low band in an AD conversion manner by columns in parallel, which is suitable for an image sensor combining high speed with high image quality.

Here, regarding the pixel signal, a difference between a pixel signal level at the time of resetting the pixels and a pixel signal level at the time of reading signal charges is a true signal component. Accordingly, when the reference signal comparing AD conversion scheme is used, a structure in which a difference process in any one side is considered is employed. A structure for performing a difference process together at the time of concurrently converting the pixel signal from all the pixels in a row into digital data by combination of the reference signal comparing AD conversion scheme and the column-parallel output type is employed.

For example, a solid-state imaging device mounted with a column-parallel type AD converter is disclosed in JP-A-2005-278135 and W. Yang et al., "An Integrated 800×600 CMOS Image System," ISSCC Digest of Technical Papers, pp. 304-305, February, 1999.

In the structure described in W. Yang et al., a master counter is disposed outside a column area, the bit output of the counter is drawn into the column area, and AD converted data based on a signal amplitude is acquired every column in the column area by performing a count process depending on a voltage level of a pixel signal by columns and then latching (storing) a counter output of the column. In the structure described in Yang et al., the AD conversion result of a pixel signal voltage level (reset level) at the time of resetting pixels and the AD conversion result of a pixel signal voltage level (signal level) at the time of reading signal charges are stored in different data storages, a set of the AD conversion results is transmitted to a subtraction circuit at the subsequent stage through a horizontal signal line, and the set of AD conversion results is subjected to a difference process by the subtraction circuit.

In the structure described in JP-A-2005-278135, a counter is disposed every column in a column area and AD converted data based on a signal amplitude is acquired every column by performing a count process depending on a voltage level of a pixel signal by columns and then latching (storing) a counter output of the column. In the structure described in JP-A-2005-278135, by switching a count mode between an up-count mode and a down-count mode at the time of a reset level AD conversion and at the time of a signal level AD conversion, the AD conversion result of a true signal component is automatically acquired as the final AD conversion output value at the time of the signal level AD conversion which is the second AD conversion process. That is, a difference processing function is carried out at the same time of the AD conversion process.

SUMMARY OF THE INVENTION

However, in the structures described in W. Yang et al. and JP-A-2005-278135, in converting an analog pixel signal voltage obtained from the pixels into a digital signal, by finding out a point where the reference signal and the pixel signal voltage are identical to each other and counting the clock number from the time point when the reference signal is generated to the time point when the pixel signal voltage and the reference signal are identical to each other, the AD converted data corresponding to the pixel signal voltage is acquired.

Therefore, when the signal amplitude is great, a comparison process period or a count period is elongated and thus power consumption is enhanced. That is, a period of time until the output of a comparison circuit (referred to as comparator output) is inverted is counted to acquire the AD conversion result of the pixel signal voltage. Accordingly, when the signal amplitude is great, the inversion timing of the comparator output is delayed, whereby the operation period of the counter becomes longer and the power consumption of the counter becomes great. Accordingly, the power consumption of the counter varies depending on the signal amplitude. The signal amplitude (input level) has an influence on the power consumption. Concretely, the power consumption is reduced when the signal amplitude is small, and is enhanced when the signal amplitude is great, so that the power consumption is irregular depending on the signal amplitude.

There is a need for a new method causing a small variation in basic configuration when a reference signal comparison type AD conversion scheme is employed. It is desirable to provide a structure for reducing an influence of input amplitude on power consumption. It is also desirable to provide a structure for effectively accomplishing low power consumption.

A data processor according to an embodiment of the invention includes: a reference signal generator generating a reference signal, which is used to convert a level of an analog signal (analog processing signal) into digital data, gradually varying to enhance the amplitude of the processing signal; a comparator comparing the processing signal with the reference signal generated by the reference signal generator; and a counter performing a count process in parallel with the comparison process by the comparator and maintaining a count value acquired during a predetermined count period to acquire a predetermined level of digital data. That is, as an AD conversion structure for an analog signal, an AD conversion scheme called a reference signal comparison type is employed.

A solid-state imaging device, an imaging device, or an electronic apparatus uses the same configuration as the data processor. The solid-state imaging device may be configured by one chip or may have a module shape having an imaging function which is packaged with incorporation of an imaging unit, a signal processor or an optical system. The data processor can be applied to an imaging device in addition to the solid-state imaging device. If so, the imaging device has the same effect as the solid-state imaging device. Here, the imaging device indicates, for example, a camera or a portable device having an imaging function. The "imaging" includes the pickup of an image at the time of normal camera work, detection of a fingerprint, and the like in a wide sense of meaning.

When a signal output from a semiconductor device such as the solid-state imaging device has not only true signal components but also reset component or irregular components (generally referred to as reference components), and is output as a signal component added with the true signal component on the basis of the reference component, deferential process is performed to extract the true signal component as a difference signal component with respect to one processing signal.

In the solid-state imaging device, a signal is read from a pixel array unit in which unit pixels are arranged in a matrix, each unit pixel including a charge generator and an output transistor outputting a processing signal in response to the charge generated by the charge generator. Here, a row direction and a column direction are not fixed. In general, a direction in which a scanning speed is low is called a column direction or a vertical direction, and a direction in which the scanning speed is high is called a row direction or a horizontal direction. However, such definition is not absolute, but for example, when the drawings are rotated by 90°, the relations of up, down, right, and left are changed, and thus the row and column relation or the vertical and horizontal relation is reversed. Hereinafter, it is assumed that the column direction is the vertical direction and the row direction is the horizontal direction.

In an embodiment of the invention, a count period (count operation period) in the AD conversion scheme called a reference signal comparison type is independently controlled on the basis of a predetermined criterion. "To independently control the count operation period" means that it is controlled whether the actual count operation (in other words, real number count operation) should be performed in the first half of the entire AD conversion period or the actual count operation (in other words, complement number count operation) should be performed in the second half.

In a relation between the "predetermined criterion" and the "independent control" corresponding thereto, it is considered, as a first example, that a first counter performing the first-half count operation and a second counter performing the second-half count operation are provided and processing signals are suitably distributed thereto. That is, the individual counters exclusively performing the first-half count operation and the second-half count operation are prepared and the counters are independently controlled.

In the structure of the first example, since the count periods of the first counter and the second counter are independently controlled, that is, since the first counter is controlled to perform the count operation in the first half of the count period and the second counter is made to perform the count operation in the second half of the count period, the equalization of periods (referred to as counter activation period) when the count operation is actually performed depending on the input amplitude is achieved. Similarly, when a signal of amplitude is processed in parallel by the first counter and the second counter, only one of them is actually made to operate in the entire count period, thereby reducing the number of counters concurrently operating in the same period.

At this time, when signals input in time series from one signal line are treated, it can be considered that the signals are distributed (switched) to one of the first counter and the second counter depending on the input level, thereby switching the counters actually performing processes.

Particularly, in application to the solid-state imaging device, it can be considered that the first counter and the second counter are alternately arranged every predetermined number (k column: k is a positive integer) to process the pixel signal voltage of the corresponding column. An example of "alternately arranged every predetermined number" is to alternately arrange the first counter and the second counter every column, that is, to alternately arrange the first counter and the second counter to be adjacent to each other.

In the relation between the "predetermined criterion" and the "independent control" corresponding thereto, as a second example, it can be considered that the counters are made to perform both the first-half count operation and the second-half count operation and to selectively perform the first-half count operation (real number count operation) and the second-half count operation (complement number count operation) depending on the input amplitude. That is, on the basis of the input amplitude, the counters are switched to one of the first-half count operation and the second-half count operation.

In the structure of the second example, since the count periods of the counters are independently controlled, that is, since the count operation is performed in the first half of the entire count period when the input amplitude is small and the count operation is performed in the second half of the entire count period when the input amplitude is great, the period (count activation period) when the count operation is actually performed depending on the input amplitude is shortened.

At this time, when the signals input in time series from one signal line are treated, it can be considered that one counter capable of performing both the first-half count operation and the second-half count operation is provided and the counter is controlled to perform one of the first-half count operation and the second-half count operation depending on the input amplitude.

Particularly, in application to the solid-state imaging device, it can be considered that counters capable of performing both the first half count operation and the second half count operation are disposed every column and the counters are controlled to selectively perform the first-half count operation or the second-half count operation depending on the amplitude of the pixel signal voltage. At this time, a scheme for independently performing the amplitude determination (level determination) on the reset level and the signal level and selectively performing the first-half count operation and the second-half count operation on the reset level and the signal level can be employed. In addition, a scheme for performing the amplitude determination on only the signal level and selectively performing the first-half count operation and the second-half count operation on a set of the reset level and the signal level on the basis of the determination result.

A scheme for determining the input amplitude of the present processing signal for a signal to be subjected to the amplitude determination can be employed. In addition, a scheme for using the determination result of the input amplitude in the present process for the subsequent process, that is, using the determination result of the input amplitude in the previous process can be employed.

Regarding a structure for the amplitude determination, it can be considered that the amplitude determination is performed using a single input signal (for example, the input signal in the present or previous process), and that the amplitude determination is performed using a value as a result obtained from plural signals, for example, that the amplitude determination is performed in the unit of one row or one picture using the average value, the maximum value, or the minimum value or center value thereof as a determination indicator.

In other words, the second-half count operation is the complement number count operation. Accordingly, it is necessary to correct the data acquired from the complement number count operation into real data. At the time of performing a count operation on an initial processing signal, the correction of data may be performed by allowing the counter to start the count operation using as an initial value a count value corresponding to a period of time when the reference signal reaches the final value from the initial value. Alternatively, after the count process on a final processing signal is finished, the stored count value may be corrected using the count value corresponding to the period of time when the reference signal reaches the final value from the initial value.

According to an embodiment of the invention, the AD conversion process can be implemented in which the first-half count operation and a second-half count operation are combined. Accordingly, it is possible to reduce the influence of the input amplitude on the power consumption.

For example, when the structure of the first embodiment is employed, the number of counters operating depending on the input amplitude can be equalized in comparison with the case where the structure is not employed, thereby equalizing the power consumption.

When the structure of the second example is employed, the count activation period can be shortened depending on the input amplitude (specifically, with high amplitude) in comparison with the case where the structure is not employed, thereby reducing the power consumption.

BRIEF DESCRIPTION OF THE DRAWINGS

FIG. 3A is a timing diagram illustrating an operation of a first process example of the reference signal comparison type AD conversion operation.

FIG. 3C is a timing diagram illustrating an operation of a third process example (1) of the reference signal comparison type AD conversion operation.

FIG. 3D is a timing diagram illustrating an operation of the third process example (2) of the reference signal comparison type AD conversion operation.

FIG. 3E is a timing diagram illustrating an operation of a fourth process example of the reference signal comparison type AD conversion operation.

FIG. 5B is a timing diagram illustrating a basic operation of the first embodiment (second example).

FIG. 7 is a block diagram illustrating an example of a circuit configuration for putting a second embodiment (second example), which has a structure for independently controlling the counter activation period, into practice.

DESCRIPTION OF THE PREFERRED EMBODIMENTS

Hereinafter, preferred embodiments of the invention will be described in detail with reference to the accompanying drawings. It is assumed that a CMOS solid-state imaging device as an example of an X-Y address type solid-state imaging device is used in the following embodiments. In the CMOS solid-state imaging device, all pixels are formed of NMOS.

However, this is only an example and a device to which the invention is applied is not limited to the CMOS solid-state imaging device. All the embodiments to be described below can be applied to physical quantity distribution detecting semiconductor devices in which plural unit elements responding to externally-input electromagnetic waves such as light or radiation are arranged in a line or in a matrix.

Configuration of Solid-State Imaging Device

Figure 1:
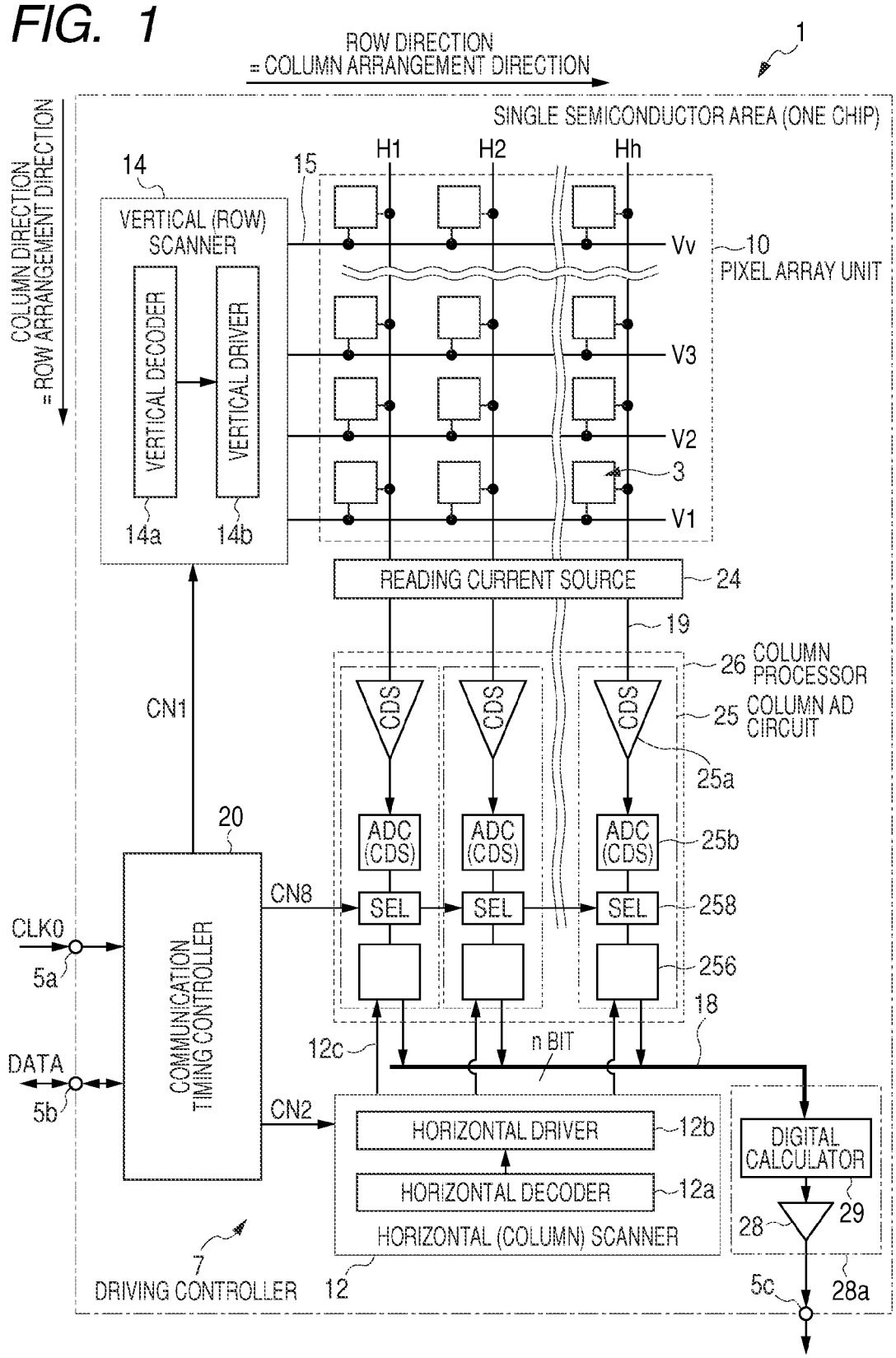
FIG. 1 is a diagram schematically illustrating a configuration of a CMOS solid-state imaging device which is an example of a solid-state imaging device according to an embodiment of the invention.

FIG. 1 is a diagram schematically illustrating a CMOS solid-state imaging device (CMOS image sensor) as a solid-state imaging device according to an embodiment of the invention.

The solid-state imaging device 1 includes a pixel unit in which plural pixels having a light receiving element (an example of the charge generator) outputting a signal corresponding to the intensity of incident light are arranged in rows and columns (that is, in a two-dimensional matrix) where signal output from each of pixels is voltage signal and CDS (Correlated Double Sampling) functional units or analog-digital converters (ADC) are arranged in parallel to the columns.

"That the CDS functional units or analog-digital converters are arranged in parallel to the columns" means that plural CDS functional units or analog-digital converters are arranged substantially in parallel to vertical signal lines (an example of the column signal line) 19 of vertical columns.

When the device is viewed in a plane, the plural functional units may be disposed on only one end frame in a column direction of the pixel array unit 10 (on the output side disposed in the lower portion of the drawing), or may be disposed on one end frame in the column direction of the pixel array unit 10 (on the output side disposed in the downside of the drawing) and on the opposite end frame (in the upside of the drawing). In the latter, it is preferable that horizontal scanners performing a reading scanning operation (horizontal scanning operation) in the row direction are divisionally disposed on the end frames and can independently operate.

A typical example in which the CDS functional units or the analog-digital converters are disposed in parallel to the columns is a column type in which the CDS functional units or the analog-digital converters are disposed every vertical columns in a column area disposed on the output side of an imaging unit so as to sequentially read out signals to the output side. In addition to the column type (column parallel type), a type in which one CDS functional unit or analog-digital converter is assigned to neighboring plural (for example, two) vertical signal lines 19 (vertical columns) or a type in which one CDS functional unit or analog-digital converter is assigned to N vertical signal lines 19 (vertical columns) with an N interval (where N is a positive integer and N−1 lines are arranged in the interval) may be employed.

Since the types other than the column type has a structure where plural vertical signal lines 19 (vertical columns) commonly use one CDS functional unit or analog-digital converter, a switching circuit (switch) supplying pixel signals corresponding to plural columns supplied from the pixel array unit 10 to one CDS functional unit or analog-digital converter is provided. A countermeasure of providing a memory storing the output signals and the like are needed depending on the subsequent process.

In any case, by employing a type in which one CDS functional unit or analog-digital converter is assigned to plural vertical signal lines 19 (vertical columns), the pixel signals are processed after the pixel signals are read out in the unit of pixel column, whereby the configuration of each pixel is simplified in comparison with the case where the signals are processed in the unit of unit pixel, thereby coping with an increase in the number of pixels of the image sensor and a decrease in size and cost thereof.

Since the pixel signals of one row are concurrently processed by the plural signal processors disposed in parallel to the columns, the signal processors can be made to operate at a low speed in comparison with a case where the pixel signals are processed by one CDS functional unit or analog-digital converter on the output circuit side or outside the device. Accordingly, it is advantageous in power consumption or bandwidth performance or noise. In other words, when the power consumption or the bandwidth performance is constant, the sensor can operate at a high speed as a whole.

In a configuration of the column type, the sensor can be made to operate at a low speed, which causes advantages in power consumption or bandwidth performance or noise and provides an advantage that a switching circuit (switch) is not necessary. In the following description, the column type is described as long as a specific definition is not described.

As shown in FIG. 1, a solid-state imaging device 1 according to an embodiment of the invention includes a pixel array unit 10 which is called a pixel unit or an imaging unit and in which plural unit pixels 3 are arranged in rows and columns, a driving controller 7 disposed outside the pixel array unit 10, a reading current source unit 24 supplying the unit pixels 3 of the pixel array unit 10 with operation current (reading current) for reading a pixel signal, a column processor 26 having column AD circuits 25 disposed by vertical columns, and an output circuit (sense amplifier: S/A) 28. The functional units are disposed on a single semiconductor substrate.

A digital calculator 29 may be disposed at a stage in the front of or in the back of the output circuit 28 as needed. In the drawing, the digital calculator 29 is disposed at the stage in the front of the output circuit 28. When the digital calculator 29 is disposed, the digital calculator 29 and the output circuit 28 are together called a DPU (Data Process Unit) 28*a*. Here, "as needed" means that a difference process between a reset level Srst and a signal level Ssig is not performed by the column AD circuit 25 but at a stage in the back of the column AD circuit 25, or that a data correcting operation corresponding to the complement number counting operation of the column processor 26 or other product sum calculating operations are performed.

Some rows and columns are missed for the purpose of simplification in FIG. 1. However, several tens to thousands unit pixels 3 are arranged in each row or column. The unit pixel 3 generally includes a photo diode as a light-receiving element (charge generator) which is an example of a sensor and an intra-pixel amplifier (an example of a pixel signal generator) having a semiconductor element (for example, transistor) for amplification.

The solid-state imaging device 1 can allow a pixel array unit 10 to cope with color imaging by employing a color separation filter. That is, one color filter of color separation filters having a combination of color filters of plural colors for taking a color image is provided on a light-receiving surface on which electromagnetic waves (light in this embodiment) from the charger generators (photo diodes) in the pixel array unit 10 are incident, for example, in a so-called Bayer arrangement, thereby coping with the color imaging.

The column AD circuit 25 in this embodiment includes a difference processor (CDS) 25a acquiring a signal component expressed by a difference between a reset level and a signal level by performing a difference process between a signal level (hereinafter, referred to as "reset level") just after resetting the pixels as a reference level of a pixel signal So and a signal level and an AD converter (ADC) 25b converting the signal component which is the difference between the reset level as the reference level of the pixel signal and the signal level into N-bit digital data.

The difference processor 25a and the AD converter 25b are not limited in the arrangement order. For example, as shown in FIG. 1, a difference process may be performed between the reset level and the signal level of analog by the difference processor 25a and then the difference process result may be converted into digital data by the AD converter 25b. Alternatively, although not shown, the reset level and the signal level may be converted into digital data, respectively, by the AD converter 25b and then a difference between the digital data may be acquired by the difference processor 25a. The analog difference process is not essential.

The function of the difference processor 25a is equivalent to a process (CDS process) of calculating a difference between the reset level Srst of a pixel signal voltage Vs and the signal level Ssig including a true signal component Vsig (corresponding to the received light intensity) thereby removing a noise signal component called a fixed pattern noise (FPN) or a reset noise.

In this way, the column AD circuit 25 in this embodiment can be configured to serve as an AD conversion and noise removing signal processor having both an AD conversion function of converting analog pixel signal transmitted from the pixel array unit 10 into digital data and a function of suppressing and removing a noise component. The column AD circuit 25 performs a process of converting the pixel signal voltage Vx output from the unit pixels 3 in the row selected by a vertical scanner 14 for selecting a row address into n-bit digital data in the unit of row and the noise removing signal process.

The AD conversion process of the column processor 26 can employ a method of converting analog signals stored in parallel by rows into digital data by rows by the use of the column AD circuit 25 (specifically, the AD converter 25b). At this time, the reference signal comparing type (a single slope integrating type or a ramp signal comparing type) AD conversion scheme can be employed. This scheme can implement an AD converter with a simple structure, and thus does not increase the circuit scale even when they are arranged in parallel.

At this time, in view of the circuit configuration or operation of the AD converter 25b, the AD converter can perform a CDS process acquiring a difference between the reset level just after resetting the pixels and the true signal level (corresponding to the received light intensity) on the pixel signal in the voltage mode input from the vertical signal line 19 along with the AD conversion process and can be made to serve as the difference processor 25a for removing the noise signal component such as the fixed pattern noise. In the reference signal comparing type AD conversion, the AD converter determines an effective count operation period (a signal indicating the period is referred to as a count enable signal) on the basis of the period of time from the start of conversion (the start of comparison process) to the end of conversion (the end of comparison process), and converts an analog processing signal into digital data in accordance with the count enable signal.

The use of the reference signal comparing type AD conversion scheme in the column AD circuit 25 is only an example, and other circuit configuration may be used so long as they can perform the AD conversion process or the noise removing process. The column AD circuit 25 converts the pixel signal voltage Vx in the AD conversion manner and horizontally transmits the resultant digital data, but may horizontally transmit analog information corresponding to the pixel signal voltage Vs. In this case, the difference processor 25a preferably performs the CDS process of acquiring the difference between the reset level Srst and the signal level Ssig of the pixel signal voltage Vx in the unit of pixel columns.

The driving controller 7 has a control circuit function of sequentially reading signals from the pixel array unit 10. For example, the driving controller 7 includes a horizontal scanner (column scanning circuit) 12 controlling column addresses or column scanning, a vertical scanner (row scanning circuit) 14 controlling a row address or row scanning, and a communication timing controller 20 having a function of generating a built-in clock.

The unit pixel 3 is connected to the vertical scanner 14 through a row control line 15 for selecting a row and is connected to the column processor 26 having a column AD circuit 25 disposed every vertical column through a vertical signal line 19. Here, the row control line 15 means all the wiring lines extending from the vertical scanner 14 to the pixels.

The vertical scanner 14 serves to select a row of the pixel array unit 10 and to supply a necessary pulse to the selected row. For example, the vertical scanner 14 includes a vertical address-setter 14a defining a reading row in the vertical direction (selecting a row in the pixel array unit 10) and a vertical driver 14b supplying pulse to and driving the row control line 15 for the unit pixels 3 in the reading address (row direction) defined by the vertical address-setter 14a. The vertical address-setter 14a selects a row for an electronic shutter as well as a signal reading row (reading row: which is also referred to as a selected row or signal output row).

The horizontal scanner 12 has a reading scanner function of sequentially selecting the column AD circuits 25 in the column processor 26 in synchronization with a clock and transmitting data, which is obtained by converting a pixel signal into digital data, to the horizontal signal line (horizontal output line) 18. For example, the horizontal scanner 12 includes a horizontal decoder 12a defining a reading column in the horizontal direction (selecting the individual column AD circuits 25 in the column processor 26) and a horizontal driver 12b transmitting the signals (AD-converted data) of the column processor 26 to the horizontal signal line 18 in accordance with the reading address defined by the horizontal decoder 12a.

The horizontal signal line 18 is a bus line for transmitting data generated by the column AD circuits 25. The number of horizontal signal lines 18 corresponds to the number of bits n (where n is a positive integer) treated by the column AD circuit 25 or double thereof, for example, 10 or 20 when the number of bits is 10 (=n). Specifically, when the column AD circuit 25 performs a difference process between the reset component and the signal component, the number of horizontal signal lines is equal to the number of bit n treated by the column AD circuit 25. On the other hand, when a stage (for example, digital calculator 29) subsequent to the column AD circuit 25 performs the difference process between the reset component and the signal component, the number of horizontal signal lines is 2n in total of n for transmitting the AD conversion result of the reset component and n for transmitting the AD conversion result of the signal component.

Although not shown in the drawings, the communication timing controller 20 includes a functional block of a timing generator TG (an example of the reading address controller) supplying a clock or a pulse signal of a predetermined timing required for operations of the units and a function block of a communication interface receiving a master clock CLK0 supplied from an external main controller through a terminal 5a, receiving data indicating an operation mode and being supplied from the external main controller through a terminal 5b, and outputting data including information of the solid-state imaging device 1 to the external main controller.

For example, a horizontal address signal is output to the horizontal decoder 12a and a vertical address signal is output to the vertical decoder 14a. The decoders 12a and 14a receive the signals and select a row or column corresponding to the signals. The horizontal scanner 12 or the vertical scanner 14 includes the decoder 12a or 14a for setting an address and switches the reading address by a shift operation (scanning) in response to the control signals CN1 and CN2 given from the communication timing controller 20.

Since the unit pixels 3 are arranged in a two-dimensional matrix, an increase in reading speed for reading the pixel signals or the pixel data can be accomplished by performing a (vertical) scan reading operation of accessing and acquiring the analog pixel signals generated by the pixel signal generators disposed in the unit pixels 3 and output in the column direction through the vertical signal line 19 in the unit of rows (in parallel by columns) and then performing a (horizontal) scan reading operation of accessing the row direction which is an arrangement direction of the vertical columns and reading the pixel signals (digitized pixel data in this embodiment) to the output side. Of course, a random access operation of reading only information on necessary unit pixels 3 by directly addressing the unit pixels 3 to be read may be performed instead of the scan reading operation.

The constituent elements of the driving controller 7 such as the horizontal scanner 12 or the vertical scanner 14 are monolithically formed in a semiconductor area of monocrystalline silicon or the like along with the pixel array unit 10 by the use of the same techniques as the semiconductor integrated circuit manufacturing techniques to form a so-called one chip (formed on a single semiconductor substrate) which is a CMOS image sensor as an example of a semiconductor system and constitutes a part of the solid-state imaging device 1 according to this embodiment.

The solid-state imaging device 1 may have a one chip structure in which the constituent elements are monolithically formed in a semiconductor area, or may have a module structure having an imaging function in which optical systems such as an imaging lens, an optical low-pass filter, and an infrared cut filter as well as the signal processors such as the pixel array unit 10, the driving controller 7, and the column processor 26 are collected and packaged.

In the solid-state imaging device 1 having the above-mentioned configuration, the pixel signals output from the unit pixels 3 are supplied to the column AD circuits 25 of the column processor 26 through the vertical signal lines 19 by vertical columns.

In a basic configuration not including the data storage and transmission output unit 256, the output of the AD converter 25b or the difference processor 25a is connected to the horizontal signal line 18. When the pixel signals are subjected to the difference process by the difference processor 25a and then are converted into digital data by the AD converter 25b, the output of the AD converter 25b is connected to the horizontal signal line 18. On the contrary, when the pixel signals are converted into digital data by the AD converter 25b and then are subjected to the difference process by the difference processor 25a, the output of the difference processor 25a is connected to the horizontal signal line 18. Hereinafter, the former is assumed as shown in FIG. 1.

A control pulse (horizontal data transmission clock φH) is input to the AD converter 25b from the horizontal scanner 12 through the control line 12c. The AD converter 25b has a latch function of storing the count result and stores data until a control pulse is given through the control line 12c.

In this embodiment, on the output side of the column AD circuits 25, as shown in the drawings, a data storage and transmission output unit 256 as an N-bit memory unit storing the count result stored in the AD converter 25b and a switch (selector: SEL) 258 as an example of a data switch disposed between the AD converter 25b and the data storage and transmission output unit 256 are disposed at the stage subsequent to the AD converter 25b.

When the data storage and transmission output unit 256 is provided, a memory transmission instructing pulse CN8 as a control pulse is supplied to the switch 258 from the communication timing controller 20 at a predetermined timing in common to the switches 258 of other vertical columns.

When it is supplied with the memory transmission instructing pulse CN8 on the basis of a load function, the switch 258 transmits data of the AD converter 25b in the corresponding column to the data storage and transmission output unit 256. The data storage and transmission output unit 256 stores the transmitted data.

In the horizontal scanner 12 of this embodiment, the difference processors 25a and the AD converters 25b of the column processor 26 have a reading scanner function reading data stored in the data storage and transmission output units 256 at the same time performing their own processes to correspond to the switches 258.

When the data storage and transmission output units 256 are provided, the AD conversion data stored in the AD converter 25b can be transmitted to the data storage and transmission output unit 256. Accordingly, it is possible to independently control the AD conversion process of the AD converter 25b and the reading operation of the AD conversion result to the horizontal signal line 18 and thus to embody a pipeline operation of performing the AD conversion process and the signal reading operation to the outside in parallel.

For example, the AD converter 25b completes the AD conversion by latching (storing) the AD conversion result of the pixel data therein. Thereafter, the data is transmitted to the data storage and transmission output unit 256 and stored therein at a predetermined timing. Thereafter, the column AD circuit 25 sequentially outputs the pixel data stored in the data storage and transmission output units 256 from the chip having the column processor 26 and the pixel array unit 10 through an output terminal 5c by the shift operation synchronized with the control pulse input from the horizontal scanner 12 through the control line 12c at a predetermined timing.

Structure of Reference Signal Comparing AD Conversion

Figure 2A:
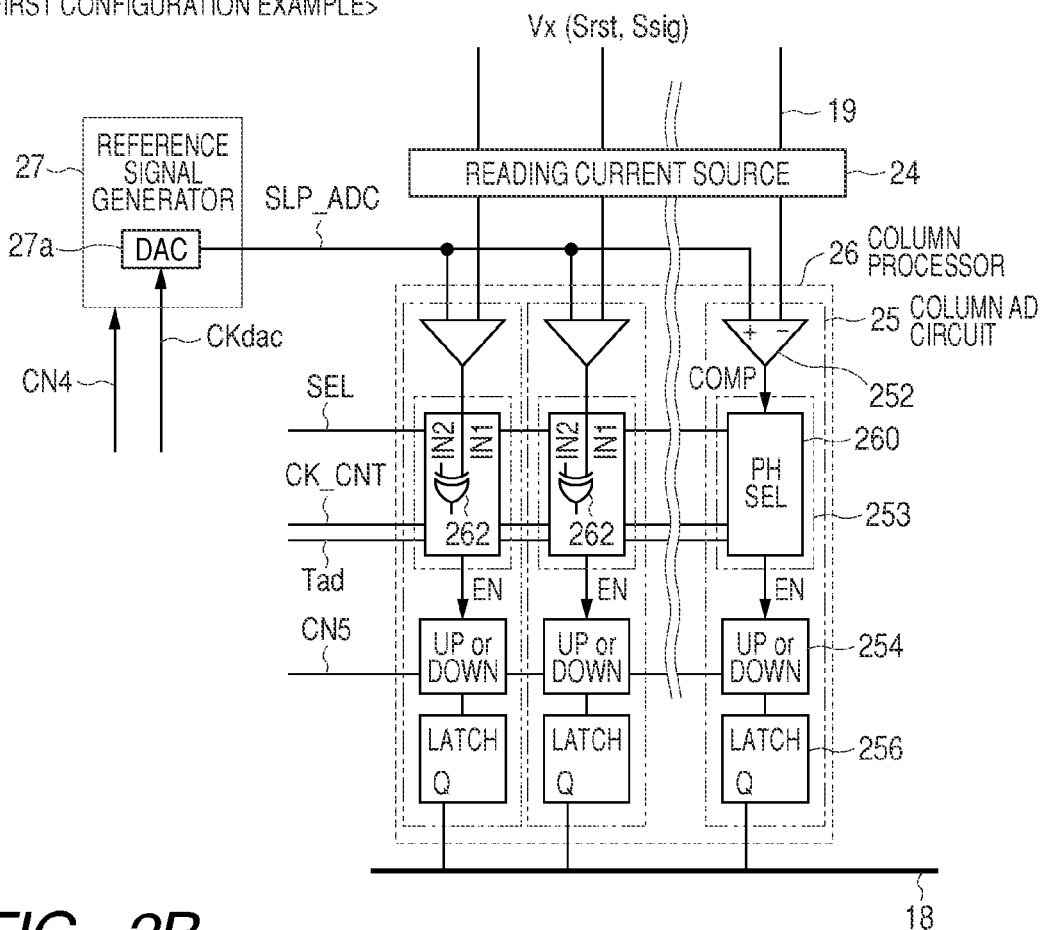
FIG. 2A is a diagram illustrating an example (first example) of a basic circuit configuration for performing a reference signal comparison type AD conversion operation.
Figure 2B:
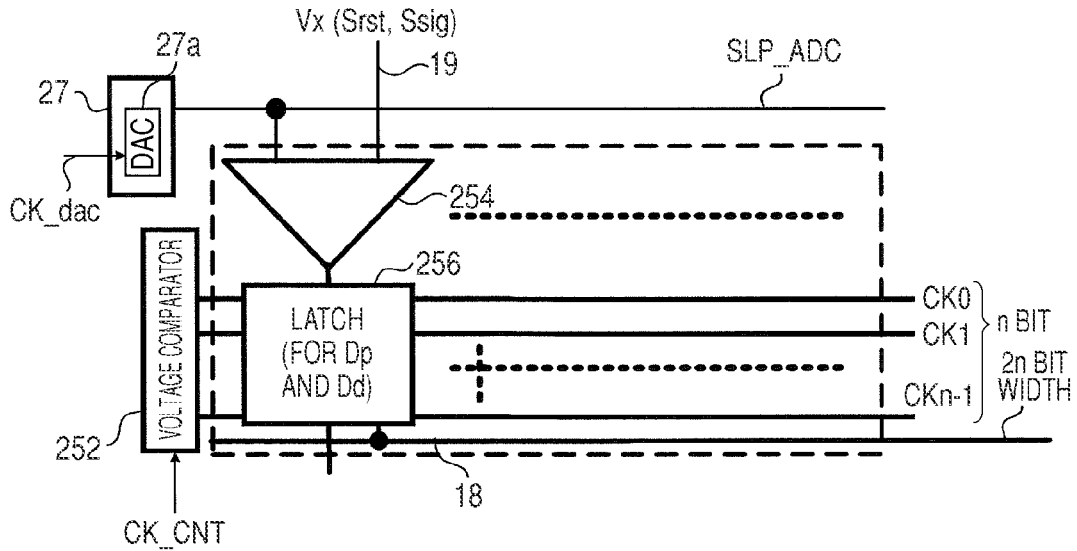
FIG. 2B is a diagram illustrating an example (second example) of the basic circuit configuration for performing the reference signal comparison type AD conversion operation.

FIGS. 2A and 2B are diagrams illustrating a basic circuit configuration for performing the reference signal comparing AD conversion.

As shown in FIG. 2A, a first configuration example for performing the reference signal comparing AD conversion includes a reference signal generator 27 supplying an AD-conversion reference signal SLP_ADC to the column processor 26. The reference signal SLP_ADC can have a waveform gradually linearly varying to enhance the amplitude of the pixel signal voltage Vx as the processing signal with a slope as a whole, and the variation thereof may exhibit a smooth slope shape or a step shape gradually varying.

The reference signal generator 27 includes a DA conversion circuit (DAC: Digital Analog Converter) 27a, generates the reference signal SLP_ADC in synchronization with a count clock CKdac from the initial value indicated by the control data CN4 from the communication timing controller 20, and supplies the generated reference signal SLP_ADC as an AD-conversion reference voltage (ADC reference signal) to the AD converters 25b of the column processor 26. Although not shown in the drawings, a noise-proof filter may be provided.

The control data CN4 supplied from the communication timing controller 20 to the DA conversion circuit 27a of the reference signal generator 27 includes information for keeping constant the variation of the digital data with respect to the time so that the reference signals SLP_ADC by processes basically have the same slope (variation). Specifically, the count value is changed by 1 every unit time in synchronization with the count clock CKdac and the count value is converted into a voltage signal by a current-adding AD conversion circuit. The count clock CKdac may be equal to the count clock CK_CNT.

The AD converter 25b includes a voltage comparator 252 comparing the reference signal SLP_ADC generated by the DA conversion circuit 27a of the reference signal generator 27 with an analog pixel signal acquired through the vertical signal lines 19 (H1, H2, . . . , Hh) from the unit pixels 3 in the unit of row control lines 15 (V1, V2, V3, . . . , Vv) and a counter unit 254 as an example of a counter counting a period of time until the voltage comparator 252 completes the comparison process or a period of time in a predetermined time after the completion and storing the result, and has an n-bit AD conversion function.

The counter unit 254 in this embodiment includes both functions of a counter counting the count clock CK_CNT to generate count data (count value) with the variation in time of the reference signal SLP_ADC and a data storage (count value storage) storing the count data corresponding to the pixel signal voltage Vx out of the count data generated by the counter.

The AD converter 25b includes a count operation controller 253 controlling a count operation period or the count data storing operation of the counter unit 254 between the voltage comparator 252 and the counter unit 254. The count operation controller 253 includes a count phase adjuster (PH SEL) 260 controlling the counting operation period (effective count operation period TEN) of the counter unit 254. The count phase adjuster 260 is supplied with a count period control signal SEL for controlling the count period from the communication timing controller 20 and is supplied with a comparison pulse COMP from the voltage comparator 252.

Various usages can be considered for the count period control signal SEL. For example, a usage of uniformly controlling the effective count operation periods of the counter units 254 of the entire columns, a usage of grouping the vertical columns into several groups (generally two groups) and controlling the effective count operation periods by the groups, or a usage of controlling the effective count operation period depending on the level of the pixel signal voltage Vx can be considered.

The count phase adjuster 260 logically inverts (in an inverted phase) the comparison pulse COMP from the voltage comparator 252 and outputs the result as a count enable signal EN to the counter unit 254, or outputs the comparison pulse COMP as the count enable signal EN to the counter unit 254 without any change (in a non-inverted phase), on the basis of the count period control signal SEL from the communication timing controller 20 or the comparison result (referred to a phase adjustment control signal) of the pixel signal voltage Vx and the reference signal SLP_ADC of the voltage comparator 252 (a comparator separate from the voltage comparator 252 may be used) of the previous column or the present column. The count phase adjuster 260 is an example of the count period controller determining to perform a real number count operation or a complement number count operation (in other words, determining the count period).

For example, by using an EX-OR (exclusive OR) gate 262 as the count phase adjuster 260, the comparison pulse COMP is input to the input terminal IN1 and the phase adjustment control signal is input to the input terminal IN2. In this case, the EX-OR gate 262 logically inverts the comparison pulse COMP to generate the count enable signal EN when the phase adjustment control signal is at the H level, and uses the comparison pulse COMP as the count enable signal EN without any change when the phase adjustment control signal is at the L level.

In the column AD conversion process of this configuration example, the voltage comparator 252 disposed every column is supplied with the reference signal SLP_ADC from the DA conversion circuit 27a, and the pixel signal voltage Vx to be processed by the voltage comparators 252 is subjected to the comparison process using the common reference signal SLP_ADC. The counter unit 254 performs a count process using the output of the count phase adjuster 260 as the count enable signal EN on the basis of the count clock CK_CNT when the count enable signal EN is at the H level, and stores the count result at the time of end of the count process.

The count phase adjusters 260 or the counter units 254 of the AD converters 25b are supplied from the communication timing controller 20 with a control signal CN5 for indicating whether the counter units 254 should perform two count processes in a down-count mode or an up-count mode or other control information on setting the initial value Dini in the first count process or the reset process, in addition to the count period control signal SEL.

The step-shaped reference signal SLP_ADC generated by the reference signal generator 27 is input to one input terminal RAMP of the voltage comparator 252 in common to the input terminals RAMP of other voltage comparators 252. The other input terminal is connected to the vertical signal line 19 of the corresponding vertical column and the pixel signal voltage from the pixel array unit 10 is input thereto. The output signal (comparison pulse COMP) of the voltage comparator 252 is supplied to the count phase adjuster 260.

The count clock CK_CNT is input to the clock terminal CK of the counter unit 254 from the communication timing controller 20 in common to the clock terminals CK of other counter units 254. Although the configuration thereof is not shown in the drawings, the counter unit 254 can be embodied by changing the wiring type of the data storage including latches to a synchronous counter type, and performs an internal count process with the input of one count clock CK_CNT.

When a down-count operation and an up-count operation are switched in two count processes for acquiring the digital data Dsig of the signal component Vsig of one pixel, it is preferable that an updown counter switching the down-count operation and the up-count operation is used for the counter unit 254.

On the other hand, when only one of the down-count operation and the up-count operation is performed in two count processes, one of the up counter and the down counter corresponding to the operation is used. However, in principle, the updown counter switching the down-count operation and the up-count operation may be made to perform only one of the down-count operation and the up-count operation. In general, the updown counter requires a circuit configuration for switching the mode and has a great circuit scale in comparison with the configuration employing a single count mode of the up counter or the down counter. Accordingly, when only one operation is performed, it is preferable that the updown counter is not employed.

It is preferable that an asynchronous counter outputting the count value without being synchronized with the count clock CK_CNT is used as the counter unit 254. Basically, a synchronous counter may be employed, but the operations of all flip flops (basic element of a counter) in the synchronous counter are limited by the count clock CK_CNT. Accordingly, when a higher-frequency operation is required, the operation limiting frequency is determined by only the limit frequency of the first flip flop (basic element of the counter) and thus it is preferable that the asynchronous counter suitable for a high-speed operation is used as the counter unit 254. This is because the synchronization of clocks is not required and thus the clock speed is not hindered.

A control pulse is input to the counter unit 254 from the horizontal scanner 12 through the control line 12c. The counter unit 254 has a latch function of latching the count result and stores the counter output value until an instruction is given using the control pulse through the control line 12c.

On the output sides of the AD converters 25b, for example, the outputs of the counter unit 254 can be connected to the horizontal signal line 18. Alternatively, as shown in FIG. 1, the data storage and transmission output unit 256 as a memory unit storing the count result latched in the counter unit 254 may be disposed at the stage subsequent to the counter unit 254.

The output of the data storage and transmission output unit 256 is connected to the horizontal signal line 18. The horizontal signal line 18 has a signal line corresponding to the bit width of n or 2n which is a bit width of the column AD circuit 25, and is connected to the output circuit 28 through n or 2n sense circuits corresponding to the output lines not shown. Of course, as described above, the digital calculator 29 may be disposed at the stage before or after the output circuit 28 as needed.

Here, in view of the effective count operation period, the reference signal comparing AD conversion process is roughly divided into a first-half count operation of which the count start point is a variation start point of the reference signal SLP_ADC and the count end point is a time point when the reference signal SLP_ADC is equal to the processing signal voltage and a second-half count operation of which the count start point is a the time point when the reference signal SLP_ADC is equal to the processing signal voltage and the count end point is a time point when the count number reaches a desired count number of the present time (generally, a time point when the maximum AD conversion period expires).

In this specification, the count operation performed during the first-half period from the time point when the reference signal SLP_ADC starts its variation to the time point when the reference signal SLP_ADC is equal to the pixel signal voltage Vx is called a real number count operation. On the other hand, the count operation performed during the second-half period from the time point when the reference signal SLP_ADC is equal to the pixel signal voltage Vx to the time point when the maximum AD conversion period expires is called a complement number count operation.

In view of the count mode, the count process can be roughly divided depending on the up-count mode or the down-count mode.

The pixel signal So (pixel signal voltage Vx) output from the vertical signal lines 19 is of a time-series type, where the signal level Ssig appears after the reset level Srst including noise of the pixel signal as a reference level. A process on the reference level (reset level Srst which is substantially equivalent to the reset level Srst) is called a precharge-phase process (may be abbreviated as P-phase process) or a reset counter period process. A process on the signal level Ssig is called a data-phase process (may be abbreviated as D-phase process) or a data counter period process. When the D-phase process is performed after the P-phase process, the D-phase process is a process on the signal level Ssig in which the signal component Vsig is added to the reset level Srst.

In the first configuration example, since the counter unit 254 is disposed every vertical column, various methods can be used to perform the CDS function along with the AD conversion in the reference signal comparing AD conversion by columns, by combinations of the first-half count operation and the second-half count operation, the count mode (up-count mode or down-count mode), and the P-phase process and the D-phase process.

On the other hand, as shown in FIG. 2B, in a second configuration example for performing the reference signal comparing AD conversion, similarly to the reference signal generator 27, the counter units 254 are used in common to the vertical columns. The column AD circuit 25 includes a voltage comparator 252 and a data storage and transmission output unit 256. The counter unit 254 continuously performs the up-count operation (or the down-count operation) during the maximum AD conversion period corresponding to the slope period of the reference signal SLP_ADC in the P-phase and D-phase processes. The bit count data (also referred to as count clock) CK0, . . . , CKn−1 are supplied to the data storage and transmission output unit 256 of each vertical column. The data storage and transmission output unit 256 of each vertical column acquires and stores the count data of the counter unit 254 when the comparison output COMP of the voltage comparator 252 in the corresponding column is inverted.

The counter unit 254 of this example includes a counter counting the count clock CK_CNT to generate count data (count value) with the variation of the reference signal SLP_ADC with respect to time. The data storage and transmission output unit 256 has a function of a data storage (count value storage) storing the count data corresponding to the pixel signal voltage Vx out of the count data generated by the counter.

The data storage and transmission output unit 256 stores the data Dp (indicating Drst) and Dd (indicating Drst+Dsig) acquired in the P-phase and D-phase processes in different storages. The data storage and transmission output unit transmits the data Dp and Dd acquired in the P-phase and D-phase processes to the digital calculator 29 through the different horizontal signal lines 18 under the control of the horizontal scanner 12. The digital calculator 29 acquires the digital data Dsig of the signal component Vsig by calculating the difference between the data Dp and Dd.

In any example or processing method, in principle, the AD conversion process is performed by supplying a ramp-like reference signal SLP_ADC to the comparator (voltage comparator), comparing the reference signal SLP_ADC with the analog pixel signal voltage Vx input through the vertical signal line 19, and starting the count operation with the clock signal when the effective count operation period is started to count the number clocks during the designated effective count operation period.

In any example or processing method, at the time of performing the P-phase process, the reset component Vrst of the unit pixel 3 is read and the reset level Srst of the pixel signal voltage Vx is processed. The reset component Vrst includes uneven noise as an offset every unit pixel 3. However, since the unevenness of the reset component Vrst is generally small and the reset level Vrst is common to the entire pixels, the output value (=reset level Srst) of the reset component Vrst in the pixel signal voltage Vx of any vertical signal line 19 is substantially known. Accordingly, at the time of performing the P-phase process, the comparison period can be shortened by adjusting the reference signal SLP_ADC. For example, the maximum count number Drm (=the maximum value of the AD conversion result of the reset level Srst) at the time of performing the P-phase process is a count number (128 clocks) corresponding to 7 bits.

On the other hand, at the time of performing the D-phase process, the signal component Vsig corresponding to the incident light intensity every unit pixel 3 is read and the signal level Ssig including the signal component Vsig is processed, in addition to the reset level Srst. Accordingly, at the time of performing the D-phase, since the signal component Vsig corresponding to the incident light intensity is read, the comparison period is taken as being wide to greatly vary the reference signal SLP_ADC supplied to the voltage comparator 252 so as to determine the largeness and smallness of the light intensity in a wide range. For example, the maximum count number Dsm' of the comparison process of the D-phase process is set to a value obtained by adding the maximum count number Drm of the P-phase process to the maximum value of the AD conversion result of the signal component Vsig, that is, the maximum count number Dsm corresponding to the maximum signal component Vsig. The maximum count number Dsm is, for example, in the range of the 10-bit count number (1024 clocks) to the 12-bit count number (4096 clocks). The maximum period of the comparison process on the reset level Srst is made to be shorter than the maximum period of the comparison process on the signal level Ssig. By not setting both periods to be equal but setting both periods in this way, the total AD conversion period of two conversion processes is shortened.

Operation of Solid-State Imaging Device

Operation of First Processing Example

FIG. 3A is a timing diagram illustrating an operation of a first process example of the reference signal comparing AD conversion. An application of the first process example employs the first configuration example shown in FIG. 2A as the circuit configuration.

When the column AD circuit 25 performs the difference process between the reset level and the signal level during the effective count operation period in the reference signal comparing AD conversion, for example, the first process example in which the count start point is a time point when the reference signal SLP_ADC starts its variation and the count end point is a time point when the reference signal SLP_ADC is equal to the processing signal voltage can be used in all the two processes. That is, in the first process example, the first-half count operation (real number count operation) is performed during the effective AD conversion period (the maximum AD conversion period of each phase) in all the two processes. As long as it is not particularly described, it is assumed that the slope of the reference signal SLP_ADC is constant in the respective processes.

In this case, in two count processes for acquiring the digital data Dsig of the signal component Vsig of one pixel, the counter unit 254 is switched to perform the down-count operation and the up-count operation. In the entire operation, the up-count operation in the D-phase process may be considered as an operation of counting a positive integer (positive number) for the signal level Ssig with and the down-count operation in the D-phase process may be considered as an operation of counting a negative integer (negative number) for the signal level Ssig.

Although detailed description is omitted, for example, the same technique as described in JP-A-2005-311933 or JP-A-2006-33452 is basically used. In the AD conversion process called the general reference signal comparing type, first, at the time of performing the first process on the respective vertical columns H1 to Hh in any processing row Vx, that is, in the P-phase process period as the AD conversion period of the reset level Srst, the count values of the flip flops of the counter unit 254 are reset to the minimum value min of the P-phase maximum AD conversion gray-scale, for example, "0". Then, the P-phase level AD conversion is performed by setting the counter unit 254 to the down-count mode and performing the P-phase level comparison process of the voltage comparator 252 on the reference signal SLP_ADC and the pixel signal voltage Vx and the count process of the counter unit 254 in parallel. Initially, it is assumed that the reference signal SLP_ADC is higher than the P-phase level of the pixel signal voltage Vx and the comparison output COMP of the voltage comparator 252 is at the H level. At the time point when the reference signal SLP_ADC is equal to the reset level Srst as the P-phase level after starting the comparison process, the comparison output COMP of the voltage comparator 252 is changed from the H level to the L level, and a count value indicating the digital value Drst corresponding to the magnitude of the reset level Srst (indicating –Drst with the addition of a sign) is stored in the counter unit 254.

At the second process, that is, during the D-phase process period as the AD conversion period on the signal level Ssig, the signal component Vsig corresponding to the incident light intensity of each unit pixel 3 is read in addition to the reset level Srst and the same operation as the P-phase reading operation is performed. First, the D-phase level AD conversion is performed by setting the counter unit 254 to the up-count mode opposite to the P-phase process and allowing performing the D-phase level comparison process of the voltage comparator 252 on the reference signal SLP_ADC and the pixel signal voltage Vx and the count process of the counter unit 254 in parallel. Initially, it is assumed that the reference signal SLP_ADC is higher than the D-phase level of the pixel signal voltage Vx and the comparison output COMP of the voltage comparator 252 is at the H level. At the time point when the reference signal SLP_ADC is equal to the signal level Ssig as the D-phase level after starting the comparison process, the comparison output COMP of the voltage comparator 252 is changed from the H level to the L level, and at this time, a count value corresponding to the magnitude of the signal level Ssig is stored in the counter unit 254.

At this time, opposite to the P phase, the up-count operation is performed from the digital value Drst (which is a negative value) of the reset level Srst of the pixel signal voltage Vx acquired by the P-phase and the AD conversion. Since the signal level Ssig is a level obtained by adding the signal component Vsig to the reset level Srst, the count value as the AD conversion result of the signal level Ssig is basically "Drst+Dsig". However, since the start point of the up-count operation is "−Drst" as the AD conversion result of the reset level Srst, the count value actually stored in the counter unit 254 is "−Drst+(Dsig+Drst)=Dsig."

That is, since the count operation of the counter unit 254 is performed in the down-count mode for the P-phase process and in the up-count mode for the D-phase process, the difference process (subtraction process) between the count number "−Drst" as the AD conversion result of the reset level Srst and the counter number "Drst+Dsig" as the AD conversion result of the signal level Ssig is automatically performed in the counter unit 254 and the count number Dsig stored in the counter unit 254 as the different process result indicates the digital data corresponding to the signal component Vsig.

As described above, the reset level Srst including the unevenness of each unit pixel 3 can be removed by the difference process in the counter unit 254 using twice reading and count processes of the down-count operation at the time of the P-phase process and the up-count operation at the time of the D-phase process, and the AD conversion result of only the signal component Vsig corresponding to the incident light intensity of each unit pixel 3 can be acquired with a simple configuration. Accordingly, the column AD circuit 25 serves as the CDS process functional unit as well as the digital converter converting an analog pixel signal into digital pixel data.

In the AD conversion process of the first process example, since the P phase is subjected to the down-count process and the D phase is subjected to the up-count process by the first count process and the second count process on one pixel signal, the P phase is subjected to the complement number count process and the D phase is subjected to the real number count process. Actually, the complement number count process is a negative count process and a subtraction factor. The real number count process is a positive count process and an addition factor.

In application of the first process example, the down-count operation and the up-count operation are switched in two count processes for acquiring the digital data Dsig of the pixel signal component Vsig. Accordingly, the updown counter switching the down-count operation and the up-count operation is preferably used as the counter unit 254.

When the data storage and transmission output unit 256 is disposed at the stage subsequent to the counter unit 254, a sub clock DLAT as the memory transmission instructing pulse CN8 from the communication timing controller 20 is supplied to the data storage and transmission output unit 256 before starting the operation of the counter unit 254 or the horizontal transmission. The data storage and transmission output unit 256 stores the digital data Dsig of the previous row Vx-1 stored in the counter unit 254 in the internal latch circuit using the sub clock DLAT as a trigger.

That is, after the AD conversion period expires, the digital data Dsig in the counter unit 254 is transferred to the data storage and transmission output unit 256 and the column AD circuit 25 starts the AD conversion of the subsequent row Vx. The digital data Dsig of the previous row in the data storage and transmission output unit 256 is sequentially selected by the horizontal scanner 12 after the AD conversion process by the column AD circuit 25 of each vertical column of the column processor 26, and then is transmitted to the output circuit 28 through the horizontal signal line 18 for transmitting information. Thereafter, the same operation is sequentially repeated every row, thereby generating a two-dimensional image.

Here, the example where the P-phase process is performed in the down count mode and the D-phase process is performed in the up count mode is described. On the contrary, although not shown, the P-phase process may be performed in the up count mode and the D-phase process may be performed in the down count mode. In this case, the data stored in the counter unit 254 after the D-phase process is a negative value of Dsig.

The AD conversion process of the first process example is characterized in that the P phase is subjected to the negative count process and the D phase is subjected to the positive count process by performing the real number count operation in both the first count process and the second count process on one pixel, performing the down count process on the P phase, and performing the up count process on the D phase. The negative count process result can be considered as a subtraction factor and the positive count process result can be considered as an addition factor. For example, by changing the slope of the reference signal SLP_ADC, the coefficient can be set properly. By combining the up count process on the P phase and the down count process on the D phase in consideration of the characteristic, it is possible to acquire the digital data as the product sum calculation result of the plural pixels. Here, the structure for acquiring the digital data of the product sum calculation of the plural pixels using the first process example will not be described.

Operation of Solid-State Imaging Device

Operation of Second Processing Example

Figure 3B:
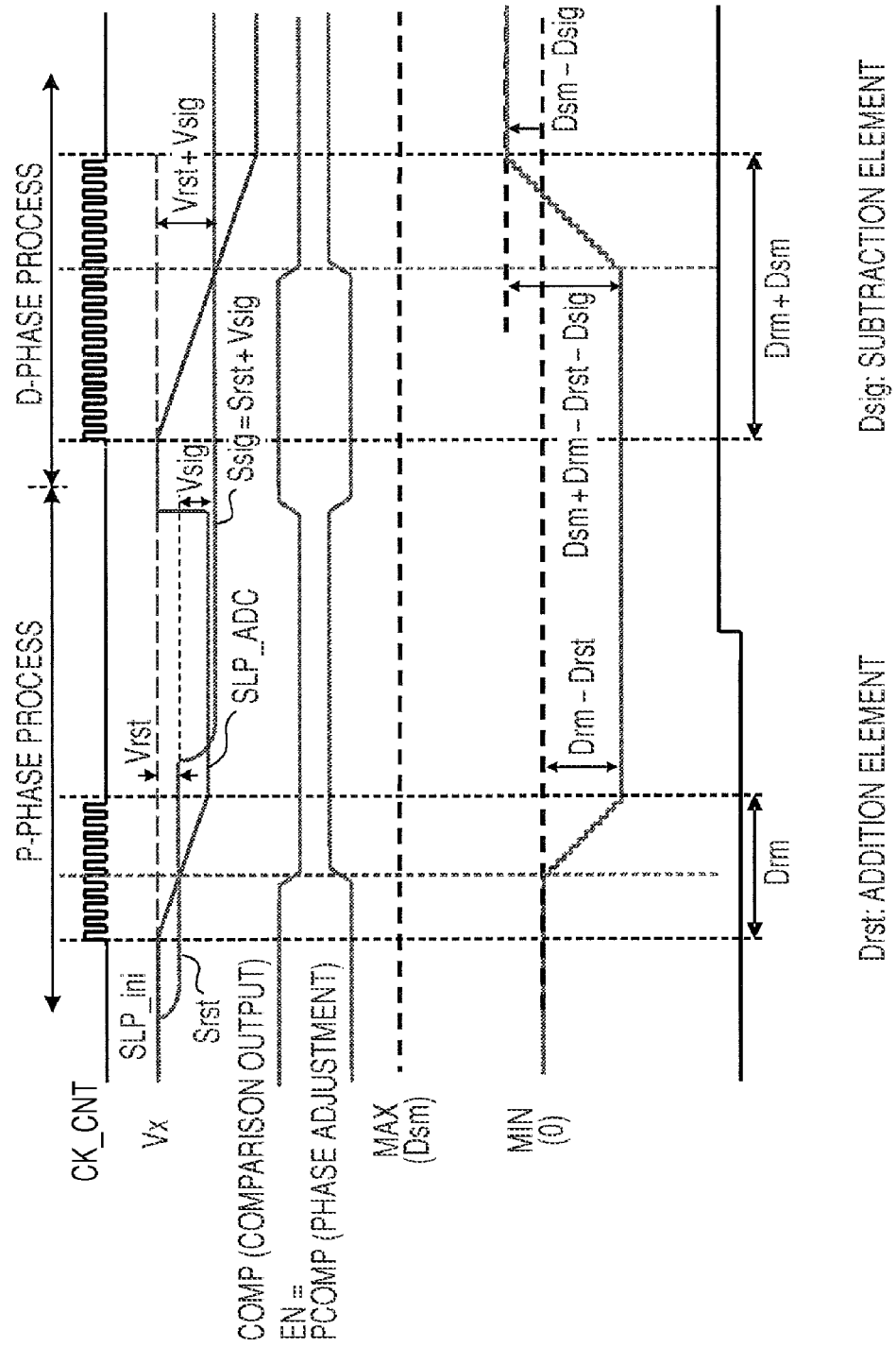
FIG. 3B is a timing diagram illustrating an operation of a second process example of the reference signal comparison type AD conversion operation.

FIG. 3B is a timing diagram illustrating an operation of a second process example of the reference signal comparing AD conversion. When the column AD circuit 25 performs the difference process between the reset level and the signal level, for example, the second process example in which the count start point is a time point when the reference signal SLP_ADC is equal to the processing signal voltage and the count end point is a time point when the count number reaches the desired count number (generally, a time point when the maximum AD conversion period expires) may be employed in both the two processes. That is, in the second process example, the second-half count operation (complement number count operation) is performed in both the two processes.

In this case, in the two count processes for acquiring the digital data Dsig of the signal component Vsig of one pixel, the counter unit 254 is switched to perform the down-count operation and the up-count operation every vertical column. Accordingly, the first configuration example shown in FIG. 2A is employed as the circuit configuration in the application of the second process example.

The basic operation of the second process example is not greatly different from that of the first process example, but they are different from each other in that the correction of data corresponding to performing the count process in the second half of the maximum AD conversion period is considered. That is, the entire operation of the second process example may be considered as an operation of counting a complement number. In this case, since the complement number is counted, a data correcting structure for making the final data the real number is required. In the data correcting structure, the countermeasure may be taken using the initial value of the first count process, or the countermeasure may be taken using the digital calculation of the digital calculator 29 by allowing the digital calculator 29 to serve as the corrector. When the initial value is changed, the communication timing controller 20 is made to serve as the corrector and the setting of the initial value is performed by the communication timing controller 20.

The reason for considering the correction of data is as follows. First, it is assumed that the maximum count number in the P-phase process is Drm and the maximum count number corresponding to the maximum signal component Vsig in the D-phase process is Dsm'=Drm+Dsm. Dsm represents the maximum digital data of the signal component Vsig. In this case, the maximum count number in the D-phase process is "Drm+Dsm." When the count process is performed in the second half after the reference signal SLP_ADC is equal to the pixel signal voltage Vx and the comparison output COMP is inverted during the maximum AD conversion period of the respective images, the count value Dp of the P phase is "Drm−Drst" when the count value of the reset level Srst is Drst, and the count value Dd of the D phase is "(Drm+Dsm)−(Drst+Dsig)" when the count value of the signal level Ssig is Dsig.

Here, when the P-phase process is performed in the up count mode, the D-phase process is performed in the down count mode, the P-phase process is started from "0", and the D-phase process is started from the count value obtained by the P-phase process, the data after the D-phase process is (Drm−Drst)−{(Drm+Dsm)−(Drst+Dsig)}=Dsig−Dsm. In order to cancel "−Dsm" to obtain the digital data Dsig of the signal component Vsig, for example, the initial value Dini of the first P-phase process can be set to Dsm or Dsm may be added to "Dsig−Dsm" by the digital calculator 29.

In the combination of the count modes, since the complement number count operation on the signal level Ssig in the second half of the AD conversion period is performed in the down count mode, Dsig can be obtained as a positive value by combining the negative counting characteristic of the complement number count operation and the negative counting characteristic of the down count process. "Dsig−Dsm" indicates that. In this case, depending on the setting of the first initial value, the digital data Dsig can be acquired just after the second process.

On the other hand, when the P-phase process is performed in the down count mode, the D-phase process is performed in the up count mode, and the D-phase process is started from the count value obtained by the P-phase process, the data after the D-phase process is {(Drm+Dsm)−(Drst+Dsig)}−(Drm−Drst)=Dsm−Dsig. In order to cancel Dsm' to obtain the negative number of the digital data Dsig of the signal component Vsig, for example, the initial value Dini of the first P-phase process can be set to "−Dsm" or Dsm may be subtracted from "Dsm−Dsig" by the digital calculator 29. In order to return the negative number "−Dsig" of the digital data Dsig to the positive number, for example, the inverted bit data can be output from the data storage and transmission output unit 256 or the bit data can be inverted by the digital calculator 29. However, since the difference of "1" is accurately generated only by the inversion of the bit data, the digital calculator 29 can add "1" thereto to obtain the accurate data. Alternatively, by allowing the digital calculator 29 to perform an operation of {Dsm−(Dsm−Dsig)}, the digital data Dsig may be acquired.

In the combination of the count modes, since the complement number count operation on the signal level Ssig in the second half of the AD conversion period is performed in the up count mode, Dsig can be obtained as a negative value by combining the negative counting characteristic of the complement number count operation and the positive counting characteristic of the up count process. "Dsm−Dsig" indicates that.

An operation of the second process example of the reference signal comparing AD conversion will be described with reference to FIG. 3B. First, during the Drm count period prepared as the P-phase process period, the comparison of the reference signal SLP_ADC with the pixel signal voltage Vx is performed by the voltage comparator 252, the comparison output COMP of the voltage comparator 252 is inverted at the time point (after the Drst clocks pass) when the reference signal SLP_ADC is equal to the reset level Srst of the pixel signal voltage Vx, and the count enable signal EN (=comparison output PCOMP adjusted in phase) is inverted (where COMP and PCOMP are opposite to each other in phase). At this time, the counter unit 254 starts the down count operation from the initial value Dini and stops the count operation in the Drm clocks after the P-phase process period. Accordingly, since the counter unit 254 down-counts the "Drm−Drst" clocks, it stores "Dini−(Drm−Drst)" after the end of the P-phase process. When the initial value Dini is the gray scale min value="0", the counter unit 254 stores "−(Drm−Drst)."

Next, during the Dsm' count period prepared as the D-phase process period, the comparison of the reference signal SLP_ADC with the pixel signal voltage Vx is performed by the voltage comparator 252, the comparison output COMP of the voltage comparator 252 is inverted at the time point (after the Drst+Dsig clocks elapse) when the reference signal SLP_ADC is equal to the signal level Ssig of the pixel signal voltage Vx, and the count enable signal EN is inverted (where COMP and PCOMP are opposite to each other in phase). At this time, the counter unit 254 starts the up count operation and stops the count operation in the Dsm'=Drm+Dsm clocks after the D-phase process period.

Accordingly, the counter unit 254 counts up the "Dsm'−(Drst+Dsig)" clocks. At this time, since the up count process is performed from the count value "Dini−(Drm−Drst)" obtained from the P-phase process, the counter unit 254 stores Dini−(Drm−Drst)+(Dsm'−(Drst+Dsig))=Dini−(Drm−Drst)+(Drm+Dsm)−(Drst+Dsig)=Dini+Dsm−Dsig. The data Dout of the count value "Dini+Dsm−Dsig" is transmitted to the digital calculator 29.

The digital calculator 29 corrects the maximum count number Dsm corresponding to the maximum value of the signal data Dsig and the initial value Dini. That is, the digital calculator 29 performs the data correction accompanied with the complement number count operation on the pixel data having been subjected to the complement number count operation. For example, as shown in the drawing, when the initial value Dini is the minimum gray scale value="0", the counter unit 254 stores "Dsm−Dsig" and transmits the data as the data Dout to the digital calculator 29. Accordingly, the digital calculator 29 can acquire the final signal data Dsig from Dsm−(Dsm−Dsig) by subtracting the data Dout from the maximum count number Dsm corresponding to the maximum value of the signal data Dsig.

Here, the example where the P-phase process is performed in the down count mode and the D-phase process is performed in the up count mode has been described. However, although not shown, on the contrary, the P-phase process may be performed in the up count mode and the D-phase process may be performed in the down count mode. In this case, the data stored in the counter unit 254 after the D-phase process is "Dini−Dsm+Dsig" and the AD conversion data Dsig of the signal component Vsig is a positive number. As described above, in order to cancel "−Dsm" to obtain the digital data Dsig of the signal component Vsig, for example, the initial value Dini in the P-phase process is set to Dsm, or the digital calculator 29 can add Dsm to "Dsig−Dsm" when the initial value Dini is "0."

In the AD conversion process of the second process example, the complement number count operation is performed in both the first count process and the second count process on one pixel, the negative count process is performed in one process, and the positive count process is performed in the other process. The complement number count operation can be considered substantially as the negative count process. When the complement number count operation is performed in the negative direction, the process result thereof can be considered as an addition factor. When the complement number count operation is performed in the positive direction, the process result thereof can be considered as the subtraction factor. For example, by properly changing the slope of the reference signal SLP_ADC, the coefficient can be properly set. By combining the up count process and the down count process in consideration of the characteristic, it is possible to acquire the digital data as the product sum calculation result of the plural pixels. However, the treatment of the initial value Dini corresponding to the complement number count operation should be noted as the characteristic of the second process example. Here, the structure for acquiring the digital data of the product sum calculation of the plural pixels using the second process example will not be described.

Operation of Solid-State Imaging Device

Operation of Third Processing Example

FIGS. 3C and 3D are timing diagrams illustrating an operation of a third process example of the reference signal comparing AD conversion. Here, FIG. 3C shows a first example of the principle and FIG. 3D shows a second example of the principle.

When the reference signal comparing AD conversion scheme is employed, the third example has a structure in which the difference processing function can be performed along with the AD conversion while suppressing the increase in area of the counter unit 254.

The circuit configuration employs the structure in which the count operation is performed in the same count mode at the time of the first and second AD conversion processes and the count phases thereof are changed, without employing the count mode changing structure. Similarly to the first process example or the second process example, the count process is started from the result of the first count process at the time of the second count process.

In the third process example, since the count mode need not be switched, the first configuration example shown in FIG. 2A or the second configuration example shown in FIG. 2B can be employed as the circuit configuration.

Here, "different count phases are used" means that the count process period is different between the first AD conversion process (for example, the P-phase process) and the second AD conversion process (for example, the D-phase process) More specifically, the difference between the count process performed during the period of time from the time point when the reference signal SLP_ADC starts its variation to the time point when the reference signal SLP_ADC is equal to the pixel signal voltage Vx and the count process performed during the period of time from the time point when the reference signal SLP_ADC is equal to the pixel signal voltage Vx to the time point when the maximum AD conversion period expires (the time point when the reference signal SLP_ADC stops its variation) means the difference in count phase.

That is, in the two count processes, the real number count process as the first-half count operation and the complement number count process as the second-half count operation are combined using as a reference the time point when the comparison output COMP is inverted.

In general, the period of time from the time point when the reference signal SLP_ADC starts its variation to the time point when the reference signal SLP_ADC is equal to the pixel signal voltage Vx and the period of time from the time point when the reference signal SLP_ADC is equal to the pixel signal voltage Vx to the time point when the maximum AD conversion period expires correspond to the output level of the comparison pulse COMP output from the voltage comparator 252. Accordingly, it can be determined whether the count process should be performed during the period when the comparison pulse COMP is at the L level or the period when the comparison pulse is at the H level.

In addition, in order to acquire the difference process result as the two count processes in the third process example, in a first scheme, at the time of starting the first count process, a sign (positive or negative) corresponding to the count mode is attached to the count value corresponding to the maximum AD conversion period of the count process performed after the time point when the reference signal SLP_ADC is equal to the pixel signal voltage Vx to set the initial value Dini, and the count process is started from the initial value Dini. Alternatively, in a second scheme, similarly to the first process example, the count process is started from "0" and the digital calculator 29 at the stage subsequent to the counter unit 254 corrects the initial value Dini after the second count process is completed. The first scheme is suitable for a case where the initial value Dini need not be corrected at the stage subsequent to the counter unit 254 and the AD conversion process result of one pixel is desired. On the other hand, the second scheme is suitable for the case where the AD conversion process result of the product sum calculation of the signal components Vsig of plural pixels should be desired.

That is, in the third process example, when the other side is assigned to the count process of the signal level Ssig, the count process on the signal level Ssig may be considered as the complement number count operation. In this case, since the complement number is counted, the data correcting structure for acquiring the final data as the real number is required. In the data correcting structure, the countermeasure may be taken using the initial value of the first count process, or may be taken using the digital calculation of the digital calculator 29 as the subsequent circuit.

Principle

First Example

For example, in the first example shown in FIG. 3C, the up counter is used as the counter unit 254. At the time of performing the AD conversion process on the first reset level Srst as an example of the processing signal which is the subtraction factor, the count process is performed in the up count mode during the period of time from the time point when the reference signal Vslop is equal to the pixel signal voltage Vx (reset level Srst) to the time point when the reference signal Vslop reaches a predetermined final value, specifically, to the time point when the maximum AD conversion period expires. At the time of performing the AD conversion process on the second signal level Ssig as an example of the addition factor, the count process is performed in the up count mode during the period of time from the time point when the reference signal Vslop starts its variation from the initial value SLP_ini to the time point when the reference signal Vslop is equal to the pixel signal voltage Vx (the signal level Ssig).

In this case, as can be seen from the drawing, the count number (described as Drst_cnt) in the AD conversion process on the first reset level Srst is a value (=Drm−Drst) obtained from subtracting the count number Drst corresponding to the period of time from the time point when the reference signal Vslop starts its variation to the time point when the reference signal Vslop is equal to the pixel signal voltage Vx (reset level Srst) from the maximum count number Drm corresponding to the maximum AD conversion period on the reset level Srst. Accordingly, the count value D1 stored in the counter unit 254 after the first AD conversion process is expressed by Expression (1-1) shown in the drawing.

Here, when the initial value Dini of the first count process is set to the negative value of the maximum count number Drm corresponding to the maximum AD conversion period for the reset level Srst, the count value D1 stored in the counter unit 254 after the AD conversion process on the first reset level Srst is expressed by Expression (1-2) shown in the drawing.

In the first P-phase process, when the reset level Vrst of the pixel signal voltage Vx is sensed by the voltage comparator 252 and the count operation is performed by the counter unit 254, it could be seen that the reset level Vrst of the unit pixel 3 is read, the reset level Vrst is subjected to the AD conversion, and the digital data of the reset level Vrst can be stored as a negative value, by setting the initial value Dini to the negative number of the maximum count number Drm.

In order to read the reset level Vrst of the unit pixel 3, perform the AD conversion to the reset level Vrst, and store the digital data of the reset level Vrst as the negative value, the first count process should be performed in the mode different from the count mode of the second count process. However, the change of the count mode is not necessary by employing the operation principle of the first example.

At the time of performing the AD conversion process on the second signal level Ssig, the count process is started from the count value D1(=Dini+(Drm−Drst)=−Drst) stored in the counter unit 254 after the first AD conversion process in the same up count mode as the first process, and the count value when the reference signal Vslop is equal to the pixel signal voltage Vx (signal level Ssig) is stored. Since the count number (described as Dsig_cnt) in the AD conversion process on the second signal level Ssig corresponds to the combination of the reset level Srst and the signal component Vsig as can be seen from the drawing, and thus is "Drst+Dsig." Accordingly, the count value D2 stored in the counter unit 254 after the second AD conversion process is expressed by Expression (2) shown in the drawing.

As can be seen from Expression (2), the subtraction expression shown in the second row is to perform a subtraction process between the reset level Srst and the signal level Ssig. As can be guessed from this description, since the signal level Ssig is a level obtained by adding the signal component Vsig to the reset level Srst, the count number as the AD conversion result of the signal level Ssig is basically "Drst+Dsig", but the count value actually stored is "−Drst+(Dsig+Drst)=Dsig" by setting the start point of the second count process to "−Drst" as the AD conversion result of the reset level Srst.

That is, similarly to the operational principle of the first example, even when two count processes are performed in the same mode (the up count mode in this example) but the count phases thereof are different from each other and the initial value Dini of the first count process is set to the negative value of the maximum count number Drm of the first count process, the difference process (subtraction process) between the count number "−Drst" as the AD conversion result of the reset level Srst and the count number "Drst+Dsig" as the AD conversion result of the signal level Ssig is automatically performed in the counter unit 254 and the count number Dsig as the difference process result can be stored in the counter unit 254, thereby performing the CDS function and the AD conversion function on the signal component Vsig at the same time.

In the example, the initial value Dini is set to the negative value of the maximum count number Drm, but may be set to "0." In this case, the count value D2 stored in the counter unit 254 after the second count process is expressed by Expression (3) shown in the drawing, and is a value obtained by adding the maximum count number Drm to the digital value Dsig of the signal component Vsig.

The maximum count number Drm is a constant and can be externally adjusted by the communication timing controller 20. The value can be determined depending on the maximum AD conversion period of the reset level Srst. As can be seen therefrom, in acquiring the digital data as the product sum calculation of the plural processing signals, the communication timing controller 20 has a function of the corrector allowing the digital data as the product sum calculation result to be the count value (Drm in this example) corresponding to the period of time when the reference signal Vslop in the count process on the processing signal as the subtraction factor reaches the final value from the initial value Dini.

By disposing the digital calculator 29 at the stage subsequent to the counter unit 254 and performing the correcting operation (subtracting operation in this example) the countermeasure for the correction can be taken and the digital value Dsig of the signal component Vsig can be easily acquired. In this case, the digital calculator 29 has the corrector function. However, by setting the initial value Dini to the negative value of the maximum count number Drm, the value finally obtained from the two count processes indicates the positive signal component Vsig and thus only the digital data Dsig of the signal component Vsig of one pixel can be acquired. Accordingly, this configuration is friendly to the existing system.

Principle

Second Example

For example, in the second example shown in FIG. 3D, the down counter is used as the counter unit 254. At the time of performing the AD conversion process on the first reset level Srst as an example of the addition factor, the count process is performed in the down count mode during the period of time from the time point when the reference signal Vslop starts its variation from the initial value SLP_ini to the time point when the reference signal Vslop is equal to the pixel signal voltage Vx (reset level Srst). At the time of performing the AD conversion process on the second signal level Ssig as an example of the subtraction factor, the count process is performed in the down count mode during the period of time from the time point when the reference signal Vslop is equal to the pixel signal voltage Vx (signal level Ssig) to the time point when the reference signal Vslop reaches a predetermined final value, specifically, to the time point when the maximum AD conversion period expires.

In this case, the count number Drst_cnt in the AD conversion process on the first reset level Srst is the digital value Drst of the reset level Srst. Accordingly, in consideration of the down count mode, the count value D1 stored in the counter unit 254 after the first AD conversion process is expressed by Expression (4) shown in the drawing.

In this example, the first reset level Srst is an example of the addition factor, but the subtraction process is substantially performed by the combination of the down count mode in which the count operation is performed in the negative direction, and thus can be changed to the subtraction factor after the AD conversion, as shown in the first row of Expression (5-1) shown in the drawings.

At the time of performing the AD conversion process on the second signal level Ssig, the count process is started in the same down count mode as the first process from the count number "Dini-Drst" stored in the counter unit 254 after the first AD conversion process from the time point when the reference signal Vslop is equal to the pixel signal voltage Vx (signal level Ssig), the count process is stopped when the maximum AD conversion period expires, and then the count value at that time is stored in the counter unit 254.

As can be seen from the drawing, the count number Dsig_cnt in the AD conversion process on the second signal level Ssig is a value (=Dsm'−(Drst+Dsig)) obtained by subtracting the count number "Drst+Dsig" corresponding to the period of time from the time point when the reference signal Vslop starts its variation to the time point when the reference signal Vslop is equal to the pixel signal voltage Vx (signal level Ssig) from the maximum count number Dsm' corresponding to the maximum Ad conversion period on the signal level Ssig. Accordingly, in consideration of the down count mode, the count value D2 stored in the counter unit 254 after the second AD conversion process is expressed by Expression (5-1) shown in the drawing.

In this example, the second signal level Ssig is an example of the subtraction factor, but the subtraction process is substantially performed by the combination of the down count mode in which the count operation is performed in the negative direction, and thus can be changed to the addition factor by the combination of the subtraction factor and the subtraction process after the AD conversion, as shown in the first row of Expression (5-1) shown in the drawings.

As can be seen from Expression (5-1), the subtraction expression shown in the second row includes the same component as the subtraction expression shown in the second row of Expression (2) and the subtraction process is performed between the reset level Srst and the signal level Ssig. As the difference from Expression (2), the component of "Dini−Dsm'" exists, but the digital data Dsig corresponding to the signal component Vsig can be acquired by the two count processes in the up count mode on the reset level Srst and the signal level Ssig.

Here, when the initial value Dini of the first count process is set to the maximum count number Dsm' corresponding to the maximum AD conversion period for the signal level Ssig, the count value D2 stored in the counter unit 254 after the AD conversion process on the second signal level Ssig is expressed by Expression (5-2). Similarly to the operational principle of the first example, the count value actually stored can be made to be "Dsig."

That is, similarly to the operational principle of the second example, even when two count processes are performed in the same mode (the down count mode in this example) but the count phases thereof are different from each other and the initial value Dini of the first count process is set to the positive value of the maximum count number Dsm' of the second count process, the difference process (subtraction process) between the count number "−Drst" as the AD conversion result of the reset level Srst and the count number "Drst+Dsig" as the AD conversion result of the signal level Ssig is automatically performed in the counter unit 254 and the count number Dsig as the difference process result can be stored in the counter unit 254, thereby performing the CDS function and the AD conversion function on the signal component Vsig at the same time similarly to the operational principle of the first example. When a structure corresponding to the operational principle of the second example is employed, the switching of the count mode is not necessary.

In the operational principle of the first example, the complement number count process is performed in the up count mode on the reset level Srst, the real number count process is performed in the up count mode on the signal level Ssig, and the initial value Dini is set to the negative value of the maximum count number Drm of the complement number count process, whereby the count value actually stored is "Dsig." On the contrary, in the operational principle of the second example, the real number count process is performed in the down count mode on the reset level Srst, the complement number count process is performed in the down count mode on the signal level Ssig, and the initial value Dini is set to the positive value of the maximum count number Dsm' of the complement number count process, whereby the count value actually stored is "Dsig."

The up count mode or the down count mode is set depending on the first process or the second process in which the complement number count process should be performed, the initial value Dini is set to the value corresponding to the maximum count number Dsm' of the complement number count process, and the positive or negative is set depending on the count mode. Accordingly, the operational principles of the first example and the second example are not greatly different in basic structure from each other.

That is, the count value stored in the counter unit 254 after the second count process is "Dini+(Drm−Drst)+(Drst+Dsig)=Dini+Drm+Dsig" in the operational principle of the first example and "Dini−Dsm'+Dsig" in the operational principle of the second example. In any case, the count value is a value obtained by adding the adjusted value ("Dini+Drm" in the first example and "Dini−Dsm'" in the second example) of the initial value Dini and the maximum count number Drm and Dsm' to the digital value Dsig of the signal component Vsig.

In the example, the initial value Dini is set to the maximum count number Dsm', but may be set to "0." In this case, the count value stored in the counter unit 254 after the second count process is "Dini−Dsm'+Dsig=−Dsm'+Dsig", and is a value obtained by subtracting the maximum count number Dsm' from the digital value Dsig of the signal component Vsig. The maximum count number Dsm' is a constant and can be externally adjusted by the communication timing controller 20. The value can be determined depending on the maximum AD conversion period of the signal level Ssig. Accordingly, for example, by disposing the digital calculator 29 at the stage subsequent to the counter unit 254 and performing the correcting operation (adding operation in this example), the countermeasure for the correction can be taken and the digital value Dsig of the signal component Vsig can be easily acquired. In this case, the digital calculator 29 has the corrector function. However, by allowing the communication timing controller 20 to have the corrector function and setting the initial value Dini to the maximum count number Dsm', the value finally obtained from the two count processes indicates the positive signal component Vsig and thus only the digital data Dsig of the signal component Vsig of one pixel can be acquired. Accordingly, this configuration is friendly to the existing system.

Operation of Solid-State Imaging Device

Operation of Fourth Processing Example

FIG. 3E is a timing diagram illustrating an operation of the fourth process example of the reference signal comparing AD conversion.

The fourth process example corresponds to the case where the difference process between the reset level and the signal level is performed at the stage (for example, the digital calculator 29) subsequent to the column AD circuit 25.

In this case, only one of the down count operation and the up count operation is performed, and in all the two processes, the count start point is the time point when the reference signal SLP_ADC starts its variation and the count end point is the time point when the reference signal SLP_ADC is equal to the processing signal voltage, or the count start point is the time point when the reference signal SLP_ADC is equal to the processing signal voltage and the count end point is the time point when the count number reaches the desired count number (generally, the time point when the maximum AD conversion period expires).

In the fourth process example, since the count mode need not be changed, the first configuration example shown in FIG. 2A or the second configuration example shown in FIG. 2B may be employed as the circuit configuration. When the first configuration example is employed, for example, both the counter unit 254 and the data storage and transmission output unit 256 store the data Dp and Dd acquired in the P-phase and D-phase processes in the different storages therein.

FIG. 3E shows the case where the second configuration example shown in FIG. 2B is employed. After the reading of the P-phase level (reset level Srst) of the vertical signal lines 19_1 to 19_h from the unit pixels 3 in a row Vx is stabilized, the reference signal generator 27 starts the temporal variation of the reference signal SLP_ADC to be supplied to the voltage comparators 252 of the columns, the counter unit 254 starts the up count operation, whereby the reference signal is compared with the reset level Srst by columns. When the reset level Srst is equal to the reference signal SLP_ADC, the comparison output COMP is inverted. Accordingly, at that time, the data storage and transmission output unit 256 receives and stores the count data in the storage (memory unit 1) for the P-phase data Dp.

After the reading of the D-phase level (signal level Ssig) is stabilized, the reference signal generator 27 starts the temporal variation of the reference signal SLP_ADC to be supplied to the voltage comparators 252 of the columns and the counter unit 254 starts the up count operation, whereby the reference signal is compared with the signal level Ssig by columns. When the signal level Ssig is equal to the reference signal SLP_ADC, the comparison output COMP is inverted. Accordingly, at that time, the data storage and transmission output unit 256 receives and stores the count data in the storage (memory unit 2) for the D-phase data Dd.

When the AD conversion period expires, the n-bit digital data Dp and Dd of the P phase and the D-phase stored in the data storage and transmission output unit 256 are sequentially transmitted to the digital calculator 29 through the n horizontal signal lines 18 under the control of the horizontal scanner 12. That is, the column AD circuit 25 outputs the count result as the output data on the reset level Srst and the output data on the signal level Ssig to the digital calculator 29. The digital calculator 29 acquires the AD converted data Dsig of the signal component Vsig by performing the difference process "Dd–Dp" using the output data Dp and Dd. Thereafter, by sequentially repeating the same operation every row, a two-dimensional image is generated.

Here, it has been described that the P-phase process and the D-phase process are both performed in the up count mode. Although not shown, on the contrary, the P-phase process and the D-phase process may be both performed in the down count mode. In this case, the data Dp stored in the counter unit 254 after the P-phase process is a positive value of the AD-converted data Drst of the reset level Srst and the data Dd stored in the count unit 254 after the D-phase process is a negative value of the AD-converted data Dsig of the signal component Vsig. The digital calculator 29 performs the different process of "–Dd+Dp" using the output data Dp and Dd of the respective images to acquire the AD-converted data Dsig of the signal component Vsig.

Independent Control of Counter Activation Period

As described above, in the reference signal comparing AD conversion, various methods can be used by combinations of the first-half count operation and the second-half count operation, the count mode (up-count mode or down-count mode) the P-phase process and the D-phase process, and the CDS process to be performed in the columns (the column AD circuit 25 of each column). Of course, the count mode and the count phase in the above-mentioned four process examples may be combined.

In this embodiment, by independently controlling the AD conversion process period (comparison period or count period) in the column AD circuits 25, specifically, the count operation period (also referred to as counter activation period) in the counter units 254, on the basis of a predetermined criterion, a structure for reducing the influence of the input amplitude on the power consumption such as a structure for equalizing the power consumption with respect to the input amplitude or a structure for reducing the power consumption as a whole is obtained.

Hereinafter, the structure for independently controlling the counter activation period of the counter units 254 will be described specifically.

Independent Control First Embodiment

First Example

Figure 4A:
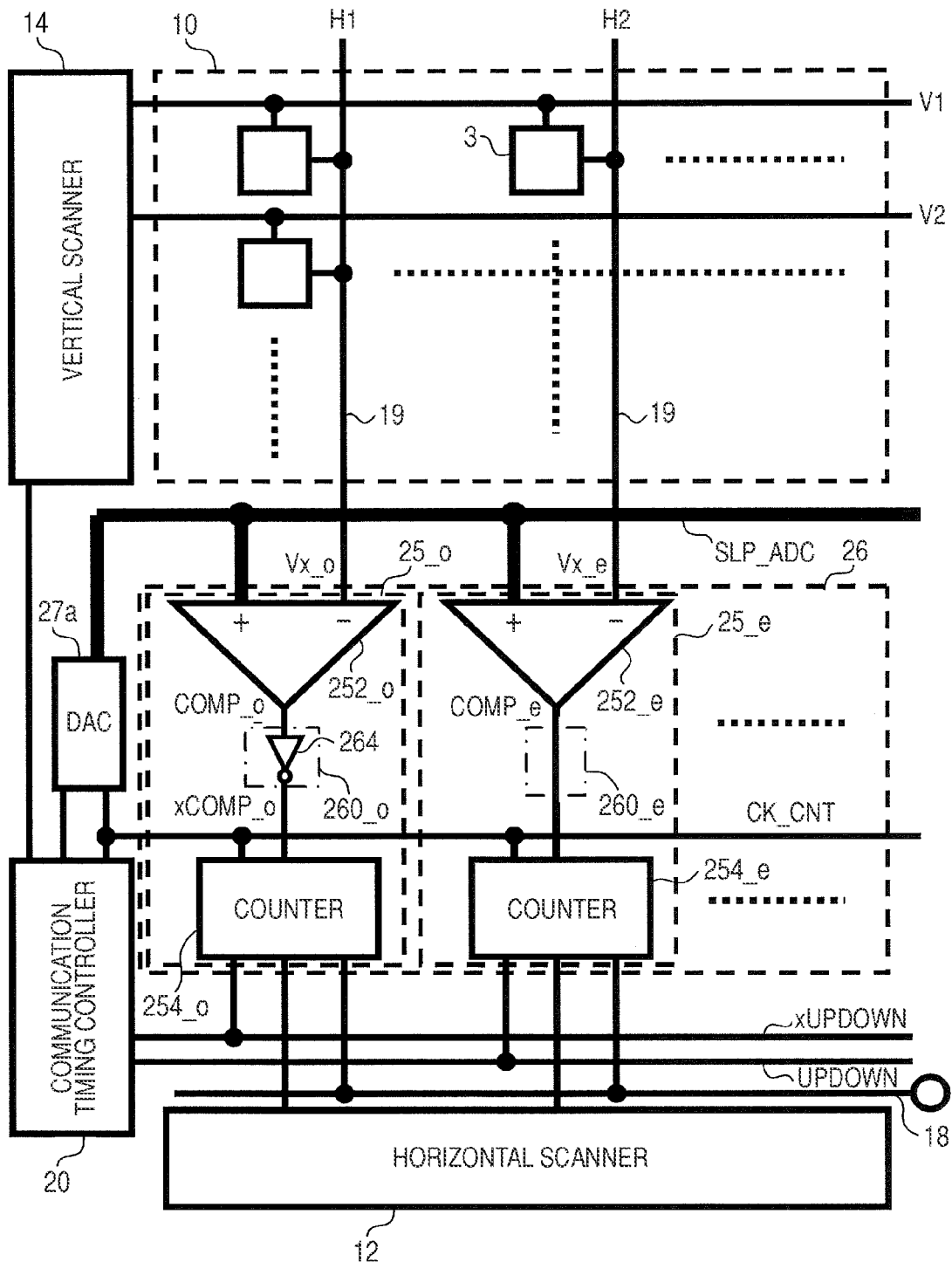
FIG. 4A is a block diagram illustrating an example of a circuit configuration for putting a first embodiment (first example), which has a structure for independently controlling a counter activation period, into practice.
Figure 4B:
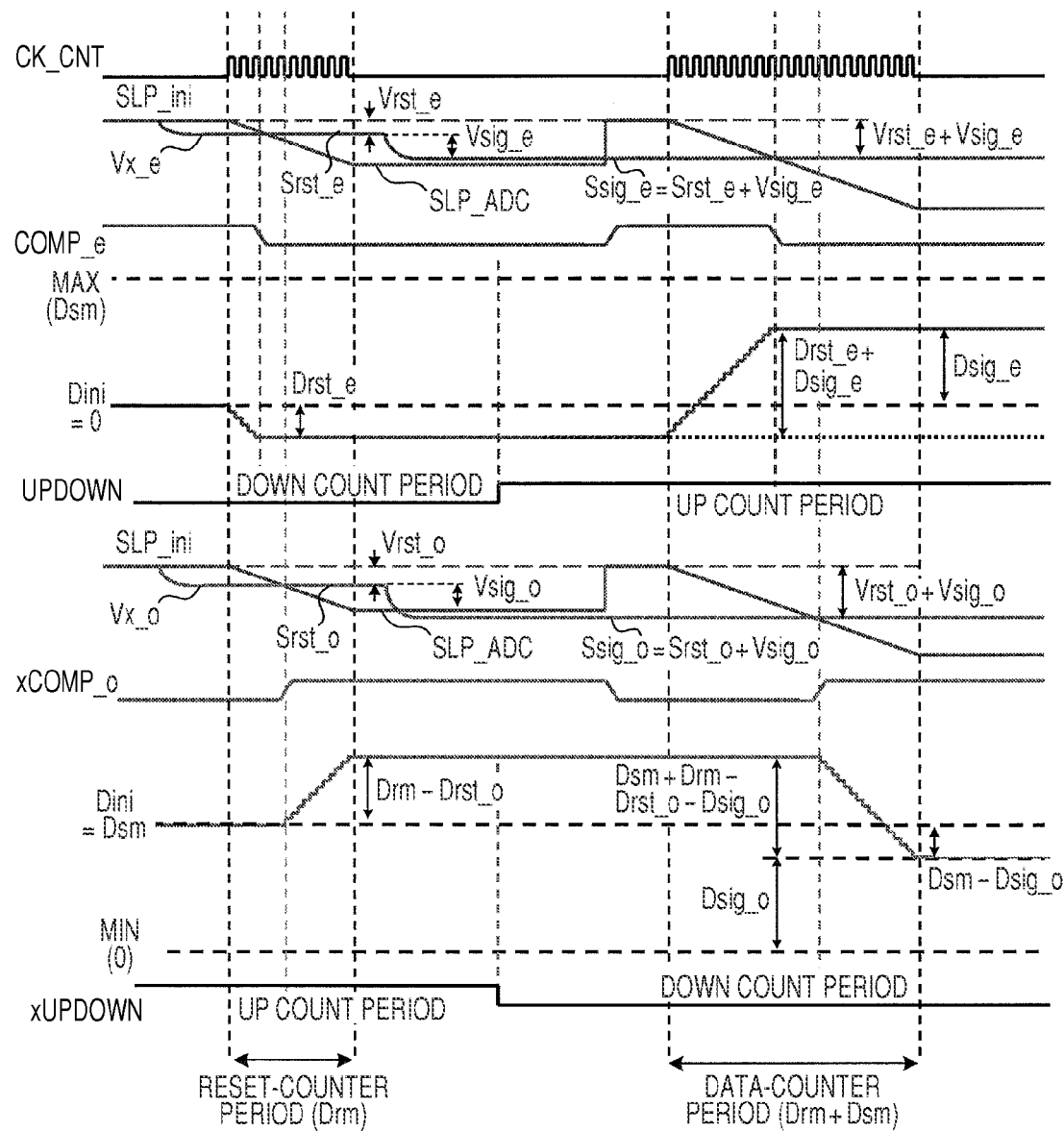
FIG. 4B is a timing diagram illustrating a basic operation of the first embodiment (first example).
Figure 4C:
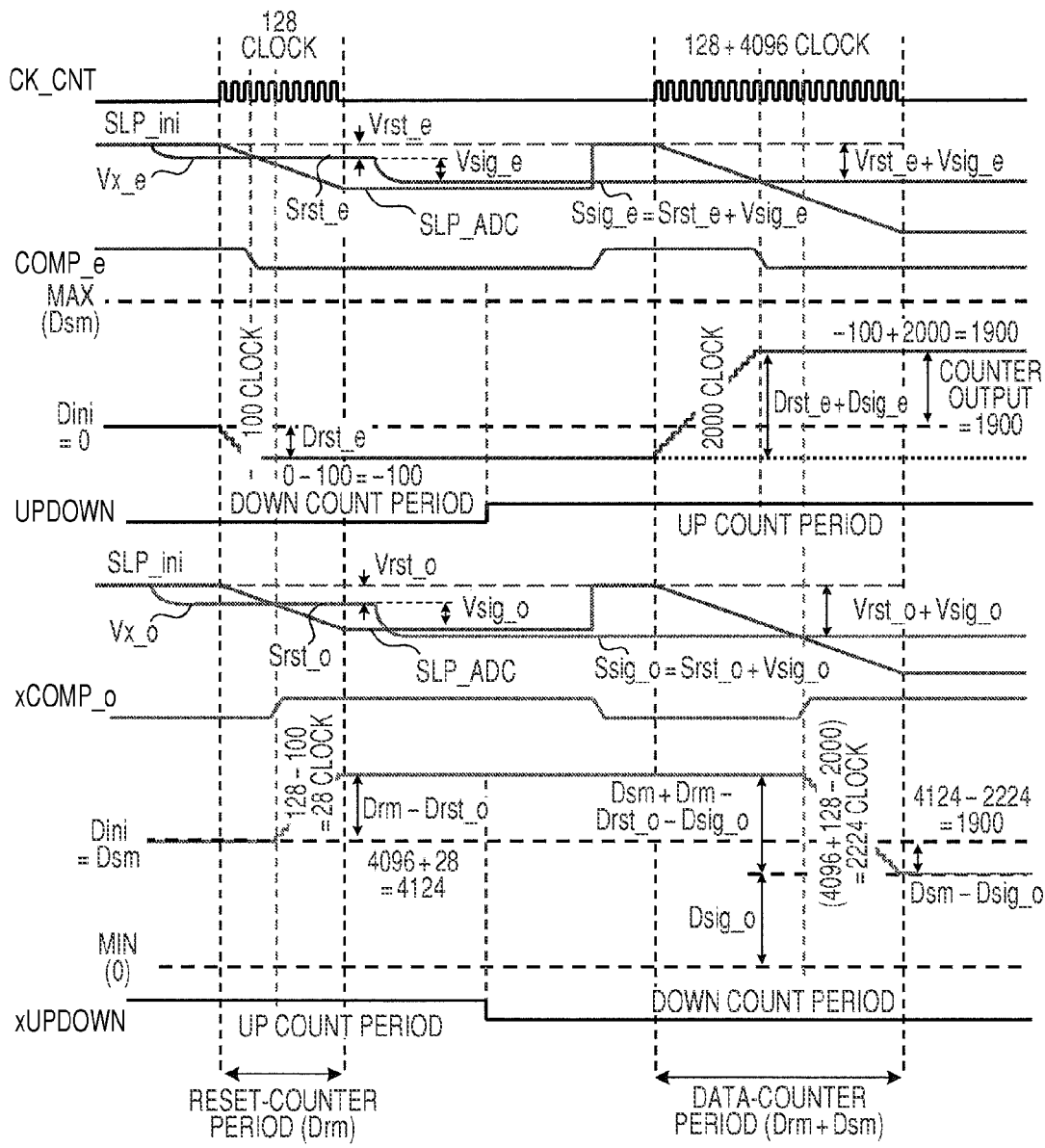
FIG. 4C is a timing diagram illustrating a specific example of the first embodiment (first example).

FIGS. 4A to 4C are diagrams illustrating a structure for independently controlling the counter activation periods of the counter units 254 according to a first example of a first embodiment. Here, FIG. 4A is a block diagram illustrating a circuit configuration for putting the first embodiment (first example) into practice. FIG. 4B is a timing diagram illustrating a basic operation of the first embodiment (first example). FIG. 4C is a timing diagram illustrating a specific example of the first embodiment (first example).

The first embodiment provides a structure for independently controlling the counters disposed to exclusively perform the first-half count operation and the second-half count operation by using the first example of the relation between the "predetermined criterion" and the "independent control" corresponding to the predetermined criterion. Accordingly, a first counter performing the first-half count operation and a second counter performing the second-half count operation are individually provided and the processing signal is distributed thereto.

Particularly, in the first embodiment (first example) applied to the solid-state imaging device, the first counter and the second counter are alternately arranged every predetermined number (k columns, where k is a positive integer) so as to process the pixel signal voltage Vx of the corresponding column. Specifically, in an example of the "alternately every predetermined number", the first counter unit and the second counter unit are alternately arranged every column.

Specifically, as shown in FIG. 4A, in the circuit configuration for performing the first embodiment (first example), based on the first configuration example for performing the reference signal comparing AD conversion shown in FIG. 2A, so as to allow the column AD circuits 25 of the columns to serve as the individual counters exclusively performing the first-half count operation and the second-half count operation in the unit of rows, a count operation controller 253_e (specifically, count phase adjuster 260_e) on one side (even columns in the drawing) transmits the comparison output COMP_e of the voltage comparator 252_e to the counter unit 254_e of the corresponding column without logically inverting the comparison output, and a count operation controller 253_o (specifically, count phase adjuster 260_o) on the other side (odd columns in the drawing) logically inverts and transmits the comparison output COMP_o of the voltage comparator 252_o to the counter unit 254_o of the corresponding column without logically inverting the comparison output. By employing this configuration, the comparison output COMP_e based on the voltage comparators 252_e of the even columns and the comparison output xCOMP_o based on the voltage comparators 252_o of the odd columns have the inverted output relation with respect to each other.

For example, the count phase adjuster 260_e transmits the received comparison output COMP_e to the counter unit 254_e (corresponding to the first counter) of the corresponding column directly or through a non-inverted buffer without logically inverting the comparison output COMP_e of the voltage comparator 252_e. Alternatively, a configuration in which the comparison output COMP_e is supplied to the input terminal IN1 of the EX-OR gate 262 (see FIG. 2A), the input terminal IN2 is set to the L level to generate a non-inverted output, and the non-inverted output is transmitted to the counter unit 254_e of the column may be employed. In the drawing, the received comparison output COMP_e is input directly to the counter unit 254_e of the corresponding column without any change.

On the other hand, the count phase adjuster 260_o transmits the comparison output COMP_o of the voltage comparator 252_o to the counter unit 254_o (corresponding to the second counter) of the corresponding column, for example, through an inverter so as to logically invert the comparison output. Alternatively, a configuration in which the comparison output COMP_o is supplied to the input terminal IN1 of the EX-OR gate 262 (see FIG. 2A), the input terminal IN2 thereof is set to the H level to generate an inverted output, and the inverted output is transmitted to the counter unit 254_o of the corresponding column may be employed. The inversion circuit 264 including an inverter is shown in the drawings.

In the circuit configuration example for carrying out the first embodiment (first example), an UPDOWN signal and an xUPDOWN signal for controlling the count mode for the even columns and the odd columns are output as the control signal CN5 from the communication timing controller 20. The UPDOWN signal is supplied to the counter units 254 of the even columns and the xUPDOWN signal is supplied to the counter units 254 of the odd columns. The counter units 254 operate in the down counter mode when the UPDOWN signal or the xUPDOWN signal is at the L level, and operate in the up count mode when it is at the H level. Only the UPDOWN signal may be used and the xUPDOWN signal may be generated as an inverted signal by the column AD circuits 25_o of the odd columns by the use of an inverter circuit such as an inverter logically inverting the UPDOWN signal.

In the circuit configuration example for putting the embodiment (first example) into practice, the outputs of the counter units 254 are connected directly to the horizontal signal lines 18 not through the data storage and transmission output unit 256. The counter units 254 automatically acquire the digital data having been subjected to the CDS process by columns by making the count mode be changed in the P-phase process (process of the reset level Srst) as the first process and the D-phase process (process of the signal level Ssig) as the second process.

In the solid-state imaging device employing the circuit configuration for putting the first embodiment (first example) into practice, the pixel signal voltage Vx corresponding to the incident light intensity received from the unit pixels 3 of the pixel array unit 10 is read every row at the predetermined timing given from the communication timing controller 20, and the count operation is performed by the count operation controller 253 of the column AD circuit 25 disposed every columns, and then the digital data is sequentially output. In this configuration, for example, the even columns are grouped into a first group, the odd columns are grouped into a second group, and the pixel signal voltages Vx of the groups are counted at the timing independent of each other during the same process period.

For example, the basic operation of the first embodiment (first example) is shown in the timing diagram of FIG. 4B. In the column AD circuits 25_e of the even columns, the counter units 254_e perform the reading and AD conversion process on the first pixel signal voltage Vx_e in the down count mode as follows. After the reset level Srst_e is stabilized, the voltage comparator 252_e compares the reference signal SLP_ADC with the P-phase level (reset level Srst_e) of the pixel signal voltage Vx_e while the DA conversion circuit 27a varies the reference signal SLP_ADC from an initial value to a predetermined slope. Since the reference signal SLP_ADC is higher than the reset level Srst_e at the start time of the comparison process in voltage, the comparison pulse COMP_e is at the H level, and the counter units 254_e start the count operation in the down count mode when the reference signal SLP_ADC starts its variation. At this time, the count initial value is set to the minimum gray scale value (minimum value) of the AD conversion, for example, "0." When the reference signal SLP_ADC is equal to the reset level Srst_e, the comparison output COMP_e of the voltage comparator 252_e is inverted, and the counter units 254_e having received the inverted output stop the down count operation and store the count value at that time, that is, the count value corresponding to the comparison period of the first half of the maximum count period of the reset level.

Thereafter, in the D-phase process period, after the signal level Ssig_e is stabilized, the voltage comparator 252_e compares the reference signal SLP_ADC with the D-phase level (signal level Ssig_e) of the pixel signal voltage Vx_e while the DA conversion circuit 27a varies the reference signal SLP_ADC from an initial value to a predetermined slope. Since the reference signal SLP_ADC is higher than the signal level Ssig_e in voltage at the start time of the comparison process, the comparison pulse COMP_e is at the H level, and the counter units 254_e start the count operation in the up count mode from the count value after the P-phase process when the reference signal SLP_ADC starts its variation. When the reference signal SLP_ADC is equal to the signal level Ssig_e, the comparison output COMP_e of the voltage comparator 252_e is inverted, and the counter units 254_e having received the inverted output stop the up count operation and store the count value at that time, that is, the count value corresponding to the comparison period of the first half of the maximum count period of the signal level.

Here, in the D-phase process, since the count operation is performed from the count value after the P-phase process in the mode different from that of the P-phase process, the difference process between the P-phase AD converted data Drst_cnt and the D-phase AD converted data Dsig_cnt is automatically performed. For example, when it is assumed that the count value of the reset level Srst_e is Drst and the count value of the signal component Vsig_e is Dsig_e, "−Drst_e" is stored in the counter unit 254_e after the P-phase process and the comparison output COMP_e is inverted by the counting of "Drst_e+Dsig_e" in the D-phase process. Accordingly, (−Drst_e)+Drst_e+Dsig_e=Dsig_e is stored in the counter unit 254_e. Therefore, it can be seen that the CDS process is automatically performed in the columns.

In this way, in the relationship between the maximum count period and the time point when the comparison output COMP_e is inverted, the column AD circuit 25_e of the even columns performs the count operation in the first half of the maximum process period (until the comparison output COMP_e is inverted) during both the P-phase process period and the D-phase process period.

On the other hand, in the column AD circuits 25_o of the odd columns, the counter units 254_o perform the reading and AD conversion process on the first pixel signal voltage Vx_o in the up count mode as follows. After the reset level Srst_o is stabilized, the voltage comparator 252_o compares the reference signal SLP_ADC with the P-phase level (reset level Srst_o) of the pixel signal voltage Vx_o while the DA conversion circuit 27a varies the reference signal SLP_ADC from an initial value to a predetermined slope. Since the reference signal SLP_ADC is higher than the reset level Srst_o in voltage at the start time of the comparison process, the comparison pulse COMP_o is at the H level, the comparison pulse COMP_o (=H level) is logically inverted by the inverter circuit 264 and is transmitted to the counter unit 254_o, and thus the counter units 254_o are in the waiting state. When the reference signal SLP_ADC is equal to the reset level Srst_o, the comparison output COMP_o of the voltage comparator 252_o is inverted, and the inverter circuit 264 logically inverts and transmits the comparison output COMP_o (=L level) to the counter units 254_o. Accordingly, the counter units 254_o start the count operation in the up count mode. At this time, the count initial value is set to the maximum gray scale value (maximum value) of the AD conversion, for example, "4096" when the signal component Vsig is converted into digital data by 12 bits. This value is the maximum count number Dsm corresponding to the maximum signal component Vsig_o of the D-phase process.

Thereafter, when the P-phase process period passes, the counter unit 254_o stops its count operation. Accordingly, the counter unit 254_o stores the value obtained by adding the count value Dp of the P phase to the initial value Dsm. When the count value of the reset level Srst_o is Drst_o, the count value Dp is "Drm_o−Drst_o", which is a complement number of the count value Drst_o of the reset level Srst_o. That is, the value Dsm+(Drm−Drst_o) obtained by adding the complement number of the count value Drst_o of the reset level Srst_o to the initial value Dsm is stored in the counter unit 254_o.

In the D-phase process period, after the signal level Ssig_o is stabilized, the voltage comparator 252_o compares the reference signal SLP_ADC with the D-phase level (signal level Ssig_o) of the pixel signal voltage Vx_o while the DA conversion circuit 27a varies the reference signal SLP_ADC from an initial value to a predetermined slope. Since the reference signal SLP_ADC is higher than the signal level Ssig_o in voltage at the start time of the comparison process, the comparison pulse COMP_o is at the H level, the comparison pulse COMP_o (=H level) is logically inverted by the inverter circuit 264 and is transmitted to the counter unit 254_o, and thus the counter units 254_o are in the waiting state. When the reference signal SLP_ADC is equal to the signal level Ssig_o, the comparison output COMP_o of the voltage comparator 252_o is inverted, and the inverter circuit 264 logically inverts and transmits the comparison output COMP_o (=L level) to the counter units 254_o. Accordingly, the counter units 254_o start the count operation in the down count mode from the count value after the P-phase process. Thereafter, the counter units 254_o stop their count operation when the D-phase process period passes.

Accordingly, the counter units 254_o stores the value obtained by subtracting the count value Dd of the D phase from the P-phase process result. The count value Dd is "Dsm'−(Drst_o+Dsig_o)" when the digital data of the signal component Vsig_o is Dsig_o. Accordingly, the value obtained by subtracting the complement number of the count value Dsig_o of the signal component Vsig_o from the count value after the P-phase process is stored in the counter unit 254. As a result, Dsm+(Drm−Drst_o)−(Dsm'−(Drst_o+Dsig_o))=Dsm+(Drm−Drst_o)−(Dsm+Drm−(Drst_o+Dsig_o))=Dsig_o is stored in the counter units 254_o. Therefore, it can be seen that the CDS process is automatically performed in the columns. By setting the initial value Dini of the P-phase process to Dsm, it can be seen that the correction of data is not necessary in the digital calculator 29.

In this way, in the relationship between the maximum count period and the time point when the comparison output COMP_o is inverted, the column AD circuit 25_o of the odd columns performs the count operation in the second half (after the comparison output COMP_o is inverted) of the maximum process time during both the P-phase process period (reset counter period) and the D-phase process period (data counter period).

By selectively setting the count operation period of the counter units 254_e and 254_o in the even columns and the odd columns to the first half until the comparison output COMP_e is inverted or the second half after the comparison output COMP_o is inverted, that is, by independently controlling the count periods of the even columns and the odd columns, the count activation periods are complementary with each other to reduce the influence of the input amplitude on the power consumption, for example, to equalize the power consumption with respect to the input amplitude.

For example, when the input level is high (bright: high brightness), the count period of the counter units 254_e is elongated and the power consumption in the column AD circuit 25_e of the even columns performing the first-half count operation is enhanced, but the count period of the counter units 254_o is shortened and the power consumption in the column AD circuit 25_o of the odd columns performing the second-half count operation is reduced. Accordingly, the total power consumption is almost equal to the power consumption of the case where both process the pixel signal voltage Vx of the middle level.

For example, when the input level is low (dark: low brightness), the count period of the counter units 254_e is shortened and the power consumption in the column AD circuit 25_e of the even columns performing the first-half count operation is reduced, but the count period of the counter units 254_o is elongated and the power consumption in the column AD circuit 25_o of the odd columns performing the second-half count operation is enhanced. Accordingly, the total power consumption is almost equal to the power consumption of the case where both process the pixel signal voltage Vx of the middle level.

In this way, in the first embodiment (first example) it is possible to equalize the source current consumed by the counter units 254 of the entire columns. That is, by classifying the columns into the counter group performing the first-half count operation and the counter group performing the second-half count operation, the source current flows similar to the state where the half counter units 254 operate during the entire period as a whole, thereby reducing the peak current.

In the structures described in JP-A-2005-278135 and W. Yang et al., since the first-half count operation is performed in both the even columns and the odd columns, the counter units 254 of the entire columns operate until the reference signal SLP_ADC is equal to the pixel signal voltage Vx, and then the counter units 254 of the entire columns stop their operation. Accordingly, there appear a period when the source current corresponding to the entire columns flows and a period when the source current does not flow. On the contrary, in the first embodiment (first example), by dividing the count operation into the first-half count operation and the second-half count operation, the counter units 254 corresponding to a half of the entire columns operate during the entire process period, regardless of the amplitude of the pixel signal voltage Vx, thereby reducing the peak source current to about ½.

As can be seen therefrom, when the pattern of the input level has a difference in height with the complementary relation depending on the counter units 254 performing the first-half count operation and the counter units 254 performing the second-half count operation, the total power consumption is not equal to the power consumption at the time of processing the pixel signal voltage Vs of the middle level. In this example, when the pattern of the input level has the brightness high in the even columns and low in the odd columns, the count period is elongated in both the even columns and the odd columns and the total power consumption is greater than the power consumption at the time of processing the pixel signal voltage Vx of the middle level. On the contrary, when the pattern of the input level has the brightness low in the even columns and high in the odd columns, the count period is shortened in both the even columns and the odd columns and the total power consumption is smaller than the power consumption at the time of processing the pixel signal voltage Vx of the middle level. However, under the general condition, the pattern of the input level hardly has such a state, and the total power consumption is equal to the power consumption at the time of processing the pixel signal voltage Vx of the middle level.

FIG. 4C shows a specific example of the first embodiment (first example). For example, it is assumed that the pixel signal voltage of the even columns is Vx_e, the pixel signal voltage of the odd columns is Vx_o, the count values (reset data) Drst_e and Drst_o of the reset levels Srst_e and Srst_o are all 100, and the count values (signal data) Dsig_e and the Dsig_o of the signal components Vsig_e and Vsig_o are all 1900. In the drawing, the pixel signal voltage Vx_e is different from the pixel signal voltage Vx_o and thus the inversion timing of the comparator is deviated. However, since the pixel signal voltage Vx_e is actually equal to the pixel signal voltage Vx_o as described above, the inversion timing of the comparator is not deviated.

First, in the count period of Drm=128 provided as the P-phase process period, the UPDOWN signal is at the L level and the column AD circuits 25_e of the even columns operate in the down count mode. Accordingly, when the reference signal SLP_ADC starts its variation, all the counter units 254 start the down counting operation from the initial value of "0" and the voltage comparators 252 compare the reference signal SLP_ADC with the pixel signal voltage Vx_e. At the 100-th clock when the reference signal SLP_ADC is equal to the reset level Srst_e of the pixel signal voltage Vx_e, the comparison output COMP_e of the voltage comparators 252 is inverted, the down count operation of the counter units 254 is stopped, and the count value "−100" is stored in the counter units 254.

Similarly, in the column AD circuit 25_o of the odd columns during the P-phase process period, the voltage comparators 252 compare the reference signal SLP_ADC with the pixel signal voltage Vx_o. At the 100-th clock when the reference signal SLP_ADC is equal to the reset level Srst_o of the pixel signal voltage Vx_o, the comparison output COMP_o of the voltage comparators 252 is inverted and then is logically inverted by the inverter circuit 264, and is transmitted as the comparison output xCOMP_o to the counter units 254. Since the xUPDOWN signal is at the H level and the counter units 254 operate in the up count mode, the up count operation is started from the initial value Dsm=4096 and the counter units 254 stops the count operation at the 128-th clock after the P-phase process period passes. Accordingly, since the counter units 254 count up from the initial value of 4096 by 128−100=28 clocks and thus store 4096+28=4124.

As can be seen from the comparison between the operation of the even columns and the operation of the odd columns, in the P-phase process period, the count operation is performed on the reset level Srst_e in the first half (until the comparison output COMP_o is inverted) of the maximum process period and the count operation is performed on the reset level Srst_o (the value of which is equal to the reset level Srst_e) in the second half (after the comparison output COMP_o is inverted) of the maximum process period. Accordingly, the counter units 254 of the even columns and the odd columns operate with the complementary relation and thus do not operate at the same time.

In the count period of Dsm'=Drm+Dsm=128+4096=4224 provided as the D-phase process period, the UPDOWN signal is at the H level and the column AD circuits 25_e of the even columns operate in the up count mode. Accordingly, when the reference signal SLP_ADC starts its variation, all the counter units 254 start the up counting operation from the value −100 after the P-phase process and the voltage comparators 252 compare the reference signal SLP_ADC with the pixel signal voltage Vx_e. At the "100+1900"=2000-th clock when the reference signal SLP_ADC is equal to the signal level Ssig_e of the pixel signal voltage Vx_e, the comparison output COMP_e of the voltage comparators 252 is inverted, the up count operation of the counter units 254 is stopped, and the count value "−100+100+1900"=1900 is stored in the counter units 254.

Similarly, in the column AD circuit 25_o of the odd columns during the D-phase process period, the voltage comparators 252 compare the reference signal SLP_ADC with the pixel signal voltage Vx_o. At the "100+1900"=2000-th clock when the reference signal SLP_ADC is equal to the signal level Ssig_o of the pixel signal voltage Vx_o, the comparison output COMP_o of the voltage comparators 252 is inverted and then is logically inverted by the inverter circuit 264, and is transmitted as the comparison output xCOMP_o to the counter units 254. Since the xUPDOWN signal is at the L level and the counter units 254 operate in the down count mode, the down count operation is started from the value=4124 after the P-phase process and the counter units 254 stops the count operation at the 4224-th clock after the D-phase process period passes. Accordingly, the counter units 254 count down by 4224−2000=2224 clocks and thus store 4124−2224=1900.

As can be seen from the comparison between the operation of the even columns and the operation of the odd columns, in the D-phase process period, the count operation is performed on the signal level Ssig_e in the first half (until the comparison output COMP_o is inverted) of the maximum process period and the count operation is performed on the signal level Ssig_o (the value of which is equal to the signal level Ssig_e) in the second half (after the comparison output COMP_o is inverted) of the maximum process period. Accordingly, the counter units 254_e and 254_o of the even columns and the odd columns operate with the complementary relation and thus do not operate at the same time.

As can be seen therefrom, in all the P-phase process period and the D-phase process period, the counter group of the even columns and the counter group of the odd columns perform the count operation in the first half and the second half of the P-phase process period and the D-phase process period. Accordingly, when the reset levels Srst_e and Srst_o or the signal levels Ssig_e and Ssig_o are equal to each other, two counter groups do not operate at the same time in the respective periods. Accordingly, the power consumption can be equalized.

In the structure of the first embodiment (first example) compared with the structure of the first embodiment (second example) to be described later, since the final count values of the column AD circuit 25_o of the odd columns performing the second-half count operation and the column AD circuit 25_e of the even columns performing the first-half count operation are the real numbers, the count value can be used directly as the AD conversion data. As a result, the post processes such as the correction process at the subsequent stage (such as the digital calculator) are not necessary, thereby simplifying the function of the digital calculator. Since the calculation processes are reduced, the delay time (latency) for the calculation can be reduced.

Independent Control First Embodiment

Second Example

Figure 5A:
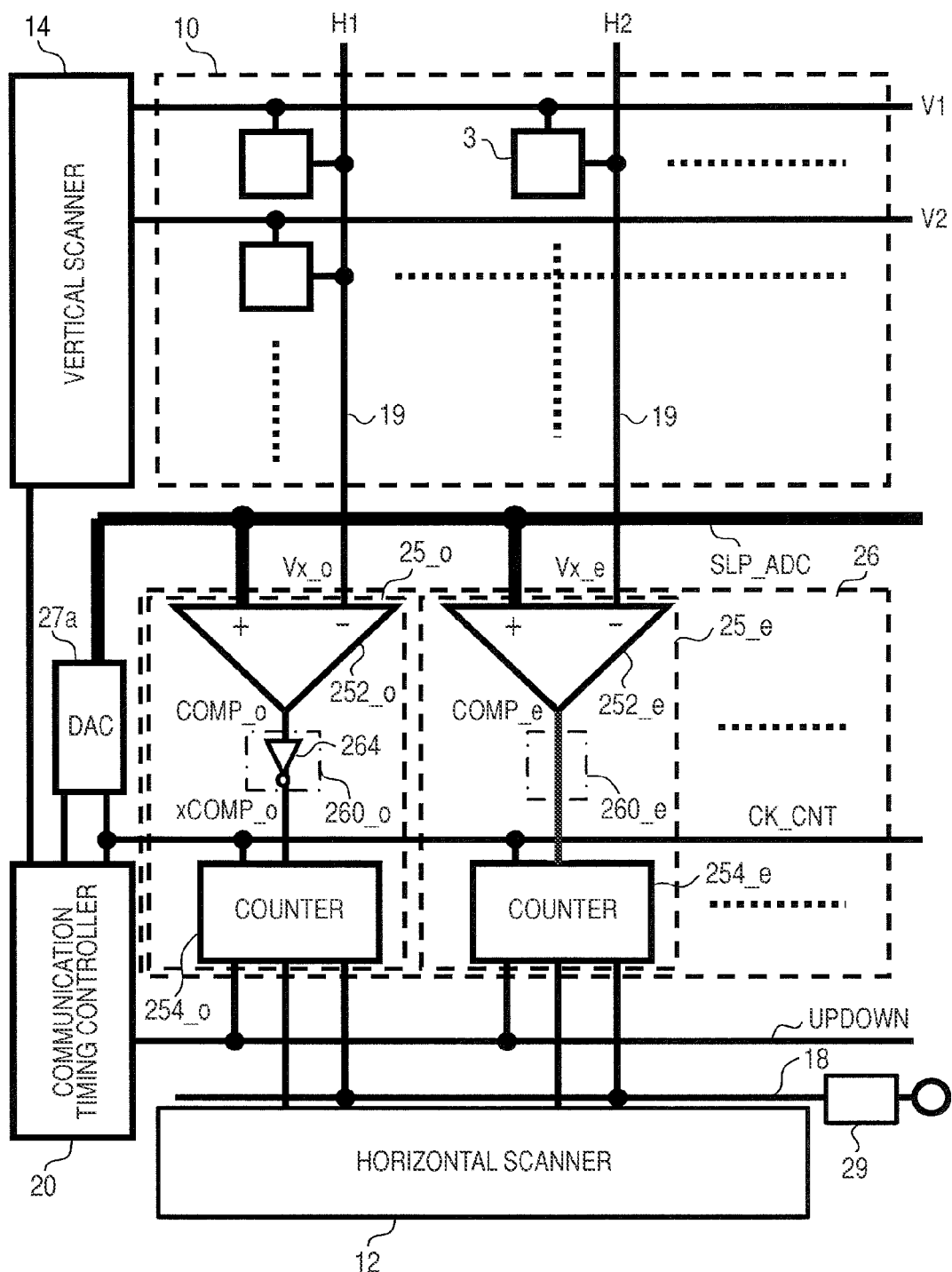
FIG. 5A is a block diagram illustrating an example of a circuit configuration for putting a first embodiment (second example), which has a structure for independently controlling a counter activation period, into practice.
Figure 5C:
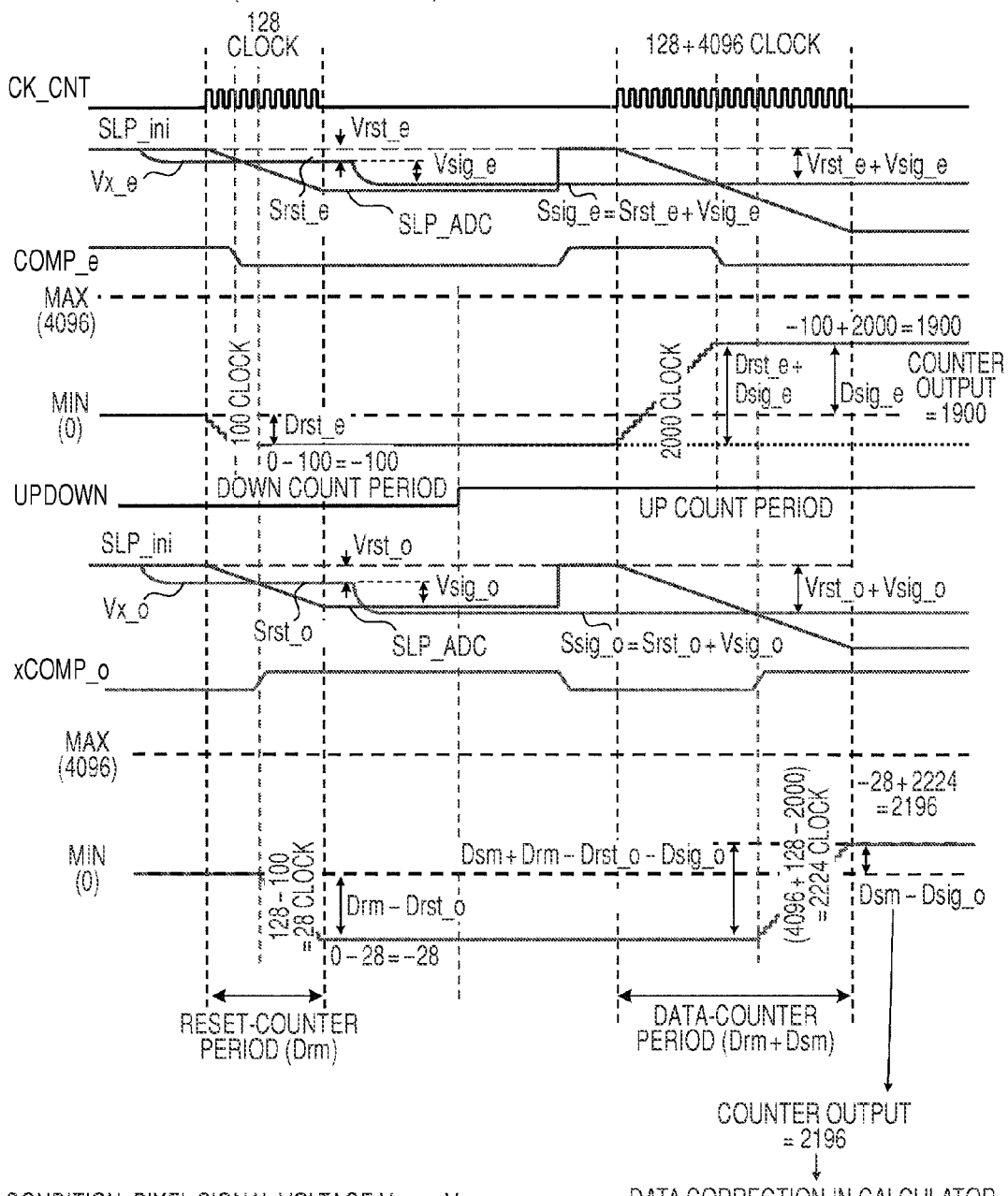
FIG. 5C is a timing diagram illustrating a specific example of the first embodiment (second example).

FIGS. 5A to 5C are diagrams illustrating a structure for independently controlling the counter activation period of the counter units 254 according to a second example of the first embodiment. Here, FIG. 5A is a block diagram illustrating a circuit configuration for putting the first embodiment (second example) into practice. FIG. 5B is a timing diagram illustrating a basic operation of the first embodiment (second example). FIG. 5C is a timing diagram illustrating a specific example of the first embodiment (second example).

Similarly to the first embodiment (first example), the first embodiment (second example) provides a structure for independently controlling the counters disposed to exclusively perform the first-half count operation and the second-half count operation by using the first example of the relation between the "predetermined criterion" and the "independent control" corresponding to the predetermined criterion. Accordingly, a first counter performing the first-half count operation and a second counter performing the second-half count operation are individually provided and the processing signal is distributed thereto.

Particularly, similarly to the first embodiment (first example), in the first embodiment (second example) applied to the solid-state imaging device, the first counters performing the first-half count operation are disposed in the even columns and the second counters performing the second-half count operation are disposed in the odd columns.

On the other hand, the circuit configuration for putting the first embodiment (second example) into practice is different from that of the first embodiment (first example) in that the UPDOWN signal for controlling the count mode in common to the even columns and the odd columns is output as the control signal CN5 from the communication timing controller 20. The counter units 254 operate in the down count mode when the UPDOWN signal is at the L level and in the up count mode when it is at the H level.

The circuit configuration example for putting the first embodiment (second example) into practice includes a digital calculator 29 at the previous stage of the output circuit 28 (not shown). The digital calculator 29 of the first embodiment (second example) corrects the complement data output from the counter units 254 of the odd columns into the real data. That is, in the first embodiment (second example), the count modes of the counter units 254_e and 254_o of the column AD circuit 25_e of the even columns and the column AD circuit 25_o of the odd columns are matched with each other, the outputs are output to a single output line (horizontal signal line 18), and the digital calculator 29 corrects only the complement data of the column AD circuit 25_o of the odd columns into the rear data depending on the data timing.

For example, the basic operation of the first embodiment (second example) is shown in the timing diagram of FIG. 5B. The operation of the column AD circuit 25_e of the even columns is equal to the operation of the first embodiment (first example) shown in FIG. 4B. Accordingly, the description thereof is omitted.

On the other hand, in the column AD circuits 25_o of the odd columns, the counter units 254 perform the reading and AD conversion process on the first pixel signal voltage Vx_o in the down count mode as follows. After the reset level Srst_o is stabilized, the voltage comparator 252 compares the reference signal SLP_ADC with the P-phase level (reset level Srst_o) of the pixel signal voltage Vx_o while the DA conversion circuit 27a varies the reference signal SLP_ADC from an initial value to a predetermined slope. Since the reference signal SLP_ADC is higher than the reset level Srst_o in voltage at the start time of the comparison process, the comparison pulse COMP_o is at the H level, the comparison pulse COMP_o (=H level) is logically inverted by the inverter circuit 264 and is transmitted to the counter unit 254, and thus the counter units 254 are in the waiting state. When the reference signal SLP_ADC is equal to the reset level Srst_o, the comparison output COMP_o of the voltage comparator 252_o is inverted, and the inverter circuit 264 logically inverts and transmits the comparison output COMP_o (=L level) to the counter units 254. Accordingly, the counter units 254 start the count operation in the down count mode. At this time, the count initial value is set to the minimum gray scale value (minimum value) of the AD conversion, for example, "0."

Thereafter, when the P-phase process period passes, the counter unit 254 stops its count operation. Accordingly, the counter unit 254 stores the value obtained by subtracting the count value Dp of the P phase from the initial value=0. When the count value of the reset level Srst_o is Drst_o, the count value Dp is "Drm−Drst_o", which is a complement number of the count value Drst_o of the reset level Srst_o. That is, the value Drm−Drst_o obtained by subtracting the complement number of the count value Drst_o of the reset level Srst_o from the initial value=0 is stored in the counter unit 254.

In the D-phase process period, after the signal level Ssig_o is stabilized, the voltage comparator 252 compares the reference signal SLP_ADC with the D-phase level (signal level Ssig_o) of the pixel signal voltage Vx_o while the DA conversion circuit 27*a* varies the reference signal SLP_ADC from an initial value to a predetermined slope. Since the reference signal SLP_ADC is higher than the signal level Ssig_o in voltage at the start time of the comparison process, the comparison pulse COMP_o is at the H level, the comparison pulse COMP_o (=H level) is logically inverted by the inverter circuit 264 and is transmitted to the counter unit 254, and thus the counter units 254 are in the waiting state. When the reference signal SLP_ADC is equal to the signal level Ssig_o, the comparison output COMP_o of the voltage comparator 252_*o* is inverted, and the inverter circuit 264 logically inverts and transmits the comparison output COMP_o (=L level) to the counter units 254. Accordingly, the counter units 254 start the count operation in the up count mode from the count value after the P-phase process. The counter units 254 stop their count operation when the D-phase process time passes.

Accordingly, the counter units 254 stores the value obtained by adding the count value Dd of the D phase to the P-phase process result. The count value Dd is "Dsm'−(Drst_o+Dsig_o)" when the digital data of the signal component Vsig_o is Dsig_o. Accordingly, the value obtained by adding the complement number of the count value Dsig_o of the signal component Vsig_o to the count value after the P-phase process is stored in the counter unit 254. As a result, 0−(Drm−Drst_o)+(Dsm'−(Drst_o+Dsig_o))=0−(Drm−Drst_o)+(Dsm+Drm−(Drst_o+Dsig_o))=Dsm−Dsig_o is stored in the counter units 254. The sign of Dsig_o is negative and is off-set by Dsm, which actually exhibits the complement number of Dsig_o, but it can be seen that the CDS process is automatically performed in the columns.

In order to cancel Dsm to obtain the negative number of the digital data Dsig_o of the signal component Vsig_o, for example, the initial value Dini of the first P-phase process can be set to "−Dsm" or Dsm may be subtracted from "Dsm−Dsig_o" by the digital calculator 29. In order to return the negative number "−Dsig_o" of the digital data Dsig_o to the positive number, for example, the bit data can be inverted by the digital calculator 29. However, since the difference of "1" is accurately generated only by the inversion of the bit data, the digital calculator 29 can add "1" thereto after the inversion of the bit data to obtain the accurate data. Alternatively, by allowing the digital calculator 29 to perform a correcting calculation of {Dsm−(Dsm−Dsig_o)}, the digital data Dsig_o may be acquired. In the first embodiment (second example), the initial value Dini of the first P-phase process is set to "0" and the correcting calculation of {Dsm−(Dsm−Dsig_o)} is performed by the digital calculator 29.

FIG. 5B shows a specific example of the first embodiment (second example). For example, it is assumed that the pixel signal voltage of the even columns is Vx_e, the pixel signal voltage of the odd columns is Vx_o, the count values (reset data) Drst_e and Drst_o of the reset levels Srst_e and Srst_o are all 100, and the count values (signal data) Dsig_e and the Dsig_o of the signal components Vsig_e and Vsig_o are all 1900. In the drawing, the pixel signal voltage Vx_e is different from the pixel signal voltage Vx_o and thus the inversion timing of the comparator is deviated. However, since the pixel signal voltage Vx_e is actually equal to the pixel signal voltage Vx_o as described above, the inversion timing of the comparator is not deviated.

First, in the count period of Drm=128 provided as the P-phase process period, the UPDOWN signal is at the L level and the column AD circuits 25_*e* of the even columns operate in the down count mode. Accordingly, when the reference signal SLP_ADC starts its variation, all the counter units 254_*e* start the down counting operation from the initial value of "0" and the voltage comparators 252 compare the reference signal SLP_ADC with the pixel signal voltage Vx_e. At the 100-th clock when the reference signal SLP_ADC is equal to the reset level Srst_e of the pixel signal voltage Vx_e, the comparison output COMP_e of the voltage comparators 252 is inverted, the down count operation of the counter units 254_*e* is stopped, and the count value "−100" is stored in the counter units 254_*e*.

Similarly, in the column AD circuit 25_*o* of the odd columns during the P-phase process period, the voltage comparators 252_*o* compare the reference signal SLP_ADC with the pixel signal voltage Vx_o. At the 100-th clock when the reference signal SLP_ADC is equal to the reset level Srst_o of the pixel signal voltage Vx_o, the comparison output COMP_o of the voltage comparators 252_*o* is inverted and then is logically inverted by the inverter circuit 264, and is transmitted as the comparison output xCOMP_o to the counter units 254_*o*. Since the UPDOWN signal is at the L level and the counter units 254_*o* operate in the down count mode, the down count operation is started from the initial value=0 and the counter units 254_*o* stops the count operation at the 128-th clock after the P-phase process period passes. Accordingly, the counter units 254_*o* count down by 128−100=28 clocks and thus store 0−28=−28.

In the first embodiment (second example), the count mode of the odd columns in the P-phase process period is different that of the first embodiment (first example). However, similarly to the first embodiment (first example), as can be seen from the comparison between the operation of the even columns and the operation of the odd columns, in the P-phase process period, the count operation is performed on the reset level Srst_e in the first half (until the comparison output COMP_o is inverted) of the maximum process period and the count operation is performed on the reset level Srst_o (the value of which is equal to the reset level Srst_e) in the second half (after the comparison output COMP_o is inverted) of the maximum process period. Accordingly, the counter units 254_*o* of the even columns and the odd columns operate with the complementary relation and thus do not operate at the same time.

In the count period of Dsm'=Drm+Dsm=128+4096=4224 provided as the D-phase process period, the UPDOWN signal is at the H level and the column AD circuits 25_*e* of the even columns operate in the up count mode. Accordingly, when the reference signal SLP_ADC starts its variation, all the counter units 254_*o* start the up counting operation from the value −100 after the P-phase process and the voltage comparators 252_*o* compare the reference signal SLP_ADC with the pixel signal voltage Vx_e. At the "100+1900"=2000-th clock when the reference signal SLP_ADC is equal to the signal level Ssig_e of the pixel signal voltage Vx_e, the comparison output COMP_e of the voltage comparators 252_*o* is inverted, the up count operation of the counter units 254_*o* is stopped, and the count value "−100+100+1900"=1900 is stored in the counter units 254_*o*. The digital calculator 29 transmits the data output from the counter units 254_*e* of the even columns directly to the output circuit 28.

Similarly, in the column AD circuit 25_*o* of the odd columns during the D-phase process period, the voltage comparators 252_*o* compare the reference signal SLP_ADC with the pixel signal voltage Vx_o. At the "100+1900"=2000-th clock when the reference signal SLP_ADC is equal to the signal level Ssig_o of the pixel signal voltage Vx_o, the comparison output COMP_o of the voltage comparators 252_*o* is inverted and then is logically inverted by the inverter circuit 264, and is transmitted as the comparison output xCOMP_o to the counter units 254_o. Since the UPDOWN signal is at the H level and the counter units 254_o operate in the up count mode, the up count operation is started from the value=−28 after the P-phase process and the counter units 254_o stop the count operation at the 4224-th clock after the D-phase process period passes. Accordingly, since the counter units 254_o count up from the P-phase process result by (Dsm+Drm)−(Drst_o+Dsig_o)=4224−2000=2224 clocks and thus store −(Drm−Drst_o)+{(Dsm+Drm)−(Drst_o+Dsig_o)}=−28+2224=2196(=Dsm−Dsig_o). The digital calculator 29 subtracts the data output from the counter units 254_o of the odd columns from the maximum gray scale value=Dsm=4096 and transmits Dsm−(Dsm−Dsig_o)=4096−2196=1900 to the output circuit 28.

In the first embodiment (second example), the count mode of the odd columns in the D-phase process period is different from that of the first embodiment (first example). However, similarly to the first embodiment (first example) as can be seen from the comparison between the operation of the even columns and the operation of the odd columns, in the D-phase process period, the count operation is performed on the signal level Ssig_e in the first half (until the comparison output COMP_o is inverted) of the maximum process period and the count operation is performed on the signal level Ssig_o (the value of which is equal to the signal level Ssig_e) in the second half (after the comparison output COMP_o is inverted) of the maximum process period. Accordingly, the counter units 254_e and 254_o of the even columns and the odd columns operate with the complementary relation and thus do not operate at the same time.

As can be seen therefrom, in the first embodiment (second example), similarly to the first embodiment (first example) in the relationship between the maximum count period and the time point when the comparison output COMP_o is inverted, the column AD circuit 25_o of the odd columns performs the count operation in the second half of the maximum process period (after the comparison output COMP_o is inverted) during both the P-phase process period (reset counter period) and the D-phase process period (data counter period).

By selectively setting the count operation period of the counter units 254 in the even columns and the odd columns to the first half until the comparison output COMP_e is inverted or the second half after the comparison output COMP_o is inverted, that is, by independently controlling the count periods of the even columns and the odd columns, the count activation periods are complementary with each other to reduce the influence of the input amplitude on the power consumption, for example, to equalize the power consumption with respect to the input amplitude. Of course, this is not true in the case where the pattern of the input level has a reverse difference in height depending on the counter units 254 performing the first-half count operation and the counter units 254 performing the second-half count operation.

In the structure of the first embodiment (second example) compared with the structure of the first embodiment (first example) described above, the area of the counter units can be reduced since the operations of the counter units can be controlled only by the UPDOWN signal. In the structure of the first embodiment (first example), since the xUPDOWN signal for controlling the column AD circuit 25_o of the odd columns performing the second-half count operation is necessary, it is necessary to secure the wiring area for the signal lines. For example, the counter units may generate the xUPDOWN signal as an inverted signal only by using the UPDOWN signal. In this case, an inverter circuit such as an inverter is necessary, and the area may be enhanced.

Independent Control:

Second Embodiment (First Example)

Figure 6A:
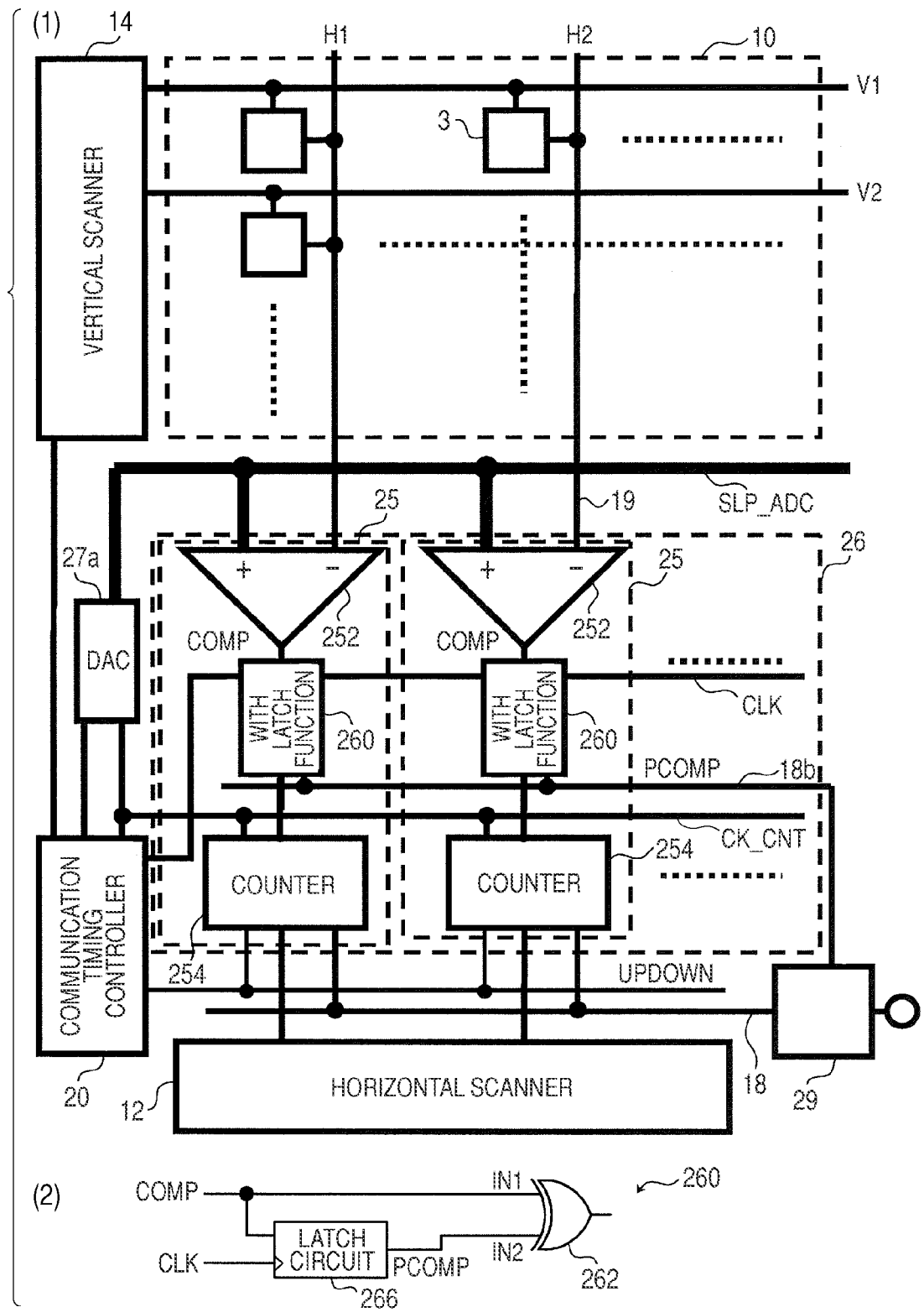
FIG. 6A is a block diagram illustrating an example of a circuit configuration for putting a second embodiment (first example), which has a structure for independently controlling a counter activation period, into practice.
Figure 6B:
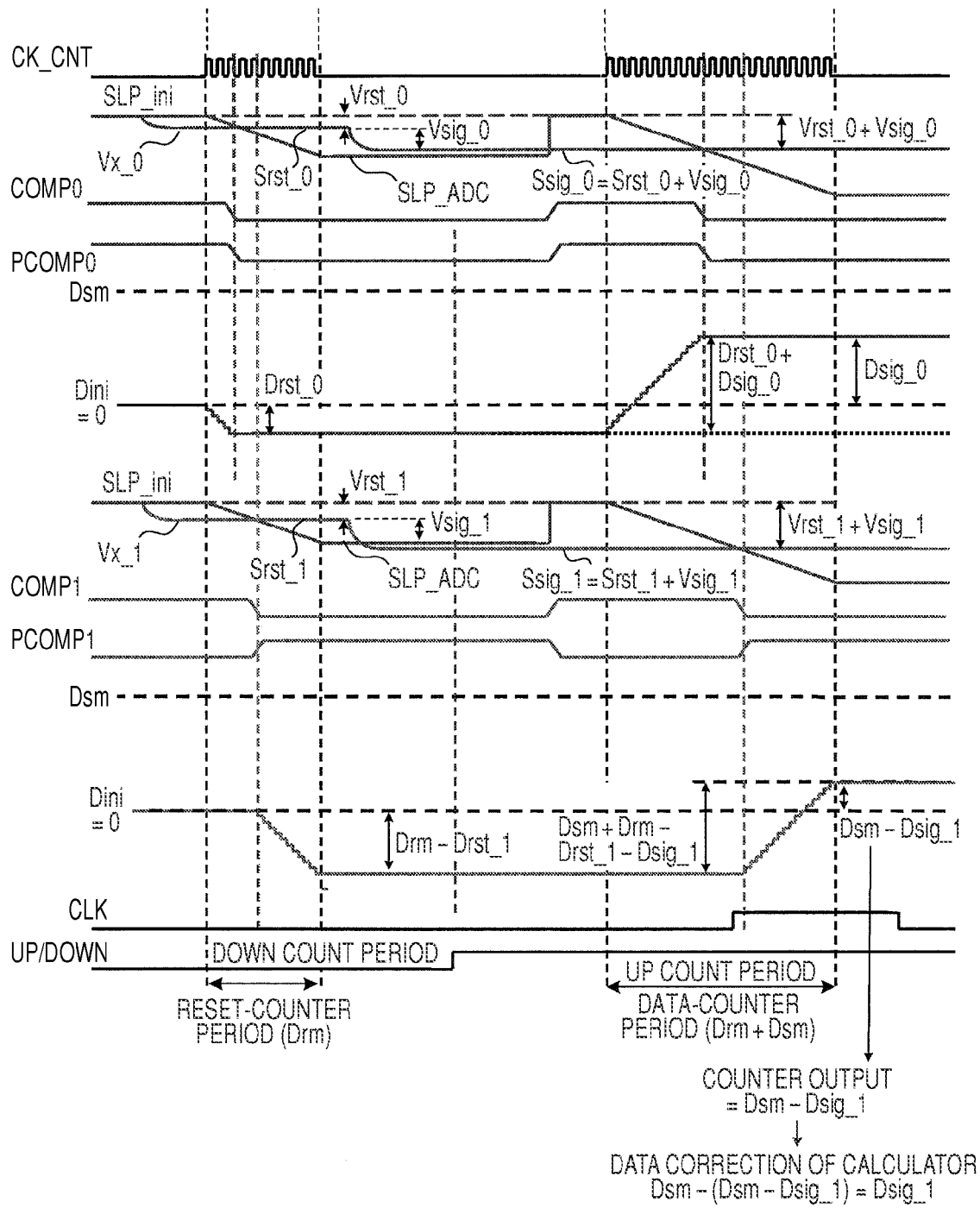
FIG. 6B is a timing diagram illustrating a basic operation of the second embodiment (first example).
Figure 6C:
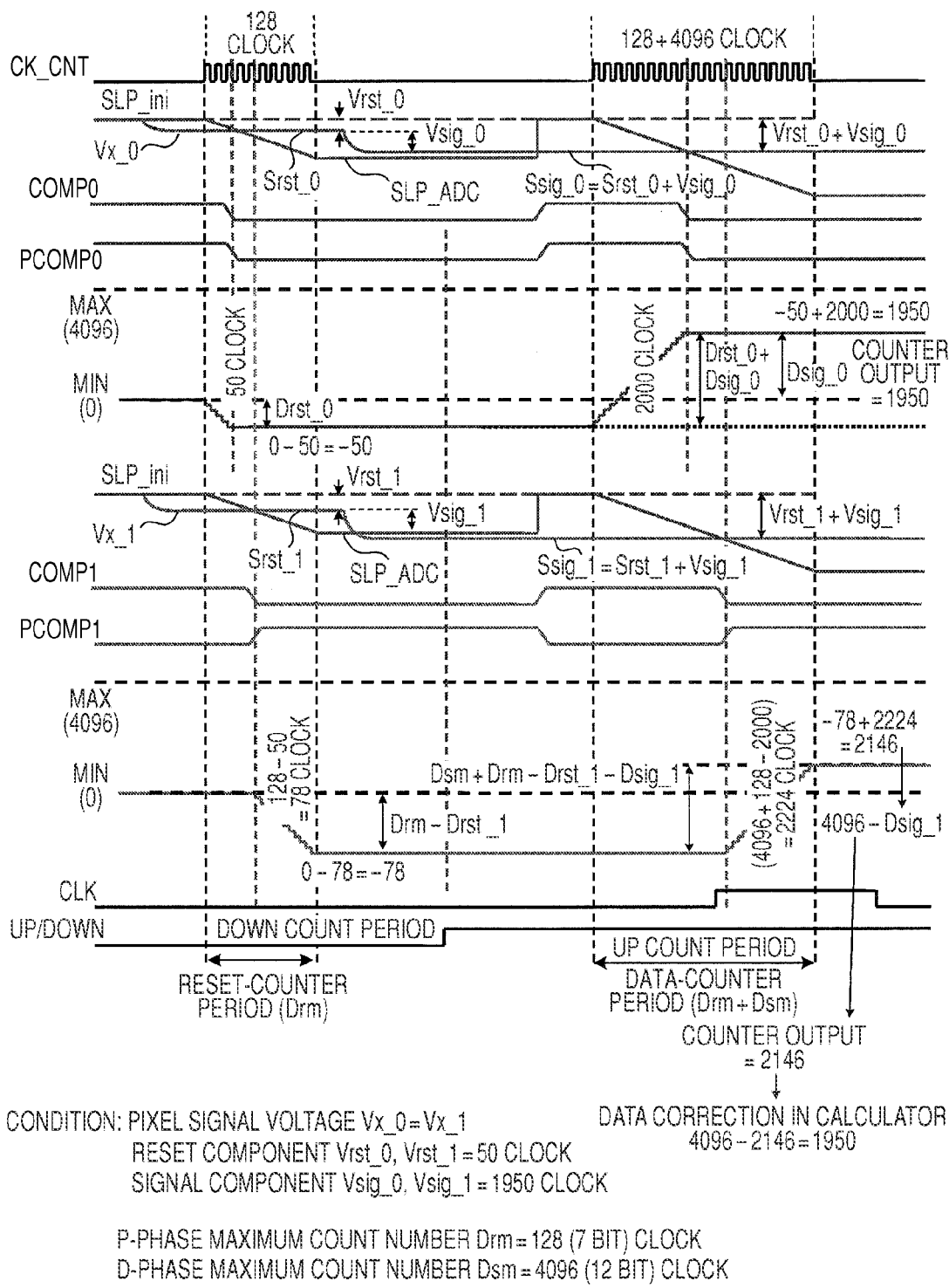
FIG. 6C is a timing diagram illustrating a specific example of the second embodiment (first example).

FIGS. 6A to 6C are diagrams illustrating a structure for independently controlling the counter activation period of the counter units 254 according to a first example of a second embodiment. Here, FIG. 6A is a block diagram illustrating a circuit configuration for putting the second embodiment (first example) into practice. FIG. 6B is a timing diagram illustrating a basic operation of the second embodiment (first example). FIG. 6C is a timing diagram illustrating a specific example of the second embodiment (first example).

The second embodiment provides a structure for allowing the counters to perform the first-half count operation and the second-half count operation and independently controlling the counters depending on the input level so as to selectively perform the first-half count operation (that is, the real number count operation) and the second-half count operation (that is, the complement number count operation) depending on the input level, by using the second example of the relation between the "predetermined criterion" and the "independent control" corresponding to the predetermined criterion. Particularly, the second embodiment (first example) is applied to the solid-state imaging device.

Particularly, in the circuit configuration for putting the second embodiment (first example) into practice, a determination unit for controlling to selectively perform the first-half count operation and the second-half count operation is provided every column. Specifically, as shown in FIG. 6A, in the circuit configuration for performing the second embodiment (first example), based on the first configuration example for performing the reference signal comparing AD conversion shown in FIG. 2A, first, the count phase adjuster 260 of each column includes a latch circuit 266 (see (2) of FIG. 6A) serving as a determination result storage section such as a D flip flop latching the comparison output COMP of the voltage comparator 252 on the basis of a latch clock signal CLK supplied from the communication timing controller 20, and the data latched by the latch circuit 266 is used as the phase information PCOMP of the comparison output COMP, that is, data indicating the range of brightness level. The voltage comparator 252 serves as a determining section determining whether the amplitude of the pixel signal voltage Vx of the present process is greater or smaller than the middle level.

That is, a scheme of not referring to the determination result of the signal level of the processing signal but referring to the determination result of the signal level of the previous process is employed for the processing signal to be subjected to the level determination. A scheme of performing the amplitude determination (level determination) only in the D-phase process of the P-phase process and the D-phase process and using the determination result in common to both the P-phase process and the D-phase process of the subsequent row as the subsequent process is employed. By performing the amplitude determination (level determination) only in the D-phase process, the determination process or the circuit configuration can be more simplified than that of the case where the determination is performed every phase.

In this example, as shown in (2) of FIG. 6A, the phase information PCOMP (data indicating the range of brightness level) of the comparison output COMP latched in the latch circuit 266 is supplied to the input terminal IN2 of the EX-OR gate 262. When the phase information PCOMP is at the L level, it indicates that the pixel signal voltage Vx has a brightness level lower than the middle brightness level. When it is at the H level, it indicates that the pixel signal voltage Vx has a bright level higher than the middle brightness level. Accordingly, the EX-OR gate 262 determines by using the phase information PCOMP whether the first-half count operation or the second-half count operation should be performed in both the P-phase process and the D-phase process of the subsequent row. For example, when the phase information PCOMP latched by the latch circuit 266 is the L level, the comparison pulse COMP is output as the count enable signal EN without being logically inverted in the P-phase process and the D-phase process of the subsequent row, thereby applying the first-half count operation (first process example shown in FIG. 3A). On the other hand, when the phase information PCOMP is the H level, the comparison pulse COMP is logically inverted and output as the count enable signal EN in the P-phase process and the D-phase process of the subsequent row, thereby applying the second-half count operation (second process example shown in FIG. 3B).

In the circuit configuration example for putting the second embodiment (first example) into practice, similarly to the first embodiment (second example), an UPDOWN signal for controlling the count mode in common for the entire columns is output as the control signal CN5 from the communication timing controller 20. The counter units 254 operate in the down counter mode when the UPDOWN signal is at the L level, and operate in the up count mode when it is at the H level.

In the circuit configuration example for putting the second embodiment (first example) into practice, the outputs of the counter units 254 are connected directly to the horizontal signal lines 18 not through the data storage and transmission output unit 256. The counter units 254 automatically acquire the digital data having been subjected to the CDS process by columns by making the count mode be changed in the P-phase process (process of the reset level Srst) as the first process and the D-phase process (process of the signal level Ssig) as the second process.

For example, the basic operation of the second embodiment (first example) is shown in the timing diagram of FIG. 6B. A specific example of the second embodiment (first example) is shown in FIG. 6C. Here, it is combined with the first process example. Specifically, in a low range of brightness level in which the signal level Ssig of the pixel signal voltage Vx of the previous row is lower than a predetermined threshold value, the first process example is applied. In the high range of brightness level in which it is higher than the predetermined threshold value, the second process example is applied.

In the example shown in FIG. 6C, it is assumed that the pixel signal voltage of which the signal level Ssig of the previous row is determined to be in the low brightness range as the amplitude determination in the previous process is Vx_0 (which does not mean that the present row is in the low brightness range), the pixel signal voltage of which the signal level Ssig of the previous row is determined to be in the high brightness range as the amplitude determination in the previous process is Vx_1 (which does not mean that the present row is in the high brightness range), the reset data Drst_0 and Drst_1 are 50, the signal data Dsig_0 and Dsig_1 are 1950, the maximum count number Drm of the P-phase process period is 128, the maximum count number Dsm of the signal data Dsig of the D-phase process period is 12 bit (=4096), and the entire maximum count number Dsm' is 4096+128. In both of the first process example and the second process example, the P-phase process is performed in the down count mode and the D-phase process is performed in the up count mode. In the P-phase process, the count process is started from the initial value=0. In the drawing, the pixel signal voltage Vx_0 is different from the pixel signal voltage Vx_1 and thus the inversion timing of the comparator is deviated. However, since the pixel signal voltage Vx_0 is actually equal to the pixel signal voltage Vx_1 as described above, the inversion timing of the comparator is not deviated.

In the P-phase process and the D-phase process, the first process example is applied to the pixel signal voltage Vx_0. Accordingly, first, during the Drm=128 count period prepared as the P-phase process period, the comparison of the reference signal SLP_ADC with the pixel signal voltage Vx_0 is performed by the voltage comparator 252, the comparison output COMP (=COMP0) of the voltage comparator 252 is inverted at the Drst__0=50-th clock when the reference signal SLP_ADC is equal to the reset level Srst_0 of the pixel signal voltage Vx_0, and the count enable signal EN (=PCOMP0) is inverted (where COMP0 and PCOMP0 are equal to each other in phase). Then, the down count operation is stopped and the count value "Dini−Drst-0=−50" is stored in the counter units 254.

Next, during the Drm+Dsm=128+4096 count period prepared as the D-phase process period, the comparison of the reference signal SLP_ADC with the pixel signal voltage Vx_0 is performed by the voltage comparator 252, the comparison output COMP (=COMP0) of the voltage comparator 252 is inverted at the Drst_0+Dsig__0=50+1950=2000-th clock when the reference signal SLP_ADC is equal to the signal level Ssig_0 of the pixel signal voltage Vx_0, and the count enable signal EN (=PCOMP0) is inverted (where COMP0 and PCOMP0 are equal to each other in phase). Then, the up count operation is stopped. At this time, since the up count operation is performed from the count value "−50" obtained from the P-phase process, the counter units 254 store Dini−Drst__0+(Drst_0+Dsig_0)=−50+2000=1950. 1950 is equal to the signal data Dsig_0.

On the other hand, in the P-phase process and the D-phase process, the second process example is applied to the pixel signal voltage Vx_1. Accordingly, first, during the Drm=128 count period prepared as the P-phase process period, the comparison of the reference signal SLP_ADC with the pixel signal voltage Vx_1 is performed by the voltage comparator 252, the comparison output COMP (=COMP1) of the voltage comparator 252 is inverted at the Drst_0=50-th clock when the reference signal SLP_ADC is equal to the reset level Srst_1 of the pixel signal voltage Vx_1, and the count enable signal EN (=PCOMP1) is inverted (where COMP1 and PCOMP1 are opposite to each other in phase). At this time, the counter units 254 start the down count operation and stop the down count operation at the Drm=128-th clock after the P-phase process period passes. Accordingly, the counter units 254 count down by Drm−Drst_1=128−50=78 clocks, and thus store Dini−(Drm−Drst_1)=−78 after the P-phase process is ended.

Next, during the Drm+Dsm=128+4096 count period prepared as the D-phase process period, the comparison of the reference signal SLP_ADC with the pixel signal voltage Vx_1 is performed by the voltage comparator 252, the comparison output COMP (=COMP1) of the voltage comparator 252 is inverted at the Drst_1+Dsig__1=50+1950=2000-th clock when the reference signal SLP_ADC is equal to the signal level Ssig_1 of the pixel signal voltage Vx_1, and the count enable signal EN (=PCOMP1) is inverted (where COMP1 and PCOMP1 are opposite to each other in phase). At this time, the counter units 254 start the up count operation and stop the up count operation at the Drm+Dsm=128+4096-th clock after the D-phase process period passes.

Accordingly, the counter unit 254 counts up by the Drm+Dsm−(Drst_1+Dsig_1)=128+4096−(50+1950)=2224 clocks. At this time, since the up count process is performed from "−78" obtained from the P-phase process, the counter unit 254 stores Dini−(Drm−Drst_1)+Drm+Dsm−(Drst_1+Dsig_1)=Dini+Dsm−Dsig_1=−78+2224=2146. The data Dout of the count value of 2146 is transmitted to the digital calculator 29. The digital calculator 29 can acquire Dsm−(Dsm−Dsig_1)=4096−2146=1950 as the final signal data Dsig_1 by subtracting the data Dout from the maximum count number Dsm corresponding to the maximum value of the signal data Dsig_1.

At the time of performing the D-phase process on both the pixel signal voltage Vx_0 and the pixel signal voltage Vx_1, the count phase adjuster 260 latches the comparison output COMP of the voltage comparator 252 by the use of a latch clock signal CLK, which corresponds to the threshold value partitioning the low brightness range and the high brightness range and rises, for example, in the vicinity of the middle voltage in the slope period of the reference signal SLP_ADC. Then, the count phase adjuster performs a phase adjusting operation for determining whether the comparison output COMP should not be inverted and output as the count enable signal EN at the time of processing the subsequent row or the comparison output should be inverted and output as the count enable signal EN. When the middle voltage of the reference signal SLP_ADC is set to be at the time that the latch clock signal CLK partitioning the low brightness range and the high brightness range rises, the activation period of the counter unit 254 is not longer than a half of the slope period of the reference signal SLP_ADC, regardless of the level of the pixel signal voltage Vx as long as the brightness level of the previous row is equal to the brightness level of the present row.

When the signal level Ssig of the pixel signal voltage Vx in the D-phase process on the present row is in the low brightness level, the comparison output COMP of the voltage comparator 252 is inverted and is at the L level at the rising time of the clock signal CLK. Accordingly, the count phase adjuster 260 latches the L level as the phase information of the comparison output COMP. On the contrary, when the signal level Ssig of the pixel signal voltage Vx in the D-phase process on the present row is in the high brightness level, the comparison output COMP of the voltage comparator 252 is not inverted and thus is at the H level at the rising time of the clock signal CLK. Accordingly, the count phase adjuster 260 latches the H level as the phase information of the comparison output COMP.

The comparison pulse COMP is input to the input terminal IN1 of the EX-OR gate 262 and the phase information PCOMP detected by the latch circuit 266 is input to the input terminal IN2. The phase information PCOMP is at the L level when the signal level Ssig is in the low brightness range, and is at the H level when the signal level Ssig is in the high brightness range. Accordingly, when the signal level Ssig of the present row is in the low brightness range, the comparison pulse COMP is not logically inverted and is output as the count enable signal EN at the time of processing the subsequent row. As a result, the first-half count operation (the first process example shown in FIG. 3A) is used. On the other hand, when the signal level Ssig of the present row is in the high brightness range, the comparison pulse COMP is logically inverted and is output as the count enable signal EN at the time of processing the subsequent row. As a result, the second-half count operation (the second process example shown in FIG. 3B) is used.

Like this example, when the digital calculator 29 performs the correction of data accompanied with the second-half count operation (complement number count operation), the phase information PCOMP of the comparison output COMP is latched in the latch circuit 266 of the count phase adjuster 260, that is, data indicating the range of brightness level is supplied to the digital calculator 29 through the horizontal signal line 18*b* in synchronization with the pixel data Dsig of the corresponding column. The digital calculator 29 performs the correction of data accompanied with the complement number count operation on the pixel data having been subjected to the complement number count operation on the basis of the phase information PCOMP.

By employing the above-mentioned configuration, the inverted output relation is established between the count enable signal EN_L obtained from the low brightness level and the count enable signal EN_H obtained from the high brightness level. The first-half count operation is performed at the present row when the previous row is at the low brightness level and the second-half count operation at the present row when the previous row is at the high brightness level. Accordingly, when the brightness levels of the previous row and the present row are equal to each other, the count operation period can be reduced in comparison with the case where the present embodiment is not applied, thereby reducing the power consumption.

For example, when the input level is high (bright: high brightness), the count period is elongated and the power consumption is enhanced, by allowing the column AD circuit 25 to perform the first-half count operation. However, by allowing the column AD circuit 25 to perform the second-half count operation, the count period is shortened and the power consumption is reduced. On the contrary, when the input level is low (dark: low brightness), the count period is elongated and the power consumption is enhanced, by allowing the column AD circuit 25 to perform the second-half count operation. However, by allowing the column AD circuit 25 to perform the first-half count operation, the count period is shortened and the power consumption is reduced.

As described above, in the second embodiment (first example), the comparison output COMP of the voltage comparator 252 at the signal level Ssig of the pixel signal voltage Vx of the previous row is latched and the count operation period on both the reset level Srst and the signal level Ssig of the pixel signal voltage Vx of the subsequent row is controlled on the basis of the latched phase information PCOMP. Accordingly, the second-half count operation is selected when the input level is high (bright: high brightness), and the first-half count operation is selected when the input level is low (dark: low brightness). As a result, the state where the count period is shortened and the power consumption is reduced is selected in any input level.

In the structures described in W. Yang et al. and JP-A-2005-278135, the first-half count operation is performed regardless of the input level. Accordingly, the comparison process period or the count period is elongated and the power consumption is enhanced, when the pixel signal amplitude is great, but the comparison process period or the count period is shortened and the power consumption is reduced, when the pixel signal amplitude is small. On the contrary, in the second embodiment (first example), the first-half count operation is selected when the pixel signal amplitude is small, and the second-half count operation is selected when the pixel signal amplitude is great, whereby the counter units 254 are controlled to shorten the count operation period depending on the pixel signal amplitude. Accordingly, when the amplitude of the pixel signal voltage Vx is small, the operation is the same as described in W. Yang et al. and JP-A-2005-278135, thereby not reducing the power consumption. However, when the amplitude of the pixel signal voltage Vx is great, it is possible to reduce the power consumption in comparison with the structures described in W. Yang et al. and JP-A-2005-278135. On the whole, the power consumption does not become irregular depending on the amplitude of the pixel signal. In other words, it is not possible to obtain the advantage of "equalizing the power consumption with respect to the input amplitude, but it is possible to reduce the influence of the input amplitude on the power consumption.

However, as can be guessed from the above description, in an image pattern in which the input level is uneven with the reverse relation depending on the rows being subjected to the first-half count operation and the rows being subjected to the second-half count operation, the advantage of reducing the power consumption cannot be obtained and the power consumption is enhanced. In this example, when the previous row is at the low brightness level and the subsequent row is at the high brightness level, the first-half count operation is performed just like the low brightness level at the subsequent row even if the pixel signal voltage Vx is actually at the high brightness level, so that the count period is elongated and the power consumption is the same as that of the case where this embodiment is not applied. However, when the previous row is at the high brightness level and the subsequent row is at the low brightness level, the second-half count operation is performed just like the high brightness level at the subsequent row even if the pixel signal voltage Vx is actually at the low brightness level, so that the count period is elongated and the power consumption is enhanced in comparison with the case where this embodiment is not applied.

However, such a pattern of the input level hardly appears under the general condition. Moreover, when the amplitude of the pixel signal voltage Vx is great, the power consumption is reduced in comparison with the structure described in W. Yang et al. and JP-A-2005-278135. On the whole, it is possible to obtain the advantage of reducing the power consumption.

In the second embodiment (first example), the determination result of the voltage comparator 252 functioning as the determining section is stored in the latch circuit 266 functioning as the determination result storage section for the "subsequent" process. The determination result may be stored for the rows subsequent to the right subsequent row, as well as "the right subsequent row". The invention is not limited to referring to the phase information of the right previous row. For example, in order to cope with the color imaging, the color arrangement of the color-separation color filters may be taken into consideration.

Figure 6D:
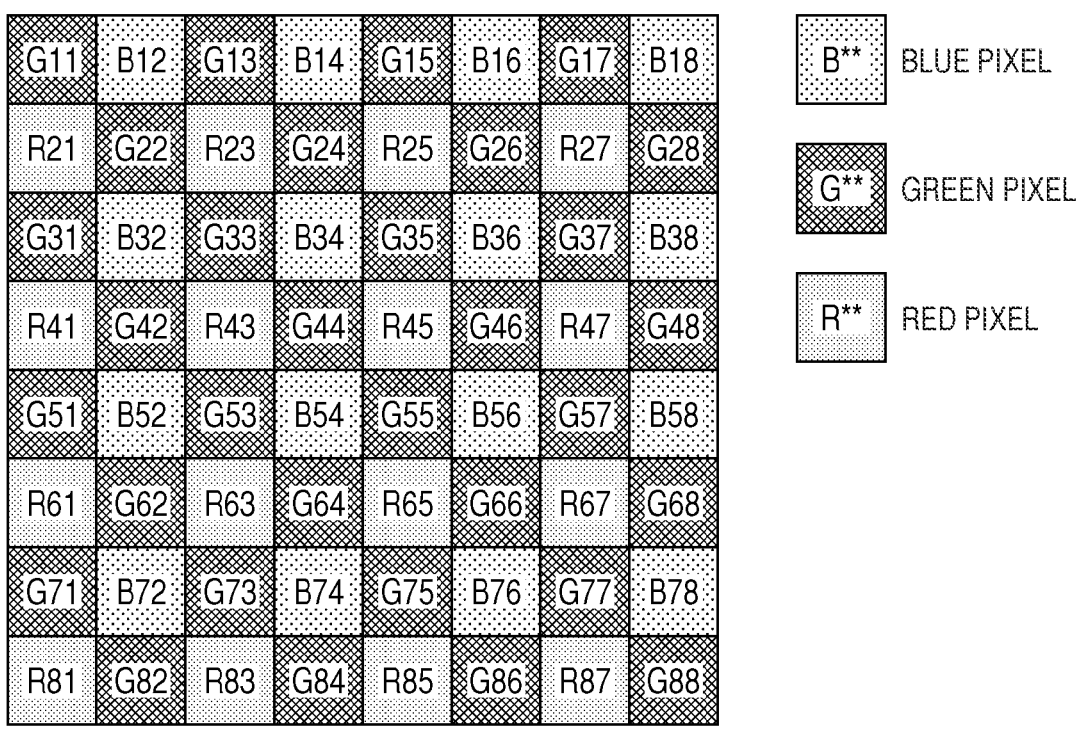
FIG. 6D is a diagram illustrating a modified example of the second embodiment.

For example, as shown in FIG. 6D, when the color-imaging color separation filter is disposed in the pixel array unit 10, it is considered that G having the sensitivity to green, B having the sensitivity to blue, and R** having the sensitivity to red are arranged with the regularity like the Bayer arrangement. In this arrangement, when a green picture is picked up, the pixel signal amplitude is great in G11 and the second-half count operation is performed in the subsequent row. However, when this result is applied to R21 of the subsequent row, the second-half count operation is performed in spite of the small pixel signal amplitude. In the next row, the first-half count operation is performed. When this result is applied to G31 of the subsequent row, the first-half count operation is performed in spite of the great pixel signal amplitude.

In order to avoid such a phenomenon, information on the row prior by two rows can be referred to. For example, it is apparently preferable that the phase information of the pixels having the same sensitivity condition is adapted, for example, where the phase information of G11 is adapted to G31 and the phase information of R21 is adapted to R41. In addition, the color arrangement is not limited to the example in FIG. 6D. Since the various types of color arrangement are present, the information of the row prior by two rows may not be necessarily referred to. Basically, the information to be referred is determined on the basis of the result of the same color (the same condition) in the same row.

Independent Control:

Second Embodiment (Second Example)

FIG. 7 is a diagram illustrating a structure for independently controlling the counter activation period of the respective counters 254 according to a second example of the second embodiment. Here, FIG. 7 is a block diagram illustrating a circuit configuration example for putting the second embodiment (second example) into practice. A timing diagram illustrating operations according to the second embodiment (second example) is omitted, but there is no basic difference from the operations of the second embodiment (first example), except for the amplitude determination (level determination in this example).

Similarly to the second embodiment (first example), the second embodiment (second example) provides a structure for allowing the counters to perform the first-half count operation and the second-half count operation and independently controlling the counters depending on the input level so as to selectively perform the first-half count operation (that is, the real number count operation) and the second-half count operation (that is, the complement number count operation) depending on the input level, by using the second example in consideration of the relation between the "predetermined criterion" and the "independent control" corresponding to the predetermined criterion.

On the other hand, in the circuit configuration example for putting the second embodiment (second example) into practice, the amplitude determination (level determination) for partitioning the first-half count operation and the second-half count operation is carried out on the basis of the digital data obtained by the column AD circuit 25. The circuit function parts therefor may be disposed at any stage subsequent to the column AD circuit 25. In this example, the determination part for controlling the partitioning of the first-half count operation and the second-half count operation is disposed outside the chip area on which the pixel array unit 10 is mounted and the first-half count operation and the second-half count operation are controlled from the outside of the chip.

Specifically, in the circuit configuration example for putting the second embodiment (second example) into practice, a digital signal processor (DSP) 270 controlling the first-half count operation and the second-half count operation is disposed outside the chip. The phase adjustment control signal PHASE is supplied to the DPU 28a and the count phase adjuster 260 from the digital signal processor 270. In this configuration, the count phase adjuster 260 has both functions of the determining section determining whether the amplitude of the pixel signal voltage Vx of the present process is greater than the middle level and the count period controller determining whether the real number count operation or the complement number count operation should be performed (in other words, determining the count period).

The count phase adjuster 260 does not include the data storage and transmission output unit 256, unlike the second embodiment (first example). The phase control signal PHASE supplied from the digital signal processor 270 is supplied to the input terminal IN2 of the EX-OR gate 262. The EX-OR gate 262 logically inverts the comparison pulse COMP to output the inverted comparison pulse as the count enable signal EN when the phase adjustment control signal PHASE from the digital signal process 270 is at the H level, and outputs the comparison pulse COMP as the count enable signal EN without any change when the phase adjustment control signal PHASE is at the L level.

The second embodiment (second example) is different from the second embodiment (first example), in that the second embodiment (first example) uses the latch data latched in the lat circuit 266 as the phase control signal to control the first-half count operation and the second-half count operation by rows in the chip, but the second embodiment (second example) uses the brightness level determination result of the digital signal processor 270 outside the chip to control the first-half count operation and the second-half count operation.

In the structure where the digital calculator 29 performs the correction of data accompanied with the second-half count operation (complement number count operation), the phase adjustment control signal PHASE from the digital signal processor 270 is supplied to the digital calculator 29. The digital calculator 29 performs the correction of data accompanied with the complement number count operation on the pixel data having been subjected to the complement number count operation on the basis of the phase adjustment control signal PHASE.

The digital signal processor 270 controls the column AD circuits 25 of the columns in the pixel array unit 10 to selective perform the first-half count operation and the second-half count operation by determining the brightness information on the basis of the digital data (particularly, the signal data Dsig in comparison with the second embodiment (first example)) of the pixel signal voltage Vx output from the output circuit 28 (DPU 28*a*) and switching the L level and the H level (hereinafter, referred to as L/H) of the phase adjustment control signal PHASE on the basis of the determination result. The count phase adjuster 260 (specifically, the EX-OR gate 262) adjusts the phase of the count period so that the column AD circuit 25 performs the first-half count operation when the phase adjustment control signal PHASE is at the L level (=0) and performs the second-half count operation when the phase adjustment control signal PHASE is at the H level (=1).

Here, in determination of the brightness information and control of the count operation phase based thereon in the digital signal processor 270, that is, in switching the L/H of the phase adjustment control signal PHASE, similarly to the second embodiment (first example), the control on the subsequent row may be performed by determining the brightness level every row. For example, the L/H of the phase adjustment control signal PHASE can be switched by rows on the basis of information indicating whether the average brightness level of one row calculated from the data output from the output circuit 28 (DPU 28*a*) is higher than the middle brightness level.

In the arrangement of the color separation filters having regularity shown in FIG. 6D, for example, it is apparently preferable that the average value is calculated by colors and the phase information of the pixels having the same sensitivity condition is adapted. In this case, plural phase adjustment control signal PHASE should be prepared.

By performing the determination on the entire picture with reference to the brightness information corresponding to one picture, the control on the subsequent picture may be performed. For example, the L/H of the phase adjustment control signal PHASE can be switched by picture on the basis of information indicating whether the average brightness level of one picture calculated from the data output from the output circuit 28 (DPU 28*a*) is higher than the middle brightness level.

In the arrangement of the color separation filters having regularity shown in FIG. 6D, for example, it is apparently preferable that the average value is calculated by colors, not by the entire picture, and the phase information of the pixels having the same sensitivity condition is adapted. In this case, plural phase adjustment control signal PHASE should be prepared.

According to the second embodiment (second example), it is possible to simplify the configuration of the count phase adjuster 260 in the chip more than that of the second embodiment (first example). This is because the latch circuit 266 is not necessary. Since the phase information PCOMP of the comparison output COMP indicating the range of brightness level latched in the latch circuits 266 of the columns need not be sequentially transmitted to the digital calculator 29, a control line 18*c* for the phase adjustment control signal PHASE is used instead of the horizontal signal line 18*b* for data transmission. In addition, the line resistance need not be greatly considered and the pattern width may be small. Accordingly, the area can be more reduced than that of the second embodiment (first example).

Since the brightness information is determined on the basis of the data output from the output circuit 28, the degree of precision is enhanced. This is because the determination is preformed using the signal level Ssig depending on the reset level Srst in the second embodiment (first example), but the determination is performed using the data having been subjected to the CDS process, that is, the digital data Dsig of the signal component Vsig excluding the influence of the reset level Srst in the second embodiment (second example).

The scheme for determining the brightness level of the entire picture is not limited to the example in which the average value of one picture of the data output from the output circuit 28 (DPU 28*a*) is calculated and determined by the digital signal processor 270, but it may be considered that information for an exposure control process (including electronic shutter control) is used (see the below description with reference to FIG. 8). In this case, it is not necessary that the digital signal processor 270 is particularly provided to perform the average process.

Imaging Device

Figure 8:
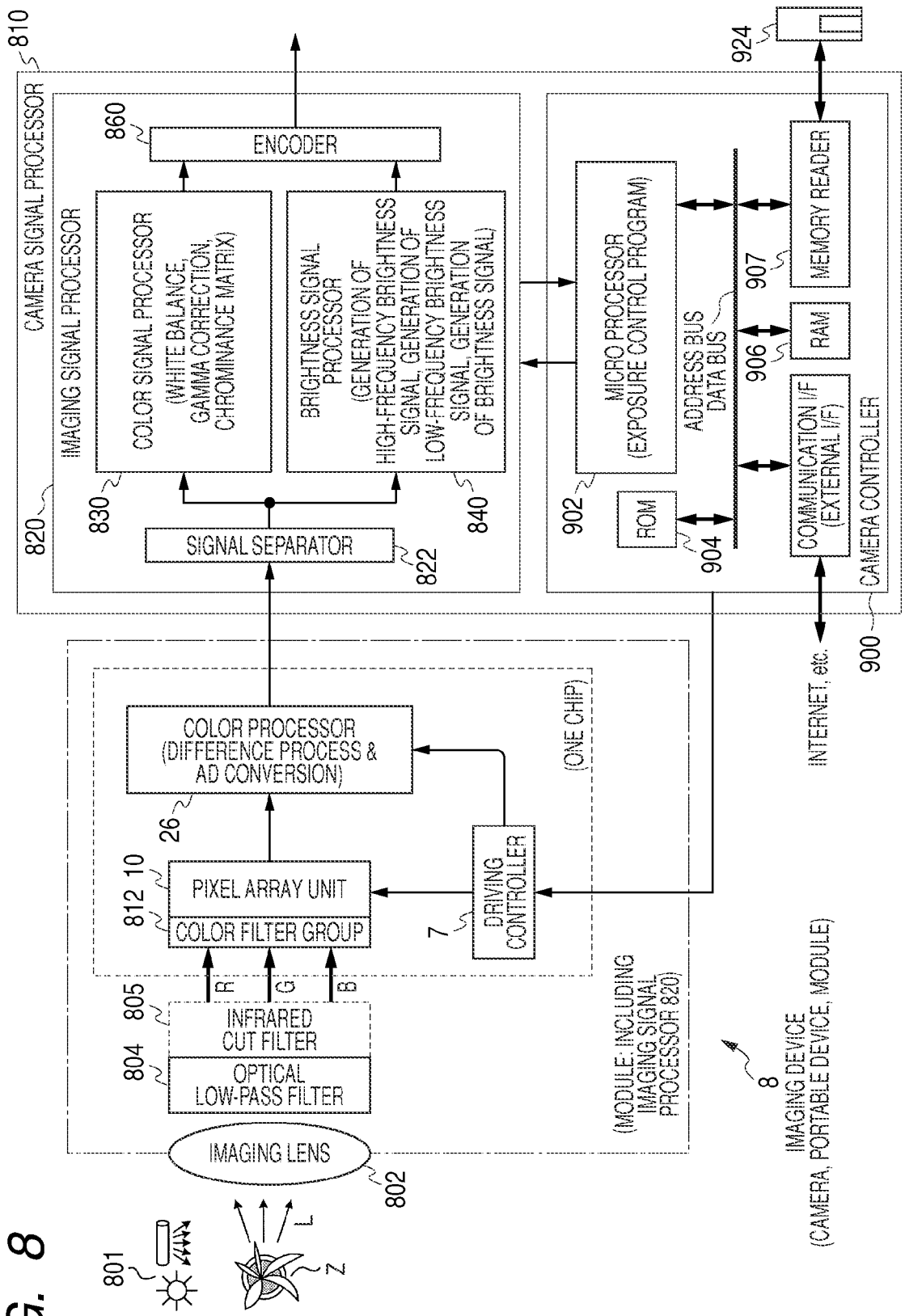
FIG. 8 is a diagram schematically illustrating a configuration of an imaging device as an example of a physical information acquiring device employing the same structure as the solid-state imaging device according to the embodiments of the invention.

FIG. 8 is a view illustrating the schematic configuration of an imaging device (camera system) which is an example of a physical information acquisition apparatus using the same structure as the solid state imaging device 1 according to the above-described embodiment. An imaging device 8 is configured to obtain a visible color image.

Specifically, the imaging device 8 includes: an imaging lens 802 serving as a main part of an optical system that obtains image information by making light L carrying an image of a photographic subject Z, which is located below a light source 801, such as sunlight or a fluorescent lamp, guided toward the image apparatus and imaged; an optical low pass filter 804; a color filter group 812 in which color filters corresponding to R, G, and B, for example, are arrayed in a Bayer pattern; a pixel array unit 10; a driving controller 7 that drives the pixel array unit 10; a column processor 26 that performs the CDS process, the AD conversion process, and the like on a pixel signal output from the pixel array unit 10; and a camera signal processor 810 that processes an imaging data output from the column processor 26.

The camera signal processor 810 includes an imaging signal processor 820 and a camera controller 900 functioning as a main controller that controls the entire imaging device 8. The imaging signal processor 820 includes: a signal separator 822 having a primary color separating function of separating a digital imaging signal, which is supplied from a column AD circuit 25*b* (refer to FIG. 1) of the column processor 26, into primary color signals of R (red), G (green), and B (blue) when a color filter other than a primary color filter is used; and a color signal processor 830 that performs signal processing on a color signal C on the basis of the primary color signals R, G, and B separated by the signal separator 822.

In addition, the imaging signal processor 820 includes: a brightness signal processor 840 that performs signal processing on a brightness signal Y on the basis of the primary color signals R, G, and B separated by the signal separator 822; and an encoder unit 860 that generates a video signal VD on the basis of the brightness signal Y/color signal C.

The camera controller 900 in the present embodiment includes: a microprocessor 902 that is a core section of a computer, a representative example of which is a CPU (central processing unit) in which functions of operations and controls performed by a computer are integrated in a micro integrated circuit; a ROM (read only memory) 904 that is a storage unit for read only; a RAM (random access memory) 906 in which writing and reading are possible when needed and which is an example of a volatile storage unit; and other peripheral members not shown in the drawing. The microprocessor 902, the ROM 904, and the RAM 906 are collectively called a microcomputer.

In the above description, the 'volatile storage unit' means a storage unit in which the stored content is removed when an apparatus is turned off. On the other hand, the 'non-volatile storage unit' means a storage unit in which the stored content is still stored even when a main power supply of the apparatus is turned off. Any storage unit capable of persistently storing the stored content may be used as the non-volatile storage unit. The non-volatile storage unit is not limited to a semiconductor memory device having a non-volatile property. For example, a volatile memory device may be configured to show the 'non-volatile property' by providing a backup power supply.

The camera controller 900 controls the entire system. For example, a control program of the camera controller 900 is stored in the ROM 904. Particularly in this example, a program for setting ON/OFF timing of various kinds of control pulses by the camera controller 900 is stored. Data and the like required when the camera controller 900 performs various kinds of processing are stored in the RAM 906.

In addition, the camera controller 900 is configured such that a recording medium 924, such as a memory card, can be inserted thereto or detached therefrom and configured to be able to be connected with a communication network, such as Internet. For example, the camera controller 900 includes a memory reader 907 and a communication I/F (interface) 908 in addition to the microprocessor 902, the ROM 904, and the RAM 906.

Here, a program for exposure control is included in the microprocessor 902, such that the camera controller 900 of the imaging device 8 also functions as an exposure condition controller that controls an exposure condition.

In this case, the exposure control program causing the microprocessor 902, which is a core section of the computer, to function as the exposure condition controller includes calculation (for example, calculation of an average value of a photometric area with a predetermined size and at a predetermined position) of photometric data DL based on a brightness signal from the brightness signal processor 840, determination of a brightness level (whether the brightness level is higher or lower than an middle level) based on the calculation result, and the like.

For example, the recording medium 924 is used to register program data, which is used to cause the microprocessor 902 to execute software processing, or data of various set values, such as ON/OFF timing of various kinds of control pulses for performing exposure control processing (including an electronic shutter control) or a convergence range of the photometric data DL based on the brightness signal from the brightness signal processor 840.

The memory reader 907 stores (installs) data read from the recording medium 924 in the RAM 906. The communication I/F 908 middles transmission and reception of communication data between a communication network, such as Internet, and the camera controller 900.

In addition, the imaging device 8 is shown in the form of a module in which the drive controller 7 and the column processor 26 are formed separately from the pixel array unit 10. However, as described for the solid state imaging device 1, it is needless to say that the imaging device 8 may use the solid state imaging device 1 in the form of one chip in which the drive controller 7 and the column processor 26 are integrally formed on the same semiconductor substrate as the pixel array unit 10.

Moreover, in the drawing, the imaging device 8 is shown in a condition where an optical system, such as the imaging lens 802, the optical low pass filter 804, or an infrared light cut-off filter 805, is also included in addition to the pixel array unit 10, the driving controller 7, the column processor 26, or the camera signal processor 810. This is suitable for a case of adopting a module form having an imaging function packaged by collecting those described above.

Here, regarding a module in the solid state imaging device 1, as shown in the drawing, the entire imaging device 8 may be configured such that the solid-state imaging device 1 is provided in a module form having an imaging function in a condition where the pixel array unit 10 (imaging unit) and a signal processor (excluding a camera signal processor provided after the column processor 26) closely related with the pixel array unit 10, such as the column processor 26 having an AD conversion function or a difference (CDS) processing function, are collectively packaged and the camera signal processor 810, which is the remaining signal processor, is provided after the solid-state imaging device 1 provided in the module form.

Alternatively, although not shown, the entire imaging device 8 may be configured such that the solid-state imaging device 1 is provided in a module form having an imaging function in a condition where the optical system including the pixel array unit 10 and the imaging lens 802 is collectively packaged and the camera signal processor 810 is also provided within the module in addition to the solid-state imaging device 1 provided in the module form.

Furthermore, as a form of a module in the solid state imaging device 1, the camera signal processor 810 equivalent to the camera signal processor 200 may be included. In this case, the solid state imaging device 1 and the imaging device 8 may be regarded as practically the same ones.

Such an imaging device 8 is provided, for example, as a camera or a portable apparatus having an imaging function, which is used to perform 'imaging'. In addition, the 'imaging' includes not only the imaging of an image at the time of a normal camera shot but also the detection of a fingerprint as a broad sense of meaning.

The imaging device 8 having such a configuration includes all the functions of the above-mentioned solid-state imaging device 1, its basic configuration and operation may be the same as those of the solid-state imaging device 1, and it may employ a structure which can reduce the influence of the input amplitude on the power consumption by independently controlling a counter activation period in the counter units 254 on the basis of a predetermined criterion or a structure which can reduce the power consumption as a whole. In particular, in the case of applying the second embodiment (second example), the brightness level determination of one picture can be done by employing an exposure control process in the micro processor 902.

As described above, the invention has been described with reference to the embodiments, but a technical scope of the invention is not limited to the scope described in the embodiments. Various changes and modifications can be made in the invention without departing from the scope of the invention, and the changes and modifications may also be included in the technical scope of the invention.

In addition, the above-mentioned embodiments are not supposed to limit the invention described in the claims, and it cannot be said that all the combinations of characteristics described in the embodiments are essential to the means for solving the problems of the invention. In the above-mentioned embodiments, many stages of the invention are included, and it is possible to extract more other features of the invention by suitably combining a plurality of component elements disclosed herein. Even if some component units among the component units illustrated in embodiments are removed, a configuration in which some of the component units are removed can be provided as the invention as long as it is within the scope of exhibiting the effect.

For example, in the second embodiment (first example) the comparison output COMP of the voltage comparator 252 for the signal level Ssig is latched by the latch circuit 266 and is provided as the phase information PCOMP of the comparison output COMP, and it is determined whether the first-half count operation or the second-half count operation should be performed on the basis of the phase information PCOMP for both the P-phase process and the D-phase process of the subsequent row. However, this is only an example.

Individual Control of P Phase and D Phase

For instance, it is possible to determine whether the first-half count operation or the second-half count operation should be performed, separately for the P-phase (reset level Srst) and the D-phase (signal level Ssig). In order to do this, for the level determination of the pixel signal voltage Vx, latch circuits 266_P and 266_D (not shown in Figures) which latch the comparison outputs COMP of the voltage comparator 252, respectively, for each the P-phase (reset level Srst) and the D-phase (signal level Ssig) are provided. The latch timing at the time of P-phase process corresponds to a middle level in a maximum range of the resent level Srst. For example, when the P-phase process period is set to 128 clocks corresponding to 7 bits, the timing is set at a point of 64 clocks after the initiation of change in the reference signal SLP_ADC. Then, in the subsequent P-phase process, it is determined whether the first-half count operation or the second-half count operation should be performed on the basis of a phase information COMP_PH_P latched by the latch circuit 266_P, or in the subsequent D-phase process, it is determined whether the first-half count operation or the second-half count operation should be performed on the basis of the phase information COMP_PH_D latched by the latch circuit 266_D. In this manner, the effect of reducing the power consumption can be achieved even in the P-phase process.

However, in this case, a circuit configuration in the columns becomes complicate due to a factor that the P-phase process and the D-phase process do not always perform the count operation at the same phase relationship in order to give a configuration allowing the difference process (CDS process) between the P-phase process result and the D-phase process result in the columns, together with the other factor of a structure for data correction for the second-half count process (complement number count process). This matter may be handled by, as adopted in the second configuration example shown in FIG. 2B, the digital calculator 29 by transmitting the P-phase process result Dp (indicating Drst) and the D-phase process result Dd (indicating Drst+Dsig) each to the digital calculator 29. Herein, the phase information COMP_PH_P latched by the latch circuit 266_P and the phase information COMP_PH_D latched by the latch circuit 266_D are supplied to the digital calculator 29 through the different horizontal signal lines 18 in synchronization with the P-phase process result Dp and the D-phase process result Dd on the same level. In the digital calculator 29, the data correction is performed on the basis of the phase information COMP_PH_P and the phase information COMP_PH_D, and finally Dsig is obtained.

Determination and Count Phase Control in Present Row

In the second embodiment (first example), the level determination of the pixel signal voltage Vx is performed in the processing row just prior to the present row. However, a method of determining the input level of the present processing signal for the signal to be subjected to the level determination and performing the count phase control on the basis of the determination result may be employed. In this case, it is preferable that the method is combined with the structure for determining to perform the first-half count operation or the second-half count operation depending on the P phase (that is, reset level Srst) or the D phase (that is, the signal level Ssig). Alternatively, one of the first-half count operation and the second-half count operation may be fixed in the P-phase process, and the level determination result of the signal level Ssig of the present row may be referenced in the D-phase process. Hereinafter, the count phase control depending on the P-phase process and the D-phase process will be described as an example.

For example, first, it is determined whether the pixel signal voltage Vx is at the voltage level of the first half or the second half of the full-range, and then on the basis of the determination result, it is determined whether the first-half count operation or the second-half count operation should be performed. That is, in the initial comparison in the voltage comparator 252, it is inspected whether the reset level Srst or the signal level Ssig is less than the middle level thereof. Accordingly, for example, the voltage comparator 252 is used as the determining section determining whether the amplitude of the pixel signal voltage Vx in the present process is less than the middle level. For example, after the reset level Srst or the signal level Ssig is stabilized and before the comparison process is started, the DA conversion circuit 27a sets the reference signal SLP_ADC to the value corresponding to the middle level of the reset level Srst or the signal level Ssig and then supplies the set signal to the voltage comparator 252. When the reset level Srst or the signal level Ssig is in the first half of the full range, the comparison output COMP of the voltage comparator 252 is at the L level. When the reset level Srst or the signal level Ssig is in the second half of the full-range, the comparison output COMP of the voltage comparator 252 is at the H level. The comparison output COMP of the voltage comparator 252 is latched in the latch circuit 266 and then is supplied to the input terminal IN2 of the EX-OR gate 262. The input terminal IN1 of the EX-OR gate 262 is supplied with the comparison output COMP of the voltage comparator 252.

Therefore, similarly to the second embodiment (first example), the data latched in the latch circuit 266 is at the L level when the reset level Srst or the signal level Ssig belongs to a low input range, or at the H level when the reset level Srst or the signal level Ssig belongs to a high input level. Accordingly, when the reset level Srst or the signal level Ssig belongs to the low input range in the present row, the comparison pulse COMP of the voltage comparator 252 is not logically inverted and output as the count enable signal EN in the P-phase process or the D-phase process of the row. In this manner, the first-half count operation (the first process example illustrated in FIG. 3A) is applied. Further, when the reset level Srst or the signal level Ssig belongs to a high input range in the present row, the comparison pulse COMP of the voltage comparator 252 is logically inverted and output as the count enable signal EN in the P-phase process or the D-phase process of the row. In this manner, the second-half count operation (the second process example illustrated in FIG. 3B) is applied.

In the second embodiment (first example), in the image pattern having a difference in level height with the reverse relation depending on the row to be subjected to the first-half count operation and the row to be subjected to the second-half count operation, the effect of reducing the power consumption cannot be obtained and the power consumption is enhanced rather. However, when the process of the present row is performed on the basis of the level determination result of the present row, the count period is definitely reduced and thus the power consumption is reduced.

In this description, in determining whether the pixel signal voltage Vx is set at a voltage level in the first half or the second half of the full range, the DA conversion circuit 27a supplies a value of the middle level to the voltage comparator 252 using the reference signal SLP_ADC and the voltage comparator 252 performs the level determination. In this case, depending on the circuit configurations, an operating point of the subsequent comparison process may be changed by initially setting the reference signal SLP_ADC to the middle level.

When this causes a problem, the circuit scale increases but, for example, the problem can be solved in the following manner. First, independent of the voltage comparator 252, a voltage comparator 252_DET (not shown) is provided every column as a determining section determining whether the amplitude of the pixel signal voltage Vx in the present process is less than the middle level. In addition to the reference signal SLP_ADC, the DA conversion circuit 27a supplies the reference signal SLP_DET (value of middle level) for the level determination to one input terminal of the voltage comparator 252_DET. The other input terminal of the voltage comparator 252_DET is supplied with the pixel signal voltage Vx. The voltage comparator 252_DET inspects whether the reset level Srst or the signal level Ssig is less than the middle level thereof, by comparing the reference signal SLP_DET for the level determination with the pixel signal voltage Vx.

Application to Electronic Apparatus

In the above-mentioned embodiments, it has been described that the AD conversion circuit (AD converter; column AD circuit 25 in the examples) including the comparator comparing the AD-conversion reference signal with an electrical signal corresponding to the processing signal and the counter unit performing the count process in one mode of the down-count mode and the up-count mode at the same time as the comparison process of the comparator and storing the count value acquired through the first-half count operation or the second-half count operation is applied as a data processor to the solid-state imaging device or the imaging device. However, the structure of the AD conversion circuit or the data processor may be applied to all electronic apparatuses requiring the data processing structure for acquiring digital data of analog information, as well as the solid-state imaging device or the imaging device.

The AD conversion circuit (AD converter) is not limited to being mounted on the solid-state imaging device or other electronic apparatuses, but may be provided as a single device such as an IC (Integrated Circuit) and an AD conversion module.

In this case, the AD conversion circuit may be provided as an AD converter having a comparator and a counter, but may be mounted on a module including a combination of ICs and individual chips, in which the reference signal generator generating the AD-conversion reference signal to supply the generated reference signal to the comparator or the controller switching the mode of the count process of the counter depending on the reference component or the signal component being subjected to the comparison process by the comparator is disposed on the same semiconductor substrate.

The functional units required for controlling the operations of the comparator and the counter can be collectively treated by mounting and providing the functional units, thereby facilitating the treatment or management thereof. Since the elements required for the AD conversion process are collected into an IC or a module, it is possible to easily manufacture a finished product such as a solid-state imaging device or other electronic apparatuses.

In the above-mentioned embodiment, in view of application of the AD conversion circuit (AD converter) to the solid-state imaging device or the imaging device, it has been described that the comparison process and the count process are performed two times, that is, that the comparison process and the count process are individually performed on the reset level Srst as the reference component and the signal level Ssig corresponding to the true signal component. However, the comparison process and the count process may be performed only once on a general analog signal. The digital data as the product sum result of three or more signals may be acquired by combining the count modes. This is the same as "acquiring the digital data as the product sum result of plural pixels" described in the final part of the first process example shown in FIG. 3A and the second process example shown in FIG. 3B.

At this time, by independently determining whether the first-half count operation (real number count operation) or the second-half count operation (complement number count operation) should be performed on the basis of the circuit configuration or the signal amplitude (signal level), the influence of the input amplitude on the power consumption can be reduced. Accordingly, for example, it is possible to equalize the count enable period with respect to the input amplitude or to reduce the power consumption depending on the input amplitude.

It should be understood by those skilled in the art that various modifications, combinations, sub-combinations, and alterations may occur depending on design requirements and other factors insofar as they are within the scope of the appended claims or the equivalents thereof.

What is claimed is:

1. A data processor comprising:
    a reference signal generator generating a reference signal, which is used to convert a level of an analog processing signal into digital data, gradually varying to enhance an amplitude of the processing signal;
    a comparator comparing the processing signal with the reference signal generated by the reference signal generator;
    a count period controller determining to perform a real number count operation of performing a count process during a period from a time point when the reference signal has a predetermined initial value to a time point when the processing signal is equal to the reference signal or a complement number count operation of performing a count process during a period from a time point when the processing signal is equal to the reference signal to a time point when the reference signal reaches a predetermined final value, on the basis of the comparison result of the comparator;

a counter performing a count process during the count period determined by the count period controller and storing a count value at the time of completion of the count process to acquire a predetermined level of digital data; and a corrector correcting the result of the complement number count operation to acquire the digital data as a value of a real number, wherein the count period controller independently controls the real number count operation and the complement number count operation of the counter on the basis of a predetermined criterion.

2. The data processor according to claim 1, wherein the counter includes a first counter performing the real number count operation and a second counter performing the complement number count operation, and wherein the count period controller controls the first counter to perform the real number count operation and controls the second counter to perform the complement number count operation.

3. A solid-state imaging device comprising:

a pixel array unit in which unit pixels, each of which has a charge generator and an output transistor outputting a processing signal corresponding to charges generated by the charge generator, are arranged in a matrix;

a comparator disposed every column to compare an analog processing signal obtained from the unit pixels of the pixel array unit with a reference signal, which is used to convert the analog processing signal into digital data, gradually varying to enhance an amplitude of the processing signal;

a count period controller determining to perform a real number count operation of performing a count process during a period from a time point when the reference signal has a predetermined initial value to a time point when the processing signal is equal to the reference signal or a complement number count operation of performing a count process during a period from a time point when the processing signal is equal to the reference signal to a time point when the reference signal reaches a predetermined final value, on the basis of the comparison result of the comparator; and a counter disposed every column to perform the count operation during the count period determined by the count period controller and acquiring a predetermined level of digital data by storing the count value at the time of completion of the count operation, wherein each counter includes a first counter performing the real number count operation and a second counter performing the complement number count operation, and wherein the count period controller controls the first counter to perform the real number count operation and controls the second counter to perform the complement number count operation.

4. The solid-state imaging device according to claim 3, wherein the first counters and the second counters are alternately arranged to neighbor each other.

5. The solid-state imaging device according to claim 3, wherein the analog processing signal obtained from each unit pixel of the pixel array unit includes a reference component and a signal component, wherein the first counter performs the count process as a first process on a signal corresponding to one of the reference component and the signal component in one of a down-count mode and an up-count mode to store a count value at the time of completion of the count process and performs the count process as a second process on a signal corresponding to the other of the reference component and the signal component in the other of the down-count mode and the up-count mode on the basis of the count value stored in the first process to store a count value at the time of completion of the count process, and wherein the second counter performs the count process as a first process on a signal corresponding to one of the reference component and the signal component in the opposite mode of the count mode of the first process of the first counter to store a count value at the time of completion of the count process, and then performs a count process as a second process on a signal corresponding to the other of the reference component and the signal component in the opposite mode of the count mode of the second process of the first counter on the basis of the count value stored in the first process to store a count value at the time of completion of the count process.

6. A solid-state imaging device comprising:

a pixel array unit in which unit pixels, each of which has a charge generator and an output transistor outputting a processing signal corresponding to charges generated by the charge generator, are arranged in a matrix;

a comparator disposed every column to compare an analog processing signal obtained from the unit pixels of the pixel array unit with a reference signal, which is used to convert the analog processing signal into digital data, gradually varying to enhance an amplitude of the processing signal;

a count period controller determining to perform a real number count operation of performing a count process during a period from a time point when the reference signal has a predetermined initial value to a time point when the processing signal is equal to the reference signal or a complement number count operation of performing a count process during a period from a time point when the processing signal is equal to the reference signal to a time point when the reference signal reaches a predetermined final value, on the basis of the comparison result of the comparator; and a counter disposed every column to perform the count operation during the count period determined by the count period controller and acquiring a predetermined level of digital data by storing the count value at the time of completion of the count operation, wherein the counter is configured to switch the real number count operation and the complement number count operation, and wherein the count period controller controls the switching of the real number count operation and the complement number count operation of the counter depending on the amplitude of the processing signal.

7. The solid-state imaging device according to claim 6, wherein the count period controller controls the counter to perform the real number count operation when the amplitude of the processing signal is less than a middle level, and controls the counter to perform the complement number count operation when the amplitude of the processing signal is greater than the middle level.

8. The solid-state imaging device according to claim 6, wherein the count period controller includes a determining section determining whether the amplitude of the processing signal in the present process is less than the middle level or not and a determination result storage section storing the determination result of the determining section for the subsequent process, and controls the real number count operation and the complement number count operation of the counter in the subsequent process on the basis of the determination result stored in the determination result storage section.

9. The solid-state imaging device according to claim 8, wherein the determining section is disposed by columns and makes a determination by rows.

10. The solid-state imaging device according to claim 8, wherein the determining section makes a determination by rows on the basis of digital data obtained by the counter.

11. The solid-state imaging device according to claim 8, wherein the determining section makes a determination by pictures on the basis of digital data obtained by the counter.

12. The solid-state imaging device according to any one of claims 9 to 11, wherein the pixel array unit includes a color-imaging color separation filter, and
wherein the determining section and the determination result storage section perform their processes by colors.

13. The solid-state imaging device according to claim 8, wherein the analog processing signal obtained from each unit pixel of the pixel array unit includes a reference component and a signal component,
wherein the determining section makes a determination by rows on the basis of a signal corresponding to the signal component, and
wherein the count period controller commonly controls the real number count operation and the complement number count operation of the counter in the subsequent process for both a signal corresponding to the reference component and a signal corresponding to the signal component on the basis of the determination result stored in the determination result storage section.

14. The solid-state imaging device according to claim 8, wherein the analog processing signal obtained from each unit pixel of the pixel array unit includes a reference component and a signal component,
wherein the determining section makes a determination by rows on the basis of a signal corresponding to the reference component and makes a determination by rows on the basis of a signal corresponding to the signal component,
wherein the determination result storage section includes a first determination storage storing the determination result of the determining section on the reference component and a second determination result storage section storing the determination result of the determining section on the signal component every columns, and
wherein the count period controller controls the real number count operation and the complement number count operation of the determining section in the subsequent process for the signal corresponding to the reference component on the basis of the determination result stored in the first determination result storage section, and controls the real number count operation and the complement number count operation of the determining section in the subsequent process for the signal corresponding to the signal component on the basis of the determination result stored in the second determination result storage section.

15. The solid-state imaging device according to claim 6, wherein the count period controller includes a determining section determining whether the amplitude of the processing signal is less than the middle level or not before the present process and a determination result storage section storing the determination result of the determining section for the present process, and controls the real number count operation and the complement number count operation of the counter in the present process on the basis of the determination result stored in the determination result storage section.

16. The solid-state imaging device according to claim 14, wherein the analog processing signal obtained from each unit pixel of the pixel array unit includes a reference component and a signal component,
wherein the determining section is provided every column and makes a determination by rows on the basis of a signal corresponding to the signal component, and
wherein the count period controller commonly controls the real number count operation and the complement number count operation of the counter in the present process for both a signal corresponding to the reference component and a signal corresponding to the signal component on the basis of the determination result stored in the determination result storage section.

17. An imaging device comprising:
an optical system receiving image information;
a pixel array unit in which unit pixels, each of which includes a charge generator generating signal charges on the basis of the image information received by the optical system and an output transistor outputting a processing signal corresponding to the signal charges generated by the charge generator, are arranged in a matrix;
a reference signal generator generating a reference signal, which is used to convert a level of the processing signal into digital data, gradually varying to enhance amplitude of the processing signal;
a comparator disposed every column to compare the processing signal with the reference signal generated by the reference signal generator;
a count period controller determining to perform a real number count operation of performing a count process during a period from a time point when the reference signal has a predetermined initial value to a time point when the processing signal is equal to the reference signal or a complement number count operation of performing a count process during a period from a time point when the processing signal is equal to the reference signal to a time point when the reference signal reaches a predetermined final value, on the basis of the comparison result of the comparator;
a counter disposed every column to perform the count process during the count period determined by the count period controller and acquiring a predetermined level of digital data by storing the count value at the time of completion of the count process; and
a corrector acquiring the digital data as a value of a real number by correcting the complement number count operation,
wherein the count period controller independently controls the real number count operation and the complement number count operation of the counter of each column on the basis of a predetermined criterion.

18. An electronic apparatus comprising:
a reference signal generator generating a reference signal, which is used to convert a level of an analog processing signal into digital data, gradually varying to enhance an amplitude of the processing signal;
a comparator disposed every column to compare the processing signal with the reference signal generated by the reference signal generator;
a count period controller determining to perform a real number count operation of performing a count process during a period from a time point when the reference signal has a predetermined initial value to a time point when the processing signal is equal to the reference signal or a complement number count operation of performing a count process during a period from a time point when the processing signal is equal to the reference signal to a time point when the reference signal reaches a predetermined final value, on the basis of the comparison result of the comparator;
a counter disposed every column to perform the count operation during the count period determined by the count period controller and acquiring a predetermined level of digital data by storing the count value at the time of completion of the count operation; and
a corrector acquiring the digital data as a value of a real number by correcting the complement number count operation,
wherein the count period controller independently controls the real number count operation and the complement number count operation of the counter of each column on the basis of a predetermined criterion.

* * * * *